(12) United States Patent
Rajski et al.

(10) Patent No.: US 7,370,254 B2
(45) Date of Patent: May 6, 2008

(54) COMPRESSING TEST RESPONSES USING A COMPACTOR

(76) Inventors: Janusz Rajski, 6502 Horton Rd., West Linn, OR (US) 97068; Jerzy Tyszer, Os. Stare Zegrze 89c/2, 61-249 Poznan (PL); Chen Wang, 10921 SW. 111th Ave., Tigard, OR (US) 97223; Grzegorz Mrugalski, 7114 SW. Bouchaine St., Wilsonville, OR (US) 97070; Artur Pogiel, Ul. Lesna 34, 89-200 Szubin (PL)

( * ) Notice: Subject to any disclaimer, the term of this patent is extended or adjusted under 35 U.S.C. 154(b) by 353 days.

(21) Appl. No.: 10/778,950

(22) Filed: Feb. 13, 2004

(65) Prior Publication Data

US 2004/0230884 A1 Nov. 18, 2004

Related U.S. Application Data

(60) Provisional application No. 60/447,637, filed on Feb. 13, 2003, provisional application No. 60/506,499, filed on Sep. 26, 2003.

(51) Int. Cl.
*G01R 31/28* (2006.01)
(52) U.S. Cl. .................. 714/726; 714/733; 714/732
(58) Field of Classification Search ................ 714/724, 714/726–733
See application file for complete search history.

(56) References Cited

U.S. PATENT DOCUMENTS

| | | | |
|---|---|---|---|
| 4,161,041 A | 7/1979 | Butler et al. |
| 4,320,509 A | 3/1982 | Davidson |
| 4,503,537 A | 3/1985 | McAnney |
| 4,513,418 A | 4/1985 | Bardell, Jr. et al. |
| 4,536,881 A | 8/1985 | Kasuya |
| 4,602,210 A | 7/1986 | Fasang et al. |
| 4,687,988 A | 8/1987 | Eichelberger et al. |
| 4,754,215 A | 6/1988 | Kawai |
| 4,801,870 A | 1/1989 | Eichelberger et al. |
| 5,072,178 A | 12/1991 | Matsumoto |

(Continued)

FOREIGN PATENT DOCUMENTS

EP 0438322 7/1991

(Continued)

OTHER PUBLICATIONS

"Optimal Space Compaction of Test Responses" Chakrabarty et al. This paper appears in: Test Conference, 1995. Proceedings., International Publication Date: Oct. 21-25, 1995 On pp. 834-843 ISBN: 0-7803-2992-9 INSPEC Accession No. 5266971.*

(Continued)

*Primary Examiner*—Cynthia Britt
(74) *Attorney, Agent, or Firm*—Klarquist Sparkman, LLP

(57) ABSTRACT

The present disclosure describes embodiments of a compactor for compressing test results in an integrated circuit and methods for using and designing such embodiments. The disclosed compactors can be utilized, for example, as part of any scan-based design. Moreover, any of the disclosed compactors can be designed, simulated, and/or verified in a computer-executed application, such as an electronic-design-automation ("EDA") software tool. Embodiments of a method for diagnosing faults in the disclosed compactor embodiments are also described.

43 Claims, 30 Drawing Sheets

U.S. PATENT DOCUMENTS

| | | | |
|---|---|---|---|
| 5,090,035 A | 2/1992 | Murase | |
| 5,138,619 A | 8/1992 | Fasang et al. | |
| 5,167,034 A | 11/1992 | MacLean, Jr. et al. | |
| 5,173,906 A | 12/1992 | Dreibelbis et al. | |
| 5,258,986 A | 11/1993 | Zerbe | |
| 5,301,199 A | 4/1994 | Ikenaga et al. | |
| 5,369,648 A | 11/1994 | Nelson | |
| 5,412,665 A | 5/1995 | Gruodis et al. | |
| 5,416,783 A | 5/1995 | Broseghini et al. | |
| 5,450,414 A | 9/1995 | Lin | |
| 5,533,128 A | 7/1996 | Vobach | |
| 5,574,733 A | 11/1996 | Kim | |
| 5,608,870 A | 3/1997 | Valiant | |
| 5,631,913 A | 5/1997 | Maeda | |
| 5,642,362 A | 6/1997 | Savir | |
| 5,680,543 A | 10/1997 | Bhawmik | |
| 5,694,402 A | 12/1997 | Butler et al. | |
| 5,701,308 A | 12/1997 | Attaway et al. | |
| 5,717,701 A | 2/1998 | Angelotti et al. | |
| 5,790,562 A | 8/1998 | Murray et al. | |
| 5,831,992 A | 11/1998 | Wu | |
| 5,848,198 A | 12/1998 | Penn | |
| 5,867,507 A | 2/1999 | Beebe et al. | |
| 5,883,906 A | 3/1999 | Turnquist et al. | |
| 5,899,961 A | 5/1999 | Sundermann | |
| 5,905,986 A | 5/1999 | Rohrbaugh et al. | |
| 5,938,784 A | 8/1999 | Kim | |
| 5,991,898 A | 11/1999 | Rajski et al. | |
| 5,991,909 A | 11/1999 | Rajski et al. | |
| 6,026,508 A | 2/2000 | Craft | |
| 6,181,164 B1 | 1/2001 | Miller | |
| 6,272,653 B1 | 8/2001 | Amstutz | |
| 6,300,885 B1 | 10/2001 | Davenport et al. | |
| 6,308,291 B1 | 10/2001 | Kock et al. | |
| 6,327,687 B1 | 12/2001 | Rajski et al. | |
| 6,353,842 B1 | 3/2002 | Rajski et al. | |
| 6,467,058 B1 * | 10/2002 | Chakradhar et al. | 714/745 |
| 6,539,409 B2 | 3/2003 | Rajski et al. | |
| 6,543,020 B2 | 4/2003 | Rajski et al. | |
| 6,557,129 B1 | 4/2003 | Rajski et al. | |
| 6,590,929 B1 | 7/2003 | Williams | |
| 6,671,839 B1 | 12/2003 | Côté et al. | |
| 6,684,358 B1 | 1/2004 | Rajski et al. | |
| 6,708,192 B2 | 3/2004 | Rajski et al. | |
| 6,763,488 B2 * | 7/2004 | Whetsel | 714/729 |
| 6,829,740 B2 | 12/2004 | Rajski et al. | |
| 6,874,109 B1 | 3/2005 | Rajski et al. | |
| 6,993,694 B1 | 1/2006 | Kapur et al. | |
| 7,032,148 B2 | 4/2006 | Wang et al. | |
| 7,058,869 B2 | 6/2006 | Abdel-Hafez et al. | |
| 7,093,175 B2 | 8/2006 | Rajski et al. | |
| 7,111,209 B2 | 9/2006 | Rajski et al. | |
| 2002/0112199 A1 | 8/2002 | Whetsel | |
| 2002/0124217 A1 | 9/2002 | Hiraide et al. | |
| 2003/0120988 A1 | 6/2003 | Rajski et al. | |
| 2003/0131298 A1 | 7/2003 | Rajski et al. | |
| 2003/0188269 A1 | 10/2003 | Mitra et al. | |
| 2004/0128599 A1 | 7/2004 | Rajski et al. | |
| 2004/0172431 A1 | 9/2004 | Rajski et al. | |
| 2005/0015688 A1 | 1/2005 | Rajski et al. | |
| 2005/0055613 A1 | 3/2005 | Mitra et al. | |
| 2005/0097419 A1 | 5/2005 | Rajski et al. | |
| 2007/0011530 A1 | 1/2007 | Rajski et al. | |
| 2007/0016836 A1 | 1/2007 | Rajski et al. | |

FOREIGN PATENT DOCUMENTS

| | | |
|---|---|---|
| EP | 0 549 949 | 3/1998 |
| JP | 63-286780 | 11/1988 |
| JP | 01-239486 | 9/1989 |
| JP | 03-002579 | 1/1991 |
| JP | 03-012573 | 1/1991 |
| JP | 05-215816 | 8/1993 |
| JP | 05-249197 | 9/1993 |
| JP | 07-174822 | 7/1995 |
| JP | 08-015382 | 1/1996 |
| JP | 11-030646 | 2/1999 |
| JP | 11-264860 | 9/1999 |
| WO | WO 91/10182 | 7/1991 |

OTHER PUBLICATIONS

U.S. Appl. No. 09/620,021, filed Jul. 20, 2000, Rajski et al.

Aldrich et al., "Improving Test Quality and Reducing Escapes," *Fabless Forum Magazine*, vol. 10, No. 1, 2 pp. (2003).

Aitken et al., "A Diagnosis Method Using Pseudo-Random Vectors Without Intermediate Signatures," *Proc. ICCAD*, pp. 574-577 (1989).

Bardell, "Design Considerations for Parallel Pseudorandom Pattern Generators," *Journal of Electronic Testing: Theory and Applications*, 1, 73-87 (1990).

Bardell et al., *Built-In Test for VLSI Pseudorandom Techniques*, Chapter 4, "Test Response Compression Techniques," John Wiley & Sons, Inc., pp. 89-108 (1987).

Barnhart et al., "Extending OPMISR beyond 10x Scan Test Efficiency," *IEEE Design and Test*, vol. 19, No. 5, pp. 65-73 (Sep. 2002).

Bayraktaroglu et al., "Deterministic Partitioning Techniques for Fault Diagnosis in Scan-Based BIST," *Proc. ITC*, pp. 273-282 (2000).

Bayraktaroglu et al., "Diagnosis for Scan Based BIST: Reaching Deep into the Signatures," *Proc. Design Automation and Test in Europe*, pp. 102-109 (2001).

Benowitz et al., "An Advaced Fault Isolation System for Digital Logic," *IEEE Transactions on Computers*, vol. 24, No. 5, pp. 489-497 (1975).

Benware et al., "Impact of Multiple-Detect Test Patterns on Product Quality," *Proc. ITC*, pp. 1031-1040 (Sep. 2003).

Bhattacharya et al., "Synthesis of Single-Output Space Compactors for Scan-Based Sequential Circuits," *IEEE Transactions on Computer-Aided Design of Integrated Circuits and Systems*, vol. 21, No. 10, pp. 1171-1179 (Oct. 2002).

Chakrabarty et al., "Optimal Space Compaction of Test Responses," *Proc. ITC*, pp. 834-843 (1995).

Chakrabarty et al., "Optimal Zero-Aliasing Space Compaction of Test Responses," *IEEE Transactions on Computers*, vol. 47, No. 11, pp. 1171-1187 (Nov. 1998).

Chakrabarty et al., "Test Response Compaction Using Multiplexed Parity Trees," *IEEE Transactions on Computer-Aided Design of Integrated Circuits and Systems*, vol. 15, No. 11, pp. 1399-1408 (Nov. 1996).

Chakrabarty, "Zero-Aliasing Space Compaction Using Linear Compactors With Bounded Overhead," *IEEE Transactions on Computer-Aided Design of Integrated Circuits and Systems*, vol. 17, No. 5, pp. 452-457 (May 1998).

Chan et al., "A Study of Faulty Signature for Diagnostics," *Proc. ISCAS*, pp. 2701-2704 (1990).

Chan et al., "A Study of Faulty Signatures Using a Matrix Formulation," *Proc. ITC*, pp. 553-561 (1990).

Damarla et al., "Multiple Error Detection and Identification via Signature Analysis," *Journal of Electronic Testing: Theory and Applications*, vol. 7, No. 3, pp. 193-207 (1995).

Das et al., "Data Compression in Space Under Generalized Mergeability Based on Concepts of Cover Table and Frequency Ordering," *IEEE Transactions on Instrumentation and Measurement*, vol. 51, No. 1, pp. 150-172 (Feb. 2001).

Das et al., "Fault Tolerance in Systems Design in VLSI Using Data Compression Under Constraints of Failure Probabilities," *IEEE Transactions on Instrumentation and Measurement*, vol. 51, No. 6, pp. 1725-1747 (Dec. 2001).

Edirisooriya et al., "Diagnosis of Scan Path Failures," *Proc. VLSI Test Symp.*, pp. 250-255 (1995).

Frohwerk, "Signature Analysis: A New Digital Field Services Method," *Hewlett-Packard Journal*, pp. 2-8 (May 1977).

Ghosh-Dastidar et al., "A Rapid And Scalable Diagnosis Scheme for BIST Environments with a Large Number of Scan Chains," *Proc. VLSI Test Symp.*, pp. 79-85 (2000).

Ghosh-Dastidar et al., "Fault Diagnosis In Scan-Based BIST Using Both Time and Space Information," *Proc. ITC*, pp. 95-102 (1999).

Guo et al., "A Technique for Fault Diagnosis of Defects in Scan Chains," *Proc. ITC*, pp. 268-277 (2001).

Han et al., "Test Resource Partitioning Based on Efficient Response Compaction for Test Time and Tester Channels Reduction," *Proc. ATS*, 6 pp. (Nov. 2003).

Hayes, "Check Sum Test Methods," *Proc. FTCS*, pp. 114-120 (1976).

Hayes, "Transition Count Testing of Combinational Logic Circuits," *IEEE Transactions on Computers*, vol. C-25, No. 6, pp. 613-620 (Jun. 1976).

Hellebrand et al., "Built-in Test for Circuits With Scan Based on Reseeding of Multiple Polynomial Linear Feedback Shift Registers," *IEEE Transactions on Computers*, vol. C-44, pp. 223-233 (Feb. 1995).

Hellebrand et al., "Generation of Vector Patterns Through Reseeding of Multiple-Polynomial Linear Feedback Shift Registers," *Proc. ITC*, pp. 120-129 (1992).

Hetherington et al., "Logic BIST for Large Industrial Designs: Real Issues and Case Studies," *Proc. ITC*, pp. 358-367 (1999).

Hsu et al., "A Case Study on the Implementation of the Illinois Scan Architecture," *Proc. ITC*, pp. 538-547 (2001).

Ivanov et al., "Programmable BIST Space Compactors," *IEEE Transactions on Computers*, vol. C-45, No. 12, pp. 1393-1404 (Dec. 1996).

Jas et al., "Scan Vector Compression/Decompression Using Statistical Coding," *Proc. VLSI Test Symp.*, pp. 114-120 (1999).

Jone et al., "Space Compression Method for Built-In Self-Testing of VLSI Circuits," *Int'l Journal of Computer Aided VLSI Design*, vol. 3, pp. 309-322 (1991).

Karpovsky et al., "Board-Level Diagnosis by Signature Analysis," *Proc. ITC*, pp. 47-53 (1988).

Karpovsky et al., "Design of Self-Diagnostic Boards by Multiple Signature Analysis," *IEEE Transactions on Computers*, vol. 42, No. 9, pp. 1035-1044 (Sep. 1993).

Kim et al., "On Using Signature Registers as Pseudorandom Pattern Generators in Built-in Self Testing," *IEEE Transactions on Computer-Aided Design*, vol. CAD-7, No. 8, pp. 919-928 (Aug. 1988).

Koenemann et al., "A SmartBIST Variant with Guaranteed Encoding," *Proc. ATS*, pp. 325-330 (2001).

Koenemann et al., "LFSR-Coded Test Patterns for Scan Designs," *Proc. European Test Conference*, pp. 237-242 (1991).

Kundu, "On Diagnosis of Faults in a Scan-Chain," *Proc. VLSI Test Symp.*, pp. 303-308 (1993).

Li et al., "Space Compression Methods With Output Data Modification," *IEEE Transactions on Computer-Aided Design*, vol. CAD-6, No. 2, pp. 290-294 (Mar. 1987).

McAnney et al., "There is Information in Faulty Signatures," *Proc. ITC*, pp. 630-636 (1987).

Mitra et al., "X-Compact: An Efficient Response Compaction Technique for Test Cost Reduction," *Proc. ITC*, pp. 311-320 (Oct. 2002).

Morosov et al., "Design of Parameterizable Error Propagating Space Compactors for Response Observation," *Proc. VLSI Test Symp.*, pp. 48-53 (2001).

Mrugalski et al., "Convolutional compaction-driven diagnosis of scan failures," *Proc. ETS*, 6 pp. (2005).

Mrugalski et al., "Fault Diagnosis in Designs with Convolutional Compactors," *Proc. ITC*, pp. 498-507 (Oct. 2004).

Mrugalski et al., "Synthesis of Pattern Generators Based on Cellular Automata with Phase Shifters," *Proc. ITC*, pp. 368-377 (1999).

Narayanan et al., "An Efficient Scheme to Diagnose Scan Chains," *Proc. ITC*, pp. 704-713 (1997).

Naruse et al., "On-chip Compression of Output Responses with Unknown Values Using LFSR Reseeding," *Proc. ITC*, pp. 1060-1068 (Sep. 2003).

Patel et al., "Application to Saluja-Karpovsky Compactors to Test Responses with Many Unknowns," *Proc. VLSI Test Symp.*, 6 pp. (Apr. 2003).

Pomeranz et al., "On Output Response Compression in the Presence of Unknown Output Values," *Proc. DAC*, pp. 255-258 (Jun. 2002).

Pouya et al., "Synthesis of Zero-Aliasing Elementary-Tree Space Compactors," *Proc. VLSI Test Symp.*, pp. 70-77 (1998).

Rajski et al., "Accumulator-Based Compaction of Test Responses," *IEEE Transactions on Computers*, vol. C-42, No. 6, pp. 643-650 (1993).

Rajski et al., *Arithmetic Built-In Self-Test for Embedded Systems*, Chapter 3, "Test Response Compaction," and Chapter 4, "Fault Diagnosis," Prentice Hall PTR, pp. 87-133 (1998).

Rajski et al., "Convolutional Compaction of Test Responses," *Proc. ITC*, pp. 745-754 (Sep. 2003).

Rajski et al., "Design of Phase Shifters for BIST Applications," *Proc. VLSI Test Symp.*, pp. 218-224 (1998).

Rajski et al., "Diagnosis of Scan Cells in BIST Environment," *IEEE Transactions on Computers*, vol. 48, No. 7, pp. 724-731 (Jul. 1999).

Rajski et al., "Embedded Deterministic Test for Low Cost Manufacturing Test," *Proc. ITC*, pp. 301-310 (Oct. 2002).

Rajski et al., "On the Diagnostic Properties of Linear Feedback Shift Registers," *IEEE Transactions on Computer-Aided Design*, vol. 10, No. 10, pp. 1316-1322 (1991).

Rajski et al., "Synthesis of X-tolerant Convolutional Compactors," *Proc. VLSI Test Symp.*, pp. 114-119 (2005).

Rajski et al., "Test Data Decompression for Multiple Scan Designs with Boundary Scan," *IEEE Transactions on Computers*, vol. 47, No. 11, pp. 1188-1200 (Nov. 1998).

Rajski et al., "Test Responses Compaction in Accumulators with Rotate Carry Adders," *IEEE Transactions on Computer-Aided Design of Integrated Circuits and Systems*, vol. CAD-12, No. 4, pp. 531-539 (1993).

Reddy et al., "A Data Compression Technique for Built-In Self-Test," *IEEE Transactions on Computers*, vol. 37, No. 9, pp. 1151-1156 (1988).

Saluja et al., "Testing Computer Hardware Through Data Compression in Space and Time," *Proc. ITC*, pp. 83-88 (1983).

Savir et al., "Identification of Failing Tests with Cycling Registers," *Proc. ITC*, pp. 322-328 (1988).

Savir, "Syndrome-Testable Design of Combinational Circuits," *IEEE Transactions on Computers*, vol. C-29, No. 6, pp. 442-451 (1980).

Saxena et al., "Accumulator Compression Testing," *IEEE Transactions on Computers*, vol. C-35, No. 4, pp. 317-321 (Apr. 1986).

Saxena et al., "Analysis of Checksums, Extended-Precision Checksums, and Cyclic Redundancy Checks," *IEEE Transactions on Computers*, vol. C-39, No. 7, pp. 969-975 (Jul. 1990).

Saxena et al., "Extended Precision Checksums," *Proc. FTCS*, pp. 142-147 (1987).

Serra et al., "The Analysis of One-Dimensional Linear Cellular Automata and Their Aliasing Properties," *IEEE Transactions on Computer-Aided Design*, vol. CAD-9, No. 7, pp. 767-778 (Jul. 1990).

Seuring et al., "Space Compaction of Test Responses for IP Cores Using Orthogonal Transmission Functions," *Proc. VLSI Test Symp.*, pp. 213-219 (2000).

Smith, "Measures of the Effectiveness of Fault Signature Analysis," *IEEE Transactions on Computers*, vol. C-29, No. 6, pp. 510-514 (Jun. 1980).

Sogomonyan et al., "Early Error Detection in Systems-in-Chip for Fault-Tolerance and At-Speed Debugging," *Proc. VLSI Test Symp.*, pp. 184-189 (2001).

Stroud et al., "Improving the Efficiency of Error Identification via Signature Analysis," *Proc. VLSI Test Symp.*, pp. 244-249 (1995).

Tekumalla, "On Reducing Aliasing Effects and Improving Diagnosis of Logic BIST Failures," *Proc. ITC*, pp. 737-744 (Sep. 2003).

Venkataraman et al., "An Efficient BIST Scheme Based on Reseeding of Multiple Polynomial Linear Feedback Shift Registers," *Proc. IEEE/ACM Int'l Conf. on Computer-Aided Design*, pp. 572-577 (1993).

Waicukauski et al., "Diagnosis of BIST Failures by PPSFP Simulation," *Proc. ITC*, pp. 480-484 (1987).

Waicukauski et al., "Failure Diagnosis of Structured VLSI," *IEEE Design and Test of Computers*, pp. 49-60 (Aug. 1989).

Wang, "BIST Using Pseudorandom Test Vectors and Signature Analysis," *IEEE Custom Integrated Circuits Conference*, pp. 1611-1618 (1998).

Wang et al., "On Compacting Test Responses Data Containing Unknown Values," *Proc. ICCAD*, pp. 855-862 (Nov. 2003).

Williams et al., "Bounds and Analysis of Aliasing Errors in Linear-Feedback Shift Registers," *IEEE Transactions on Computer-Aided Design*, vol. CAD-7, No. 1, pp. 75-83 (Jan. 1988).

Wohl et al., "Analysis and Design of Optimal Combinational Compactors," *IEEE VLSI Test Symp.*, 6 pp. (Apr. 2003).

Wohl et al., "Design of Compactors for Signature-Analyzers in Built-In Self-Test," *Proc. ITC*, pp. 54-63 (2001).

Wohl et al., "X-tolerant Compression and Application of Scan-ATPG Patterns in a BIST Architecture," *Proc. ITC*, pp. 727-736 (Sep. 2003).

Wu et al., "Scan-Based BIST Fault Diagnosis," *IEEE Transactions on Computer-Aided Design of Integrated Circuits and Systems*, vol. 18, No. 2, pp. 203-211 (Feb. 1999).

Yamaguchi et al., "An Efficient Method for Compressing Test Data," *Proc. ITC*, pp. 79-88 (1997).

Zacharia, et al., "Decompression of Test Data Using Variable-Length Seed LFSRs," *Proc. VLSI Test Symp.*, 426-433 (1995).

Zacharia et al., "Two Dimensional Test Data Decompressor for Multiple Scan Designs," *Proc. ITC*, pp. 186-194 (1996).

Chickermane et al., "Channel Masking Synthesis for Efficient On-Chip Test Compression," *Proc. ITC*, pp. 452-461 (2004).

Lew Yan Voon et al., "BIST Linear Generator based on Complemented Outputs," *IEEE VLSI Test Symposium*, pp. 137-142 (1992).

Konemann et al., "Built-In Logic Block Observation Techniques," *IEEE Test Conference*, 6 pp. (1979).

Wohl et al., "Efficient Compression and Application of Deterministic Patterns in a Logic BIST Architecture," *40$^{th}$ Design Automation Conference*, pp. 566-575 (2003).

\* cited by examiner

- 2602 PROVIDE TEST-RESPONSE VALUES TO LOGIC NETWORK
- 2604 EXPAND TEST-RESPONSE VALUES INTO EXPANDED TEST VALUES
- 2606 LOGICALLY COMBINE EXPANDED TEST VALUES TO PRODUCE PRIMARY INTERMEDIATE VALUES
- 2608 LOGICALLY COMBINE A PORTION OF THE PRIMARY INTERMEDIATE VALUES WITH PREVIOUSLY STORED VALUE TO PRODUCE SECONDARY INTERMEDIATE VALUES
- 2610 STORE SECONDARY INTERMEDIATE VALUES
- 2612 OUTPUT VALUES ASSOCIATED WITH THE TEST-RESPONSE VALUES DURING OBSERVATION PERIODS
- 2614 ANALYZE THE OUTPUT VALUES AND LOCATE ANY ERROR SOURCE

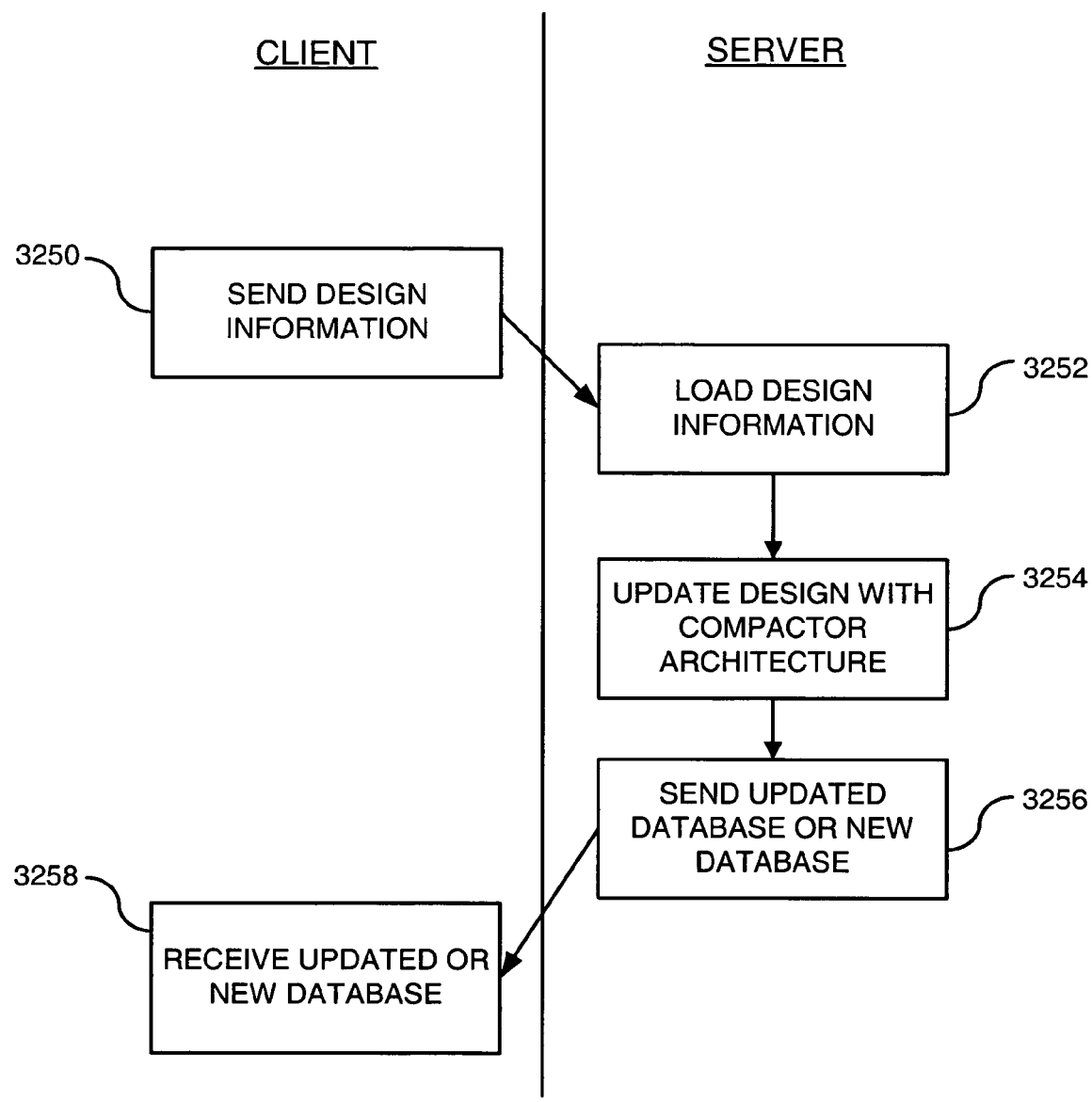

COMPRESSING TEST RESPONSES USING A COMPACTOR

CROSS REFERENCE TO RELATED APPLICATIONS

This application claims the benefit of U.S. Provisional Application No. 60/447,637, filed Feb. 13, 2003, and claims the benefit of U.S. Provisional Application No. 60/506,499, filed Sep. 26, 2003, both of which are hereby incorporated by reference.

TECHNICAL FIELD

This invention relates generally to the testing of integrated circuits and, more particularly, to the compression of test data from a circuit-under-test.

BACKGROUND

As integrated circuits are produced with greater and greater levels of circuit density, efficient testing schemes that guarantee high fault coverage while minimizing test costs and chip area overhead have become essential. The number of transistors that can be placed on a chip has been doubling roughly every eighteen months, as predicted by Moore's law. The amount of data required to test such massively complex chips has been increasing even more rapidly. In practical terms, for very large integrated circuits, the test cost is approaching (and may even exceed) the design cost. To address the rapid increase in volume of test data, a number of compression schemes have been developed.

Many integrated circuits are tested using structured design-for-testability ("DFT") techniques, which employ the general concept of making some or all state variables (e.g., memory elements such as flip-flops and latches) directly controllable and observable. Preferably, a circuit is treated, as far as testing of combinational faults is concerned, as a combinational or a nearly combinational network. The most-often used DFT methodology assumes that during testing all (or almost all) memory elements are connected into one or more shift registers termed "scan chains." See, e.g., U.S. Pat. No. 4,503,537.

A circuit that utilizes scan chains for testing typically has two basic modes of operation: a normal mode, and a test (or scan) mode. In the normal mode, the memory elements perform their regular functions. In the scan mode, the memory elements become scan cells that are connected to form a number of scan chains. These scan chains are used to shift a set of test patterns into the circuit and to shift out circuit (or test) responses to the test patterns. The test responses are then compared to fault-free responses to determine if the circuit-under-test ("CUT") works properly.

Scan design methodology has gained widespread adoption by virtue of its simple automatic test pattern generation ("ATPG") and silicon debugging capabilities. Today, ATPG software tools are so efficient that it is possible to generate test sets (a collection of test patterns) that guarantee almost complete fault coverage of several types of fault models including stuck-at and transition faults. It is also possible to target other fault models such as path delay and bridging faults. Typically, when a particular potential fault in a circuit is targeted by an ATPG tool, only a small number of scan cells (e.g., 2-5%) need to be specified to detect the particular fault. These scan cells are termed "deterministically specified cells." The remaining scan cells in the scan chains can then be filled with random binary values, which are termed "randomly specified cells." This results in a pattern that is fully specified, that is more likely to detect additional faults, and that can be stored on a tester.

FIG. 1 is a block diagram of a conventional system 100 for testing digital circuits with scan chains. Two-input XOR gates, in this and subsequent figures, are represented by a circle inscribed with a cross 112. During a typical scan mode, external automated test equipment ("ATE") or tester 102 applies a set of fully specified test patterns 104 to a CUT 106 via scan chains 108 within the circuit. Once the scan chains 108 have been loaded with the test patterns 104, the CUT 106 is run in normal mode using the test patterns for input values. The CUT 106 may be run for a designated period of time (e.g., one clock cycle) after which the test responses to the test patterns are stored in the scan chains 108. With the circuit again in scan mode, the test responses are routed back to the tester 102, which compares the captured test responses with fault-free reference responses 110. A significant limitation of this approach is that it requires an expensive, memory-intensive tester and a long test time to test a complex circuit. For example, it has been reported that the volume of test data can exceed one kilobit per single logic gate in a large design. It is undesirable to test large circuits using this method, as it is difficult to store the large number of test patterns required, and the test application itself is too time intensive.

These limitations of time and storage can be overcome to some extent by adopting a built-in self-test ("BIST") framework as shown in FIG. 2. In BIST, additional on-chip circuitry is included to generate test patterns, evaluate test responses, and control the test. For example, a pseudo-random pattern generator 200 ("PRPG") is used to generate the test patterns instead of storing deterministic test patterns. Additionally, a multiple input signature register ("MISR") 202 can be used to generate and store a resulting signature from the test responses. MISRs, such as the one shown in FIG. 5, compress the data and generate a signature based on the scan chain input 502, and feedback 504, 506.

Due to the high volume of test data that needs to be processed in a CUT, compactors are often used to compress the test responses from the scan chains. This greatly simplifies determining if the circuit has flaws and the location of any problems that are discovered. Currently-available test response compaction schemes can be grouped into two classes: (1) infinite input response compaction schemes (also known as "time compactors"); and (2) space compaction schemes (also known as "space compactors" or "linear compactors").

Time compactors typically have a feedback structure with memory elements for storing a signature, which represents the results of the test. After the signature is completed, it is read and compared to a fault-free signature to determine if an error exists in the circuit-under-test. Time compactors may use polynomial division, counting-based techniques, and check-sum-based methods, and are typically employed in BIST applications. The actual compaction is usually performed by linear finite state machines, such as a linear feedback shift register ("LFSR"), a MISR, or cellular automata. These schemes are capable of compacting giga-bits of test response data into a small signature that is typically 32-, 64-, or 128-bits long, thereby achieving compaction ratios between $10^6$ and $10^8$. This is possible because an error, once injected into this type of compactor, remains there until another group of errors erases it in the rare case of aliasing. The infinite input response compaction schemes suffer from a number of disadvantages. In particular, this type of compaction scheme cannot handle any unknown states in the test response. Because these systems all include feedback, an unknown state will circulate in the compactor endlessly until the compactor is reset. Thus, all states can become unknown after a few cycles, thereby corrupting the test signature and rendering the test useless. Fault diagnosis is also more complicated as it requires multiple passes with direct access to pre-compacted responses.

LFSRs are among the most popular time compactors used in integrated circuits. An LFSR produces pseudo-random test sequences. In its basic form, the LFSR (shown in FIG. 3) is modified to accept an external input in order to act as a polynomial divider. An alternative implementation is shown in FIG. 4. The input sequence, represented by a polynomial, is divided by the characteristic polynomial of the LFSR. As the division proceeds, the quotient sequence appears at the output of the LFSR and the remainder is kept in the LFSR. Once testing is completed, the content of the LFSR can be treated as a signature.

FIG. 5 shows another time compactor (which is a natural extension of the LFSR-based compactor) called a multiple-input LFSR, also known as a multiple-input signature register or MISR. A MISR may be used to test circuits in a multiple scan chain environment as shown in FIG. 5. MISRs feature a number of XOR gates coupled to the CUT scan-chain outputs and to the flip-flops of the shift register.

In contrast to time compactors, which employ memory elements in their compaction schemes, space compactors comprise combinational circuits that are predominantly built from XOR networks. The XOR network is configured to generate n test outputs from m primary outputs of the CUT, where n<m. Space compactors typically offer smaller compaction ratios than time compactors, but can handle some unknown states in the test responses without circuit modification. Another difference between spatial compactors and time compactors is that the output value of a spatial compactor will change with a change in just one input to the compactor, making single errors observable that would be undetectable after compression in a time compactor. With time compactors, a change in an input value may be obscured by the compression, and therefore go undetected at the output of the compactor. Even spatial compactors, however, may mask errors. For example, one basic characteristic of an XOR (parity) tree as typically used in a spatial compactor is that any odd-numbered combination of errors on its inputs will propagate to the outputs, but any even-numbered combination of errors will remain undetected. For instance, when the spatial compactor reads two errors at the same time, the multiple errors may cancel each other out so that the compressed signature of the faulty circuit mimics that of a fault-free circuit. This phenomenon is known as "error masking" or "aliasing" since it involves a first error state value erasing a second error state value. Aliasing is often measured in terms of its likelihood of occurrence.

Spatial compactors can be customized for a given CUT to reduce the aliasing phenomenon, such as shown in the U.S. Pat. No. 5,790,562, based on multiplexed parity trees or nonlinear trees comprising elementary gates such as AND, OR, NAND, and NOR gates. FIG. 6 shows one example of a modified spatial compactor. In particular, FIG. 6 shows a pipelined spatial compactor that includes a bank of flip-flops separating stages of XOR gates. A clock (not shown) controls the flip-flops and allows a one-cycle delay before reading the compacted output. Another spatial compaction technique, known as the X-compact scheme, has recently been proposed. See S. Mitra and K. S. Kim, "X-Compact: An Efficient Response Compaction Technique for Test Cost Reduction," *Proc. ITC*, pp. 311-320 (Oct. 2002). A so-called "X-compactor" is understood to have no memory and no feedback. Thus, the output of the X-compactor is indicative of the current X-compactor input, and any error present at the output is clocked out after a single clock cycle. As more fully explained below, however, the amount of compaction that can be realized in an X-compact scheme is severely limited by the number of compactor outputs.

For any of the spatial compactors described above, the presence of unknown states can also be problematic for accurate error detection. For example, an unknown state on one or more inputs of an XOR tree generates unknown values at its output, consequently masking the propagation of any faults at the other inputs. Thus, one limitation of spatial compactors, such as the X-compactor and the compactor of FIG. 6, is that unknown states can reduce fault coverage. Moreover, time compactors, such as shown in FIGS. 3, 4, and 5, are restricted in their ability to handle unknown states since an unknown state on any input can corrupt the compressed output generated by the compactor. Additionally, if an error is detected within the integrated circuit, both spatial and time compactors have a limited ability to localize the fault.

SUMMARY

The present disclosure describes embodiments of a compactor for compressing test results in a digital circuit and methods for operating and designing such embodiments. The disclosed compactors can be utilized, for example, as part of a scan-based design. Any of the disclosed compactors can be designed, simulated, and/or verified in a computer-executed application, such as an electronic-design-automation ("EDA") software tool. Similarly, any of the disclosed design or diagnostic methods can be performed and/or simulated in a computer-executed application.

Various embodiments of methods for testing a circuit-under-test ("CUT") using the disclosed technology are described. For example, in one embodiment, a set of test-response values from the CUT is provided. The set of test-response values comprises a plurality of S test-response values. The S test-response values are expanded into a plurality of V expanded test values, where V is greater than S. T primary intermediate values are produced from at least some of the V expanded values. U secondary intermediate values are produced by combining at least a portion of the T primary intermediate values with previously stored intermediate values. At least one of the U secondary intermediate values is stored for one or more clock cycles. B output values at least partially determined by the U secondary intermediate values are output during an observation period of two or more clock cycles. The B output values in the observation period are indicative of one, two, and odd-numbered errors present in the set of test-response values.

In another exemplary embodiment, a method for compressing a test response in an integrated circuit is provided. In this embodiment, a test value is input from one of multiple scan cells in a scan chain during an unloading period of the scan chain. At least two intermediate values at least partially determined by the test value are produced via logic. At least a portion of the intermediate values is loaded into plural memory elements. A set of at least two output values at least partially determined by the intermediate values is produced. The set of at least two output values comprises all output values at least partially determined by the intermediate values. The set of at least two output values is output over an observation period. In this embodiment, the observation period comprises at least two clock cycles and ends before the unloading period ends.

Another method for compressing a test response in an integrated circuit is provided in another exemplary embodiment. In this embodiment, a test value is input into a network comprising combinational logic from one of multiple scan cells in a scan chain during an unloading period. The test value is expanded through at least two fan-outs in the network comprising combinational logic. Two or more intermediate values are produced from the expanded test values. The intermediate values are loaded into plural memory elements. Two or more output values are output from the plural memory elements over an observation period of at least two clock cycles. The output values are at least partially determined by the test value, and, in this embodiment, the number of output values equals the number of the fan-outs.

In another exemplary embodiment of a method for testing an integrated circuit, multiple test values are captured in a scan chain of a circuit-under-test (the test values are associated with a circuit response to a test pattern). The test values are clocked out of the scan chain and into a compactor. Sets of two or more output values are produced in the compactor. Each set comprises all values produced in the compactor at least partially determined by a respective test value. At least one of the sets is output from the compactor over at least two clock cycles and before all of the test values captured in the scan chain have been clocked into the compactor.

In yet another embodiment of a method for compressing test responses, a first portion of a test response and a second portion of the test response are injected into a network comprising combinational logic. A first set of two or more primary intermediate values is logically produced in the network at a first set of network outputs. The first set of primary intermediate values is at least partially determined by the first portion of the test response. A second set of two or more primary intermediate values is also produced in the network at a second set of network outputs. Similarly, the second set of primary intermediate values is at least partially determined by the second portion of the test response. The second set of network outputs is characterized in that it has at least one network output that is mutually exclusive of the first set of network outputs. The first set of primary intermediate values is at least partially combined with a first set of previously stored values to produce a first set of secondary intermediate values. Similarly, the second set of primary intermediate values is at least partially combined with a second set of previously stored values to produce a second set of secondary intermediate values. The first set of secondary intermediate values is loaded into a first set of memory elements coupled to the first set of network outputs, and the second set of secondary intermediate values is loaded into a second set of memory elements coupled to the second set of network outputs. In this embodiment, the second set of memory elements comprises a nonshifted set of memory elements relative to the first set of memory elements.

Various apparatus for compressing test responses in an integrated circuit are also disclosed. For example, in accordance with one exemplary embodiment, the apparatus comprises a plurality of memory elements, and an injector network comprising combinational logic. The injector network includes injector-network outputs and injector-network inputs. Each injector-network output is coupled to a respective one of the memory elements, and each injector-network input is logically coupled to two or more injector-network outputs according to a respective injector polynomial. In this embodiment, the respective injector polynomials are selected to prevent one, two, and odd-numbered error masking in the memory elements. In another embodiment, the respective injector polynomials are selected to prevent masking of an unknown value in the memory elements.

Methods for designing the disclosed compactor embodiments are also described. For example, according to one exemplary method for designing a compactor, design data concerning the circuit-under-test is input. The design data comprises the number of scan-chain outputs in the circuit-under-test. At least two injector polynomials for connecting the scan-chain outputs of the circuit-under-test to plural memory elements of the compactor are generated. The at least two injector polynomials are configured to prevent one, two, and odd-numbered error masking in the plural memory elements. In this embodiment, the plural memory elements are coupled together by a feedback-free network. At least one of the polynomials is selected.

In another exemplary embodiment of a method for designing a compactor to compress test responses, list of valid polynomials representing non-masking patterns for coupling outputs of the scan chains to combinations of plural memory elements in the compactor is generated. One of the polynomials is selected from the list of valid polynomials. The selected polynomial is logically combined with two or more previously selected polynomials using an XOR or XNOR operation. This operation determines a forbidden polynomial that masks the selected polynomial. The forbidden polynomial is removed from the list of valid polynomials.

The compactor of any of the disclosed embodiments can have memory elements that form at least one feedback loop. Any of the disclosed compactors can further comprise a multiple-input signature register ("MISR"), a bypass network coupled to the scan-chain outputs, selection circuitry that enables selective masking of one or more of the scan-chain outputs (and which can further include a scan-address register or counter and be operable in a partial-scan mode). Any of the disclosed compactors can be coupled to the scan-chain or other test response outputs via a serial-input-parallel-output register or other type of register, or be coupled to multiple scan cells within a scan chain.

Any of the disclosed embodiments may be performed by a computer programmed with computer-executable instructions stored on a computer-readable medium. In these embodiments, the computer-executable instructions cause the computer to perform, design, or simulate any of the disclosed embodiments. Moreover, any of the disclosed embodiments can be used to update or modify circuit design information stored on a computer-readable medium. Accordingly, modified design databases storing circuit designs that include the disclosed compactors described herein are also disclosed. Any of the disclosed embodiments can be performed, designed, or simulated, via a network. Integrated circuits configured to perform any of the disclosed methods are also disclosed.

The foregoing and additional features and advantages of the disclosed embodiments will become more apparent from the following detailed description, which proceeds with reference to the following drawings.

BRIEF DESCRIPTION OF THE DRAWINGS

FIG. 19($b$) shows a compactor embodiment having inputs coupled to multiple scan cells of respective scan chains.

FIG. 20($b$) shows an embodiment of a compactor having outputs that are coupled to exemplary serial-input-parallel-output registers.

FIG. 20($c$) shows another compactor embodiment that includes a feedback loop.

FIG. 26 is a flow chart of an exemplary method for compressing test responses in a circuit-under-test using exemplary embodiments of the compactor.

FIG. 32 is a flowchart showing the creation of a database using, for example, the network of FIG. 31.

DETAILED DESCRIPTION

Figure 1:
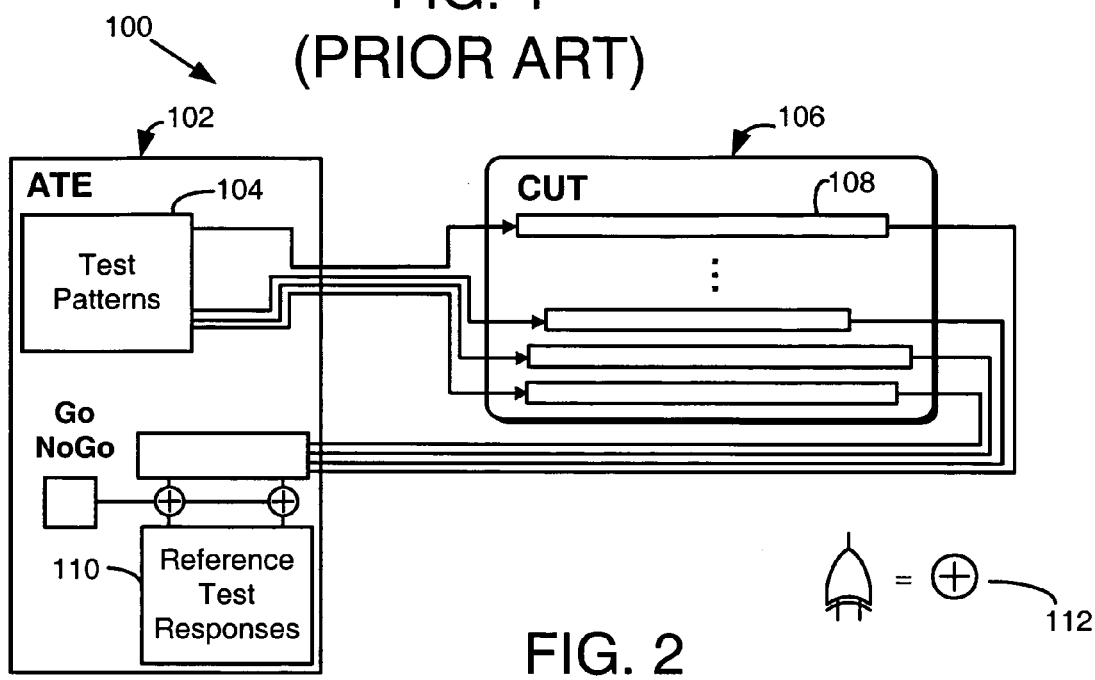
FIG. 1 is a block diagram of a prior art system using automated test equipment for testing integrated circuits.
Figure 2:
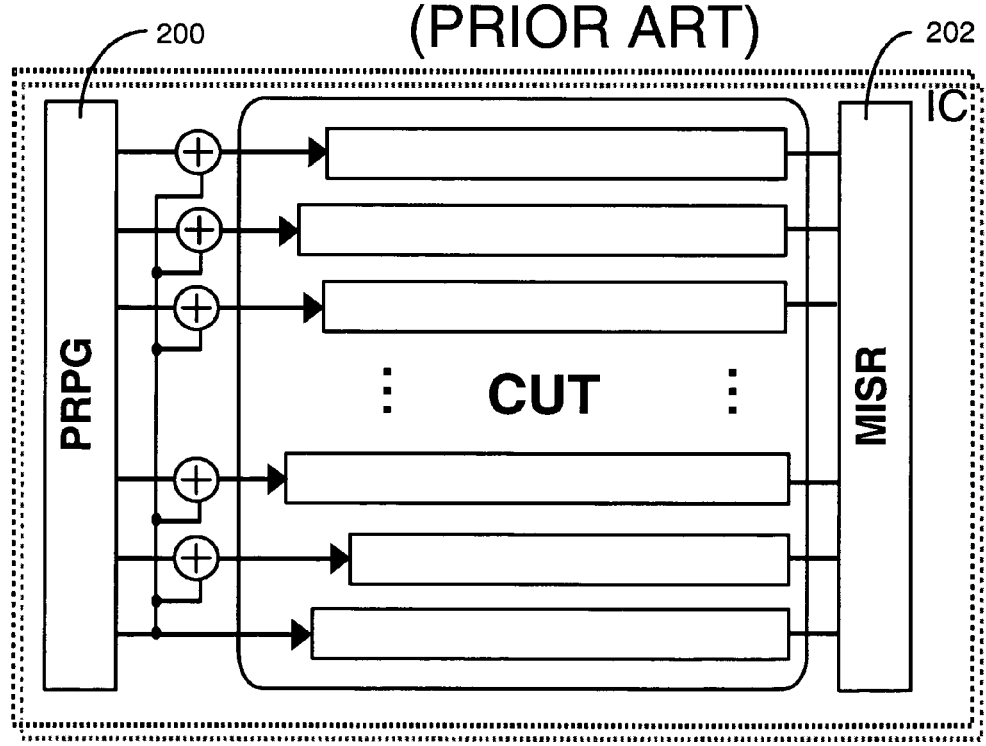
FIG. 2 is a block diagram of a prior art system using a built-in self-test system.
Figure 3:
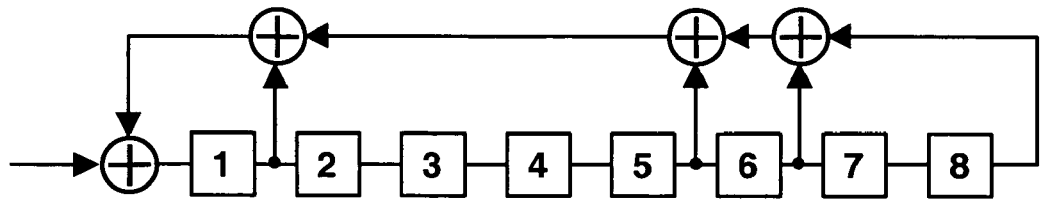
FIG. 3 is a circuit diagram of a prior art external feedback LFSR compactor.
Figure 4:
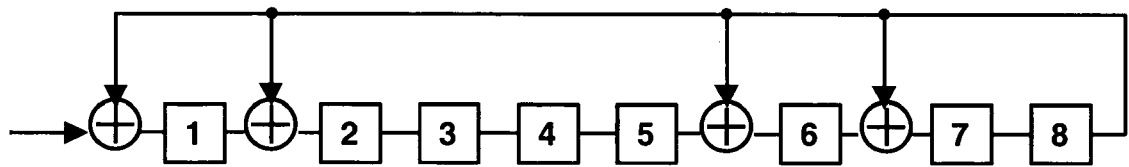
FIG. 4 is a circuit diagram of a prior art external feedback LFSR compactor.
Figure 5:
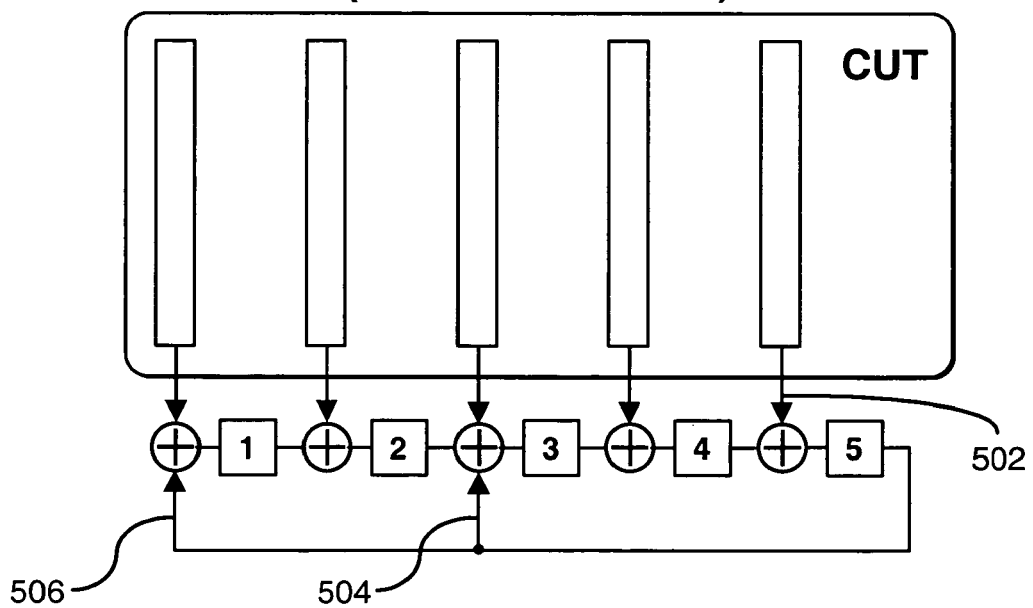
FIG. 5 is a circuit diagram of a prior art architecture of a multiple input signature register (MISR) compactor shown receiving input from scan chains.
Figure 6:
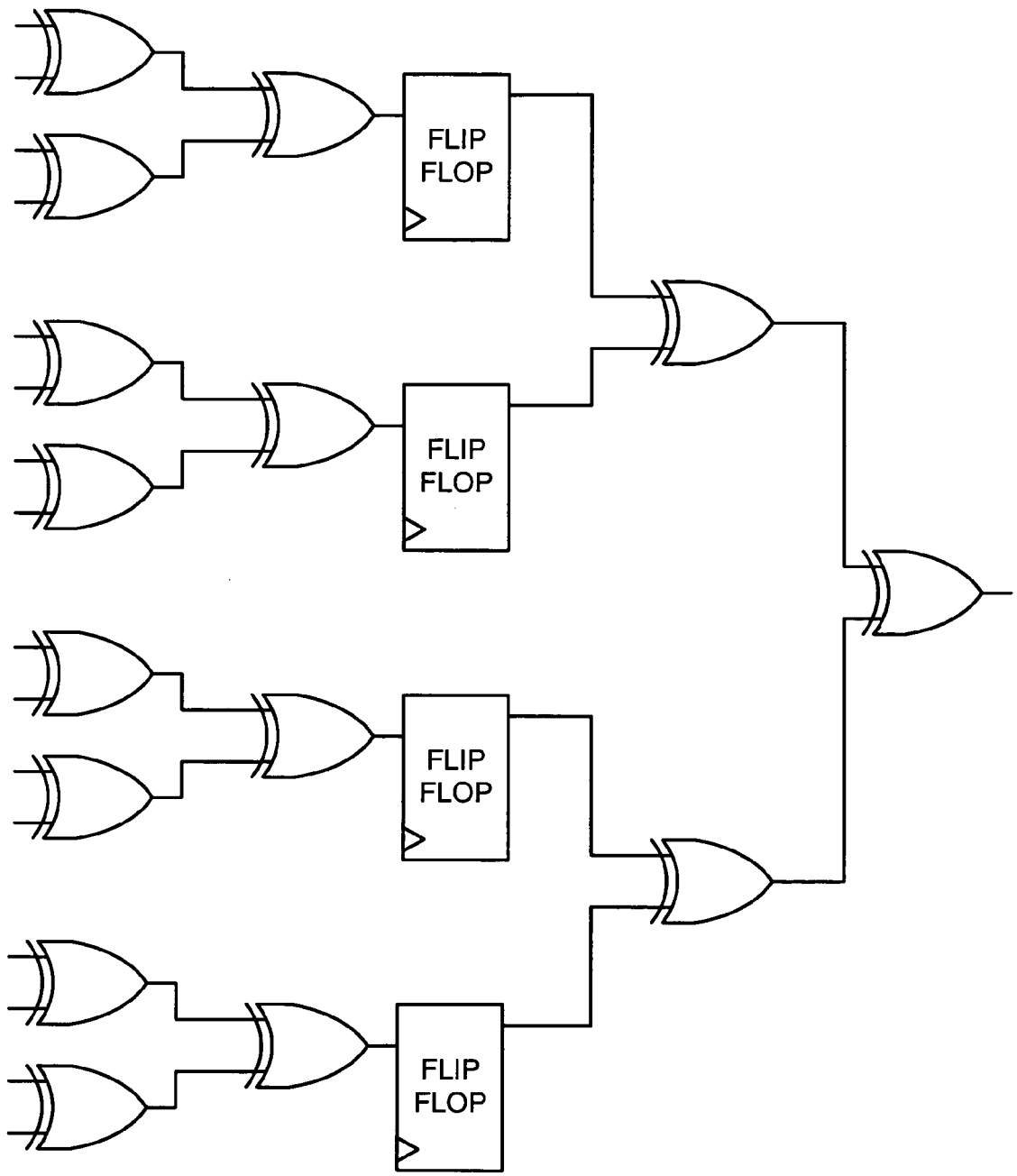
FIG. 6 is a circuit diagram of a prior art pipelined spatial compactor.

Disclosed below are representative embodiments of a compactor and methods for using and designing such embodiments that should not be construed as limiting in any way. Instead, the present disclosure is directed toward novel and nonobvious features and aspects of the various disclosed apparatus and methods, alone and in various combinations and subcombinations with one another. The invention is not limited to any specific aspect or feature, or combination thereof, nor do the disclosed methods and apparatus require that any one or more specific advantages be present or problems be solved.

Although the operations of some of the disclosed methods and apparatus are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods and apparatus can be used in conjunction with other methods and apparatus. Additionally, the description sometimes uses terms like "determine" and "evaluate" to describe the disclosed methods. These terms are high-level abstractions of the actual operations that are performed. The actual operations that correspond to these terms will vary depending on the particular implementation and are readily discernible by one of ordinary skill in the art.

The disclosed compactor embodiments can be implemented in a wide variety of integrated circuits that utilize scan-based testing (e.g., application-specific integrated circuits (ASICs) (including mixed-signals ASICs), systems-on-a-chip (SoCs), or programmable logic devices (PLDs) such as field programmable gate arrays (FPGAs)).

Any of the apparatus described herein can be designed, verified, and/or simulated using software that comprises computer-executable instructions stored on a computer-readable medium. Such software can comprise, for example, an electronic-design-automation (EDA) software tool, such as a design, verification, or simulation tool. Similarly, any of the methods described herein (e.g., the fault diagnosis methods or polynomial selection methods) can be performed using software comprising computer-executable instruction stored on a computer-readable medium. Any such software can be executed on a single computer or on a networked computer-(e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail.

Further, any of the disclosed apparatus can be stored as circuit design information on a computer-readable medium. For example, a database containing design information (e.g., a netlist or an HDL database) can be created or updated to include design information for any of the disclosed compactors. Similarly, a database containing results from any of the disclosed fault diagnosis procedures can be created or updated and stored on a computer-readable medium. Such databases can be created or updated at a local computer or over a network (e.g., by a server computer).

The General Architecture of Exemplary Embodiments of the Disclosed Compactor

In this section, representative embodiments of the disclosed compactor are introduced. These embodiments should not be construed as limiting in any way and are illustrative of some of the features that can be realized with the disclosed architecture.

Figure 7:
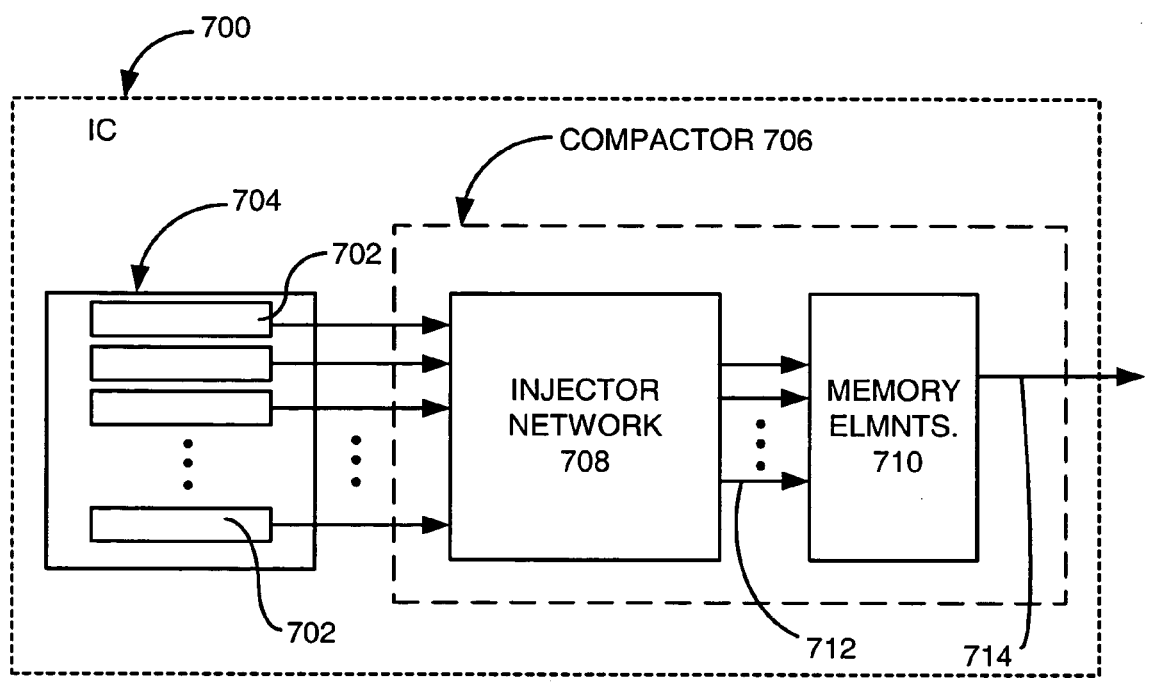
FIG. 7 is a block diagram of an integrated circuit comprising an embodiment of an exemplary compactor.

FIG. 7 shows an integrated circuit 700 utilizing a representative embodiment of the disclosed compactor. The integrated circuit 700 includes a circuit-under-test ("CUT") 704 having, for example, multiple scan chains 702. Although only four scan chains are shown in FIG. 7, the CUT 704 can contain any number of scan chains. A compactor 706 is coupled to the outputs of the scan chains 702 and comprises an injector network 708, memory elements 710, and at least one compactor output 714. Test patterns are loaded into the scan chains 702 from a test pattern source (not shown), such as an ATE or a pseudo-random pattern generator ("PRPG"). During a normal operational mode of the CUT 704, the test patterns are launched into the core logic of the CUT 704 and test responses are captured in the memory elements of the scan chains 702. The test responses contain information associated with faults or errors in the core logic of the CUT 704. These test responses are then loaded out of the scan chains 702 and compressed by the compactor 706. For purposes of this disclosure, the term "test response" refers to the total circuit response to a test pattern captured in the memory elements of the scan chains of the CUT 704. The term "test value" or "test-response value" refers to a single value captured by a single memory element (or scan cell) of a scan chain in response to the test pattern. Finally, a "set of test values" refers to the plurality of test values that is shifted out of the scan chains in one clock cycle.

The test-response values can include, for example, unknown states (sometimes referred to herein as "X states"), which can arise, for example, when a memory element of a scan chain is not initialized. During operation of the compactor 706, test responses from the outputs of the scan chains 702 are injected (provided or otherwise delivered) into inputs of the injector network 708 where they are processed and combined with other values to form intermediate values, which are output from the injector network 708 at injector-network outputs 712. The intermediate values created by the injector network 708 are input into the memory elements 710. As more fully described below, the memory elements 710 can comprise any of a variety of memory devices (e.g., an edge-triggered flip-flop, master-slave flip-flop, latch, or any other such suitable sequential or clocked device) and may, in some embodiments, be coupled with one another in various combinations or sub-combinations to form one or more registers. The memory elements are clocked (e.g., in some embodiments, serially shifted) to produce at least one compactor output 714.

Figure 8:
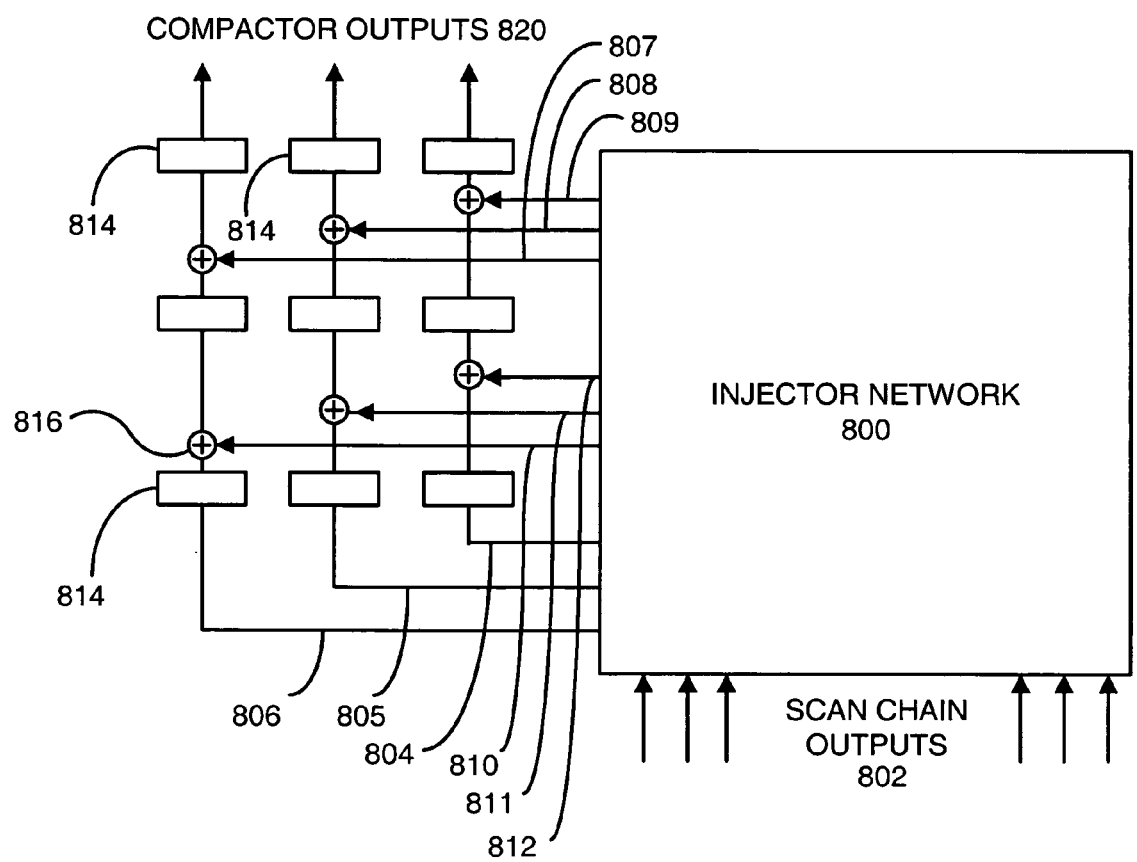
FIG. 8 is a block diagram showing one form of the exemplary compactor of FIG. 7 in greater detail, including memory elements and compactor outputs.

FIG. 8 shows one form of an exemplary compactor in greater detail. In particular, FIG. 8 shows an injector network 800 having outputs that are coupled to memory elements 814 via direct paths 804-806 and paths 807-812 that include XOR gates. The memory elements of the illustrated embodiment are connected serially by a feedback-free network of logic gates 816. In the illustrated embodiment, the logic gates 816 are XOR gates, but can also comprise XNOR gates or some other combination of logic gates. The serially-connected memory elements produce at least one associated compactor output 820.

Figure 9:
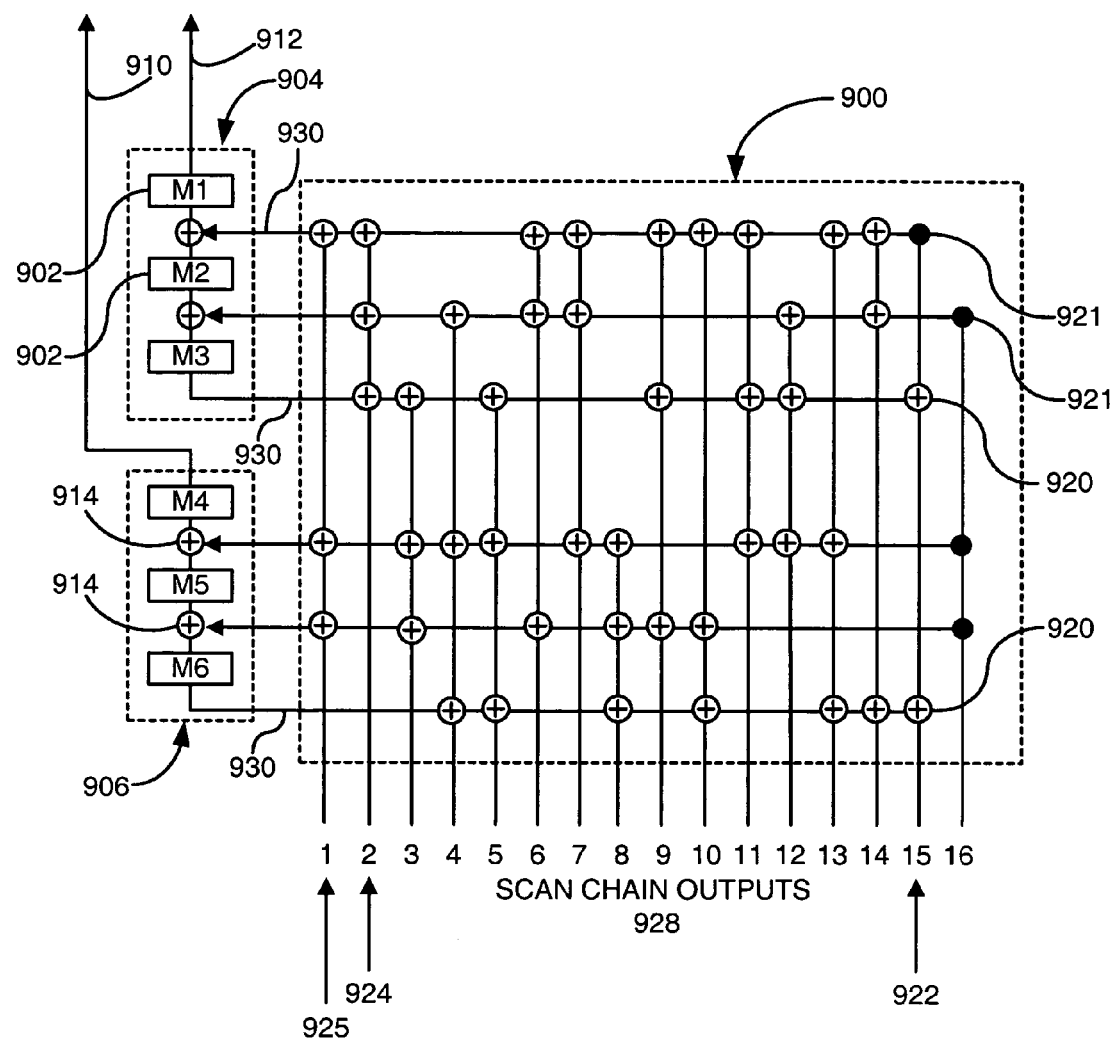
FIG. 9 is a block diagram showing one form of an exemplary injector network such as can be used in the compactor of FIG. 7.

FIG. 9 shows an exemplary embodiment of an injector network 900 as can be used in the disclosed embodiments of the compactor. The exemplary injector network 900 is configured such that each scan-chain output 928 (labeled in FIG. 9 as scan-chain outputs "1-16") is coupled to plural memory elements 902 (labeled in FIG. 9 as memory elements "M1-M6"). In the illustrated embodiment, the memory elements 902 comprise two registers 904, 906. In particular, memory elements M1-M3 form a first register 904, and memory elements M4-M6 form a second register 906. This arrangement, however, is not limiting, and the memory elements 902 can be configured to form registers of varying lengths, or no registers at all. The registers 904, 906 have compactor outputs 910, 912, respectively.

In the illustrated embodiment, the injector network 900 comprises a grid (sometimes referred to herein as a "space-time" grid) that distributes the test values output from the scan-chain outputs 928 into the memory elements 902. In FIG. 9, for instance, each scan-chain output 928 is coupled to three memory elements 902 via the injector network 900, and thus can be said to have a fan-out of three. (Note that the scan-chain outputs may, in some embodiments, be fanned-out to other components.) As seen in FIG. 9, the injector network 900 includes multiple gates 920 and junctions 921 that couple the scan-chain outputs 928 with the memory elements 902. The injector network 900 may, in some embodiments, include a variety of additional components. For example, the injector network 900 may include one or more banks of memory elements used to create a pipeline structure for the test-response values. The gates 920 can comprise 2-input XOR gates, XNOR gates, or any other suitable logic gate. Each gate 920 or junction 921 can be labeled as (m,s) where m is the memory element and s is the scan chain connected through that particular gate or junction to the indicated memory element. Thus, for instance, scan-chain output "15" (shown by arrow 922) is coupled to memory elements M1, M3, and M6 via junction (M1, 15) and gates (M3, 15) and (M6, 15). Similarly, scan-chain output "2" (shown by arrow 924) is coupled to memory elements M1, M2, M3 via gates (M1, 2), (M2, 2), and (M3, 2). Moreover, as illustrated in FIG. 9, because certain scan-chain outputs 928 are coupled to the same memory element, the path from a given scan-chain output 928 to a respective memory element may include several gates 920. For instance, scan-chain output "2" is coupled to memory element M1 via two gates: (M1, 2) and (M1, 1). Additionally, outputs 930 of the injector network 900 can be coupled to the memory elements 902 of the registers 904, 906 via gates 914. In FIG. 9, for example, the exemplary gates 914 are two-input XOR gates that serially couple the memory elements 902 with one another and the injector-network outputs 930.

FIG. 26 is a flow chart 2600 illustrating the operation of an exemplary compactor. At process block 2602, test-response values are provided to a network comprising combinational logic, such as the injector network 900 described above. For example, the scan chains of the CUT can be clocked (e.g., over a single clock cycle) to provide a set of test-response values to the network. The test-response values can alternatively be provided to the network via some other suitable mechanism (e.g., from a register that has loaded the test-response values from the scan-chain outputs (serially or in parallel) and provides the values to the network).

At process block 2604, the test-response values are expanded into a plurality of expanded test values. For example, in the embodiment illustrated in FIG. 9, the test values provided by the scan-chain outputs 928 are input into the network 900, where the test values are expanded into multiple values (referred to herein as "expanded values" or "expanded test values") by the gates 920 coupled to the respective scan-chain outputs 928. Desirably, in certain embodiments, the number of expanded values is greater than the number of scan-chain outputs.

At process block 2606, at least some of the expanded values are combined with other expanded values via gates 920 to form intermediate values at the injector-network outputs 930. The intermediate values that appear at the injector network outputs 930 are sometimes referred to herein as "primary intermediate values."

At process block 2608, a portion of the primary intermediate values from the injector-network outputs are combined with previously stored intermediate values via the gates 914, for example, thereby forming new intermediate values. The new intermediate values, together with any primary intermediate values not combined with previously stored values via gates 914, can collectively be referred to as "secondary intermediate values." (Note that the primary intermediate values and the secondary intermediate values are sometimes referred to collectively as the "intermediate values.")

At process block 2610, the secondary intermediate values are loaded into the memory elements during the next clock cycle. The memory elements and the scan chains can be clocked together such that each clock cycle introduces a new set of test values into the injector network while simultaneously advancing previously stored intermediate values through the memory elements and toward the compactor outputs. (Note that in some embodiments, the final memory elements in the registers 904, 906 (in FIG. 9, for example, memory elements M1 and M4) may be removed from the compactor 900 without losing the desired functionality. In these embodiments, only a portion of the secondary intermediate values are loaded into memory elements.)

As can be seen generally from FIG. 9, the injector network 900 delivers intermediate values corresponding to a given set of test-response values into the memory elements 902 so that all information at least partially determined by the set of test values is not output from the illustrated compactor embodiment until the compactor has been clocked for a certain period of clock cycles. The period of clock cycles required to output information associated with a particular test-response value is sometimes referred to herein as the test value's "observation period" or "observation window." In the particular embodiment shown in FIG. 9, for example, the observation period for a test-response value from the scan chain 924 (scan chain "2") is three, whereas the observation period for a test-response value from the scan chain 925 (scan chain "1") is two. Consequently, the set of output values produced by the compactor and associated with a particular test-response value has a fixed length (dependent, for example, on the number of serially coupled memory elements). In certain embodiments, the set of output values desirably has a fixed length of at least two. That is, the observation period is at least two clock cycles.

During operation of the compactor, observation periods associated with test-response values are typically clocked out of the compactor before the scan chains have finished unloading a particular test response. That is, for many test-response values, the observation periods associated with corresponding test-response values end before the unloading period of the scan chains ends. Moreover, because of the various ways in which the injector network can load the memory elements of the compactor, an observation period associated with one test-response value can begin and end at times different than the observation period of another test-response value, even if the two test-response values are injected into the compactor during the same clock cycle.

At process block 2612, the sets of output values that are clocked out of the compactor. At process block 2616, the output values are analyzed and a diagnosis of the CUT is performed. For example, a set of output values can be analyzed to determine whether the set of output values comprises an expected set of output values. If the analysis indicates that an error has occurred in the CUT, the output values can be further analyzed in process block 2614 to determine a location of the error in the CUT. For example, for certain errors, the precise location of the scan cell capturing the error can be determined from the set of output values. Exemplary embodiments of a method for diagnosing errors using the disclosed compactor architecture are described below.

Figure 10:
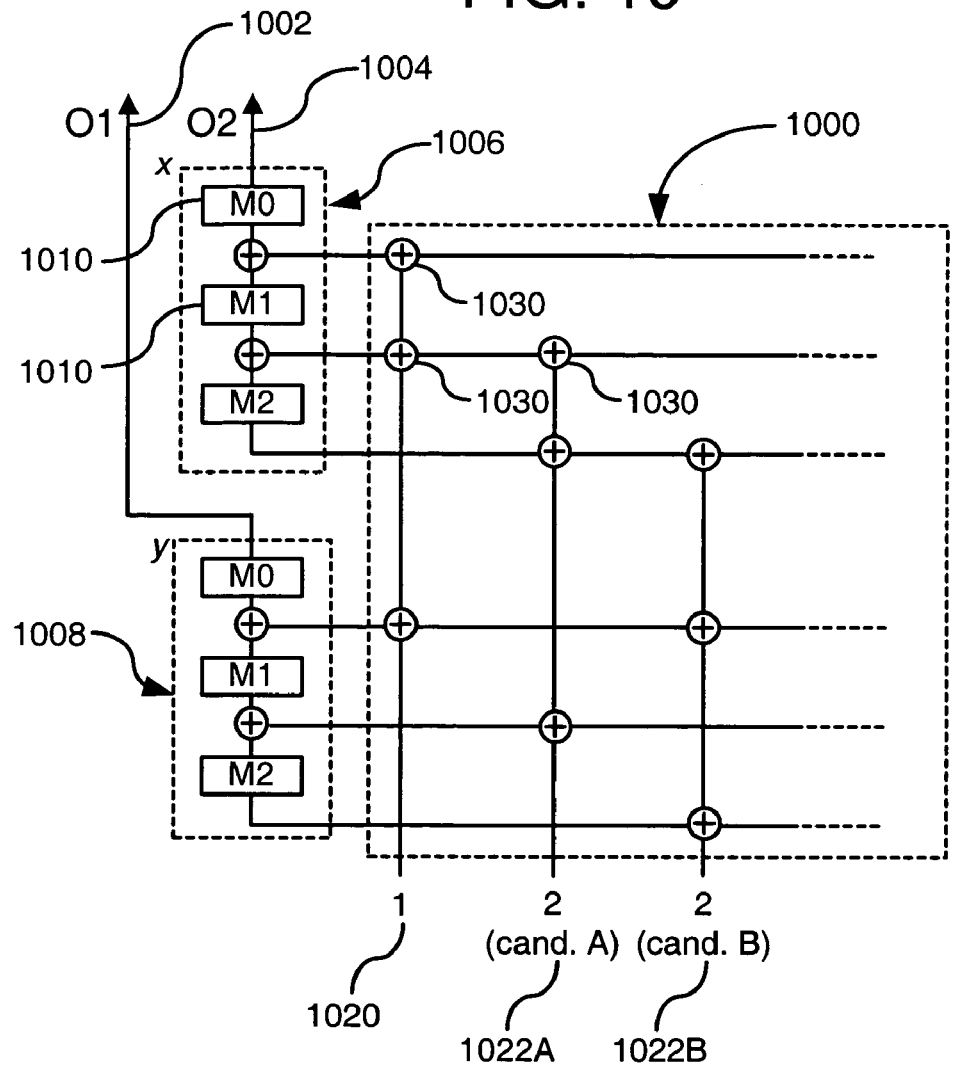
FIG. 10 is a block diagram illustrating the process of designing an injector network according to one exemplary method.
Figure 11:
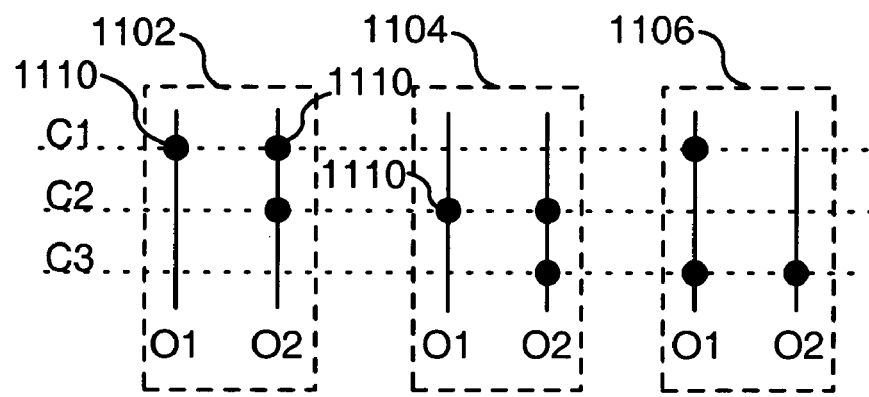
FIG. 11 shows exemplary output patterns from the gate arrangements illustrated in FIG. 10.

In certain embodiments of the compactor, the architecture of the injector network is configured to produce enhanced error-prediction properties. For example, and as more fully described below, the injector network can be configured to prevent the masking of one, two, or odd-numbered errors thereafter and to handle single unknown states that are input into the compactor during a given observation period. Thus, for example, the set of output values produced from such a compactor will reveal the presence of a single error, even if one or two other errors or a single unknown state was input simultaneously with the single error or during the observation period associated with the single error. FIGS. 10 and 11 illustrate one example of how to configure or design the injector network to produce these enhanced results. In particular, FIG. 10 shows a portion of an injector network 1000 with a first scan-chain output (labeled as "1") having a fixed arrangement 1020 of gates 1030 for delivering the test-response values to the memory elements 1010. In FIG. 10, the memory elements 1010 comprise two serial registers 1006, 1008 (labeled as registers "x" and "y," respectively) that produce output values at compactor outputs 1002, 1004. FIG. 10 also shows a second scan-chain output ("2") having two candidate gate arrangements 1022A, 1022B (labeled "2 (cand. A)" and "2 (cand. B),"" respectively) for the gates 1030 in the network 1000. For purposes of describing how the gates 1030 distribute the test-response values from the respective scan-chain outputs, polynomial terminology can be used. That is, each gate arrangement for distributing the test-response values from the scan-chain outputs into the injector network can be expressed as a polynomial where the powers of the polynomial refer to the memory elements of the compactor coupled to the gates. For example, with reference to FIG. 10, the gate arrangement 1020 can be written as $P_1=x^0+x^1+y^0$, the gate arrangement 1022A as $P_A=x^1+x^2+y^1$, and the gate arrangement 1022B as $P_B=x^2+y^0+y^2$.

FIG. 11 is a block diagram illustrating the output from the gate arrangements of FIG. 10 over the observation period of the illustrated compactor. In particular, three exemplary clock cycles ("C1," "C2," and "C3") at the outputs 1002 ("O1") and 1004 ("O2") are shown for each of the gate arrangements. In the diagram 1000, an indicator 1110 is used to indicate whether the outputs 1002, 1004 include a value that is at least partially determined by the respective gate arrangements during a particular clock cycle. For example, the gate arrangement 1020 produces the pattern shown in observation window 1102. More specifically, the gate arrangement $x^0+x^1+y^0$ contributes to the value of outputs O1 and O2 during C1, output O2 during C2, and neither output during C3.

The output for the gate arrangement 1022A (i.e., $P_A=x^1+x^2+y^1$) is shown in observation window 1104, and for the gate arrangement 1022B (i.e., $P_B=x^2+y^0+y^2$) in observation window 1106. As can be seen in the observation window 1104, the resulting output for the gate arrangement 1022A is a shifted version of the output produced by the gate arrangement 1020 in the window 1102. Consequently, if an error were injected into scan chain 2 in a first clock cycle and another error injected into scan chain 1 during the next clock cycle, the errors would completely mask each other such that neither error would be observable on the outputs 1002, 1004. Thus, with the gate arrangement 1022A, there exists the possibility that two errors injected within a single observation cycle will completely mask each other. By contrast, the gate arrangement 1022B, which has an output displayed in the window 1106, does not produce an output that is identical to or a shifted version of the output produced by the gate arrangement 1020. Consequently, the gate arrangement 1022B cannot mask the output produced by the gate arrangement 1020, even if two errors are injected simultaneously from scan chains 1 and 2. Therefore, the gate arrangement 1022B prevents masking of one, two, and odd-numbered errors thereafter. (Note that odd numbers of errors are observable because only even numbers of errors can combine with each other to cancel each other out). Another property of the gate arrangement exemplified by candidate B is that a single unknown (or X) state injected into the network during the associated observation window will not be able to mask entirely an error syndrome injected from the scan chain 1020. Yet another property of this type of gate arrangement is that any single error can be uniquely identified on the compactor outputs provided that no X states propagate to the same outputs during the associated observation window. Thus, the source of the error (i.e., the failing scan cell in a scan chain) can be located. According to one exemplary design method, which is more fully discussed below, the injector network of the compactor is configured with polynomials having the characteristics of candidate B.

For purposes of this disclosure, polynomials that result in gate arrangements of the injector network that (1) prevent masking of one, two, and odd-numbered errors thereafter inserted during a respective observation window; (2) are able to handle single unknown states in test responses inserted in the respective observation window; and (3) enable diagnosis of a failing scan cell when no unknown states are inserted during the respective observation window, are referred to as "valid" polynomials. Such polynomials are also referred to herein as "k/M" polynomials, where k is the number of memory elements driven by each scan-chain outputs (i.e., the effective fan-out) and M is the number of memory elements in the compactor (sometimes referred to as the "register size").

In general, the disclosed embodiments of the compactor are highly scalable and can support an arbitrary compaction rate for any number of outputs, including, for example, compactor designs having just one compactor output. The number of memory elements M and the polynomials indicating how the scan-chain outputs are coupled with the memory elements of the compactor determine some of the properties of the disclosed compactor. For example, given the number of compactor outputs b, the number of memory elements M, and the number k of memory elements driven by each scan chain, the maximum number S of scan chains that can be coupled with any of the disclosed compactors can be expressed as follows:

$$S = \sum_{i=1}^{b} \binom{M-i}{k-1} \quad (1)$$

Equation (1) can alternatively be written as follows:

$$S = \sum_{i=1}^{b} \left( \frac{(M-i)!}{(M-i-k+1)!(k-1)!} \right) \quad (2)$$

Tables 1(a) and 1(b) below provide numerical data obtained from the above formula for exemplary compactors having 3/M and 5/M polynomials; 1, 2, 4, 8, and 16 compactor outputs; and up to 32 memory elements:

TABLE 1(a)

The Maximum Number of Observable Scan Chains for Compactors Using 3/M Polynomials

| | Compactor Outputs - 3/M polynomials | | | | |
|---|---|---|---|---|---|
| M | 1 | 2 | 4 | 8 | 16 |
| 3 | 1 | 1 | | | |
| 4 | 3 | 4 | 4 | | |
| 6 | 10 | 16 | 20 | | |
| 8 | 21 | 36 | 52 | 56 | |
| 10 | 36 | 64 | 100 | 120 | |
| 12 | 55 | 100 | 164 | 216 | |
| 16 | 105 | 196 | 340 | 504 | 560 |
| 20 | 171 | 324 | 580 | 920 | 1136 |
| 24 | 253 | 484 | 884 | 1464 | 1968 |
| 28 | 351 | 676 | 1252 | 2136 | 3056 |
| 32 | 465 | 900 | 1684 | 2936 | 4400 |

TABLE 1(b)

The Maximum Number of Observable Scan Chains for Compactors Using 5/M Polynomials

| | Compactor Outputs - 5/M Polynomials | | | | |
|---|---|---|---|---|---|
| M | 1 | 2 | 4 | 8 | 16 |
| 6 | 5 | 6 | 6 | | |
| 8 | 35 | 50 | 56 | 56 | |
| 10 | 126 | 196 | 246 | 252 | |
| 12 | 330 | 540 | 736 | 792 | |

TABLE 1(b)-continued

The Maximum Number of Observable Scan Chains for Compactors Using 5/M Polynomials

| | Compactor Outputs - 5/M Polynomials | | | | |
|---|---|---|---|---|---|
| M | 1 | 2 | 4 | 8 | 16 |
| 16 | 1365 | 2366 | 3576 | 4312 | 4368 |
| 20 | 3876 | 6936 | 11136 | 14712 | 15504 |
| 24 | 8855 | 16170 | 27000 | 38136 | 42448 |
| 28 | 17550 | 32500 | 55776 | 82776 | 97488 |
| 32 | 31465 | 58870 | 103096 | 158872 | 197008 |

Table 2 compares the number of observable chains possible in the X-compact scheme to exemplary embodiments of the disclosed compactor having 16 and 32 memory elements, respectively, and a range of compactor outputs from 5 to 14.

TABLE 2

Maximum Number of Scan Chains in an X-Compact Compactor and in Embodiments of the Disclosed Compactors

| Outputs | X-Compact | SC-16 | SC-32 |
|---|---|---|---|
| 5 | 10 | 395 | 2035 |
| 6 | 20 | 440 | 2360 |
| 7 | 35 | 476 | 2660 |
| 8 | 56 | 504 | 2936 |
| 9 | 126 | 525 | 3189 |
| 10 | 252 | 540 | 3420 |
| 11 | 462 | 550 | 3630 |
| 12 | 792 | 556 | 3820 |
| 13 | 1716 | 559 | 3991 |
| 14 | 3432 | 560 | 4144 |

Table 2 illustrates how the number of memory elements used in one of the disclosed compactor embodiments can impact the maximum number of observable scan chains. For example, a compactor having 8 outputs can observe at most 56 scan chains in the X-compact scheme, resulting in a maximum compaction of 7×. An embodiment of the disclosed compactor with 3/16 polynomials (i.e., valid, k/M polynomials where k=3 and M=16) can observe up to 504 scan chains when using 16 memory elements, and 2936 scan chains when using 32 memory elements. The corresponding compaction ratios are 63× and 367×, respectively. Thus, the disclosed compactor schemes are well suited for a wide range of modular designs where, for instance, each block can possess a separate compactor with a very small number of outputs but with a very high compaction ratio.

As noted above, there may be several candidate polynomials for each scan-chain output of a CUT to be coupled to the memory elements of the compactor. Only some of these polynomials, however, produce the desirable results noted above. Accordingly, in certain embodiments, the injector network is configured such that each scan-chain output is coupled to the memory elements of the compactor using a valid, k/M polynomial. In certain other embodiments, however, the injector network is configured to include various combinations or subcombinations of valid polynomials. In yet another embodiment, the injector network employs polynomials having their taps sufficiently spaced such that the compactor can handle efficiently burst errors injected from the adjacent scan cells. As a result, the compactor may offer desirable diagnostic capabilities that can be used to locate sites of the failing scan cells.

Figure 25:
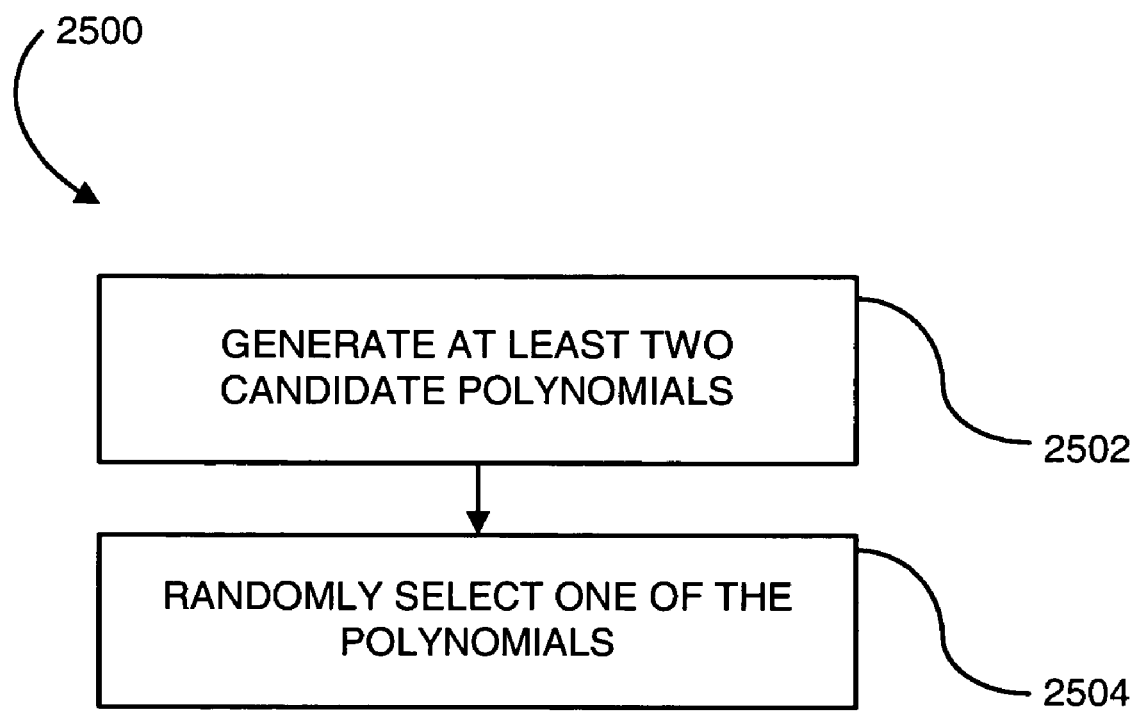
FIG. 25 is a flow chart of a method for designing one form of an exemplary compactor.

A variety of different methods can be employed for designing and configuring the disclosed compactor. For example, in one approach, an embodiment of a compactor is selected to have a large number of memory elements in comparison to the number of scan-chain outputs (i.e., larger than the numbers indicated in Table 1 or predicted by equations (1) and (2)). In this approach, a variety of valid polynomials exist for each scan-chain output. The manner in which the polynomials are selected from the various candidate polynomials can also vary. For example, one exemplary method for selecting the appropriate polynomials for an injector network is illustrated in FIG. 25. The method 2500 shown in FIG. 25 can be performed for a selected scan-chain output to be coupled to the memory elements of an embodiment of the disclosed compactor. At process block 2502, at least two candidate polynomials are generated for the selected scan-chain output. The candidate polynomials can be generated according to some predetermined pattern (e.g., sequentially advancing the value of respective powers in the polynomial) or at random. The candidate polynomials are desirably generated such that none of the candidates comprise polynomials that have already been selected for other scan-chain outputs. At process block 2504, one of the polynomials is selected randomly. By randomly selecting a polynomial, the resulting injector network is more balanced and provides for a better distribution of errors when multiple errors are introduced into the network, thereby reducing the likelihood that even-numbered errors greater than two will be masked. The method 2500 can then be repeated for another scan-chain output, which can similarly be selected according to some predetermined pattern (e.g., sequentially) or at random. In this manner, valid polynomials can be selected for the entire compactor.

Figure 27:
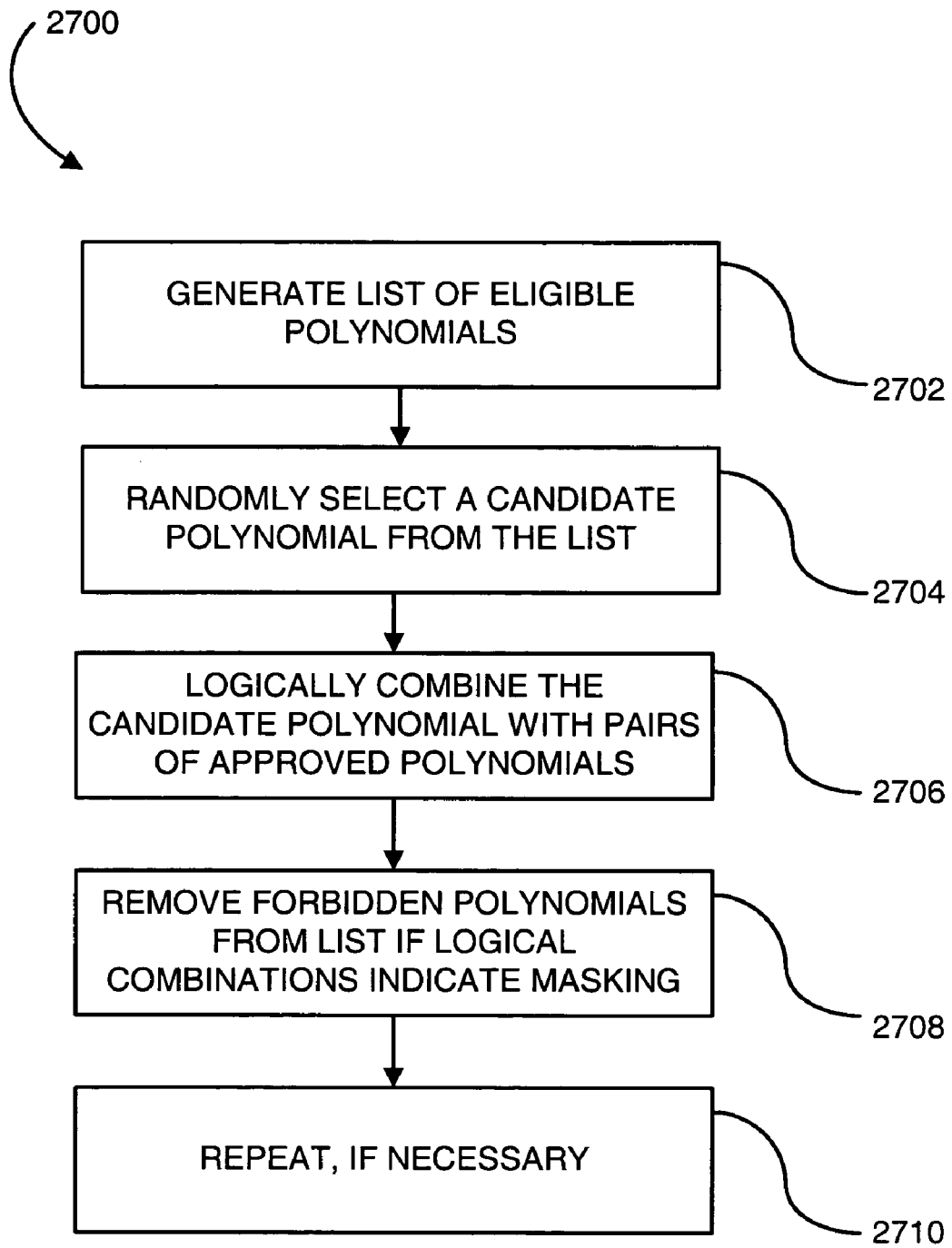
FIG. 27 is a flow chart of another embodiment of a method for designing an exemplary compactor.

The method of FIG. 25 can be further modified to produce other desirable error-detection properties. For example, FIG. 27 shows a method 2700 of configuring an injector network to ensure that there is no 4-error masking in a single clock cycle. At process block 2702, a list of eligible polynomials is generated. The eligible polynomials can comprise all valid, k/M polynomials for a given number of memory elements M and fan out k, or a subset of such polynomials. For example, for a CUT having n scan-chain outputs to be coupled to the compactor, the list can contain n valid polynomials selected randomly from the set of all valid polynomials. At process block 2704, one of the polynomials from the list is randomly selected as a candidate polynomial p. At process block 2706, the candidate polynomial p is combined in a bit-wise fashion to pairs of already approved polynomials q and r to obtain a sum s, where s =p⊕q⊕r. (Note that the first two polynomials to be approved can be randomly selected and combined to form a first sum s). In certain embodiments, the sum s is determined for every pair q and r of approved polynomials. At process block 2708 and for each sum s determined in process block 2706, any polynomial in the list that is equal to the sum s is deemed a forbidden polynomial and removed from the list because its usage may lead to 4-error masking. As indicated at process block 2710, the method 2600 can be repeated as necessary until enough polynomials have been approved to implement the compactor. Additional eligible polynomials can be added to the list as necessary in order to have a sufficient number of polynomials for configuring the compactor. For single output compactors, which do not use shifted versions of polynomials k/M, this exemplary approach offers particularly efficient performance because it takes a constant time to locate polynomial s on the list. Indeed, there exists a simple mapping between consecutive integers and lexicographically generated k-element sequences chosen from an M-element set, and such mapping can be used here.

Table 3, shown below, lists the approximate maximum numbers of inputs for single-outputs embodiments of the disclosed compactor having M memory elements. These numbers were empirically obtained using several types of pseudo-random number generators.

TABLE 3

The Maximum Number of Inputs for Single-Output Compactors with No 4-Error Masking

| M | k = 3 | k = 5 | k = 7 | k = 9 |
|---|---|---|---|---|
| 8 | 12 | 12 | 7 | — |
| 9 | 16 | 16 | 11 | 1 |
| 10 | 18 | 22 | 19 | 9 |
| 11 | 21 | 28 | 28 | 17 |
| 12 | 26 | 36 | 36 | 28 |
| 13 | 29 | 47 | 49 | 43 |
| 14 | 34 | 58 | 62 | 59 |
| 15 | 40 | 71 | 82 | 80 |
| 16 | 44 | 87 | 103 | 104 |
| 17 | 51 | 106 | 133 | 136 |
| 18 | 56 | 129 | 169 | 177 |
| 19 | 60 | 152 | 207 | 226 |
| 20 | 69 | 183 | 262 | 290 |
| 21 | 77 | 213 | 323 | 379 |
| 22 | 81 | 247 | 395 | 465 |
| 23 | 89 | 281 | 486 | 594 |
| 24 | 98 | 330 | 586 | 741 |
| 25 | 105 | 377 | 705 | 930 |
| 26 | 114 | 435 | 842 | 1152 |
| 27 | 123 | 484 | 1002 | 1414 |
| 28 | 132 | 543 | 1169 | 1741 |
| 29 | 139 | 612 | 1380 | 2107 |
| 30 | 150 | 698 | 1617 | 2567 |
| 31 | 161 | 767 | 1874 | 3111 |
| 32 | 176 | 857 | 2179 | 3723 |
| 21 | 77 | 213 | 323 | 379 |

The basic methodology used to eliminate 4-error masking in the method 2700 illustrated in FIG. 27 can be used to configure a compactor that eliminates other numbers of error masking (e.g., 6-error masking, 8-error masking, and so on). For example, the method 2700 can be performed with larger bit-wise sums to achieve such results.

Error Masking Properties of Exemplary Embodiments of the Disclosed Compactor in the Absence of X States In this section, the masking properties of exemplary embodiments of the disclosed compactor designed with valid, k/M polynomials (discussed above) are analyzed. For purposes of this section, it is assumed that no unknown or X states are present and that the compactors were not configured to eliminate 4-error or higher masking. Moreover, each k/M polynomial is assumed to have the same odd number of terms (i.e., 3, 5, 7, . . . ), though the compactor need not have this limitation. One feature of these exemplary compactors having k/M polynomials is that they are capable of detecting errors from one, two, or any odd number of scan-chain outputs thereafter provided that all scan chains produce X-state free responses. Moreover, the errors can be injected at the same time or at different shift cycles within a relevant observation window.

Because the k/M polynomials are desirably selected such that no identical or shifted versions of the polynomials are produced at the compactor outputs, an error injected into the compactor cannot be erased by another single error injected in the same or later cycle in a given observation window. For example, for an exemplary compactor where k is 3, two errors can leave an error syndrome in the register that appears in 2 bits of the compactor output if the original errors overlap in 2 positions of the observation window, 4 bits if they overlap in one position, or 6 bits if they do not overlap in any position. A third error injected from a scan chain can reduce the number of bits in the affected registers showing an error syndrome to 1, 3, 5, 7, or 9 for the varying degrees of possible overlap. Similarly, a fourth error can reduce the number of bits showing an error in the affected registers to 0, 2, 4, 6, 8, 10, and 12, for the varying degrees of possible overlap. In this case, "0" indicates 4-error masking because no bit of the affected registers shows the error syndrome, despite the presence of four errors. A similar analysis can be applied to any fan-out size k.

As this analysis shows, the detection of even-numbered errors greater than four is not guaranteed in the exemplary compactors. To study this phenomenon in greater detail, experiments were conducted measuring the frequency of 4-error masking and its dependence on the size of the compactor registers, the polynomials employed, and the time span of errors. The measurements were obtained by conducting Monte Carlo simulations for one-hundred-million error configurations. Several observations can be made as a result of these experiments. First, as indicated in Table 4 below, the compaction ratio has a marginal impact on the probability of 4-error masking. (Note that, for the sake of clarity, the tables presented in this section contain the actual number of observed aliasing cases rather than the probability of their occurrence.)

TABLE 4

4-Error Masking for 20- and 32-Bit Registers

| | | Register size/outputs | | | | | |
|---|---|---|---|---|---|---|---|
| C | K | 20/1 | 20/2 | 20/4 | 20/8 | 32/16 | 32/32 |
| 100x | 3 | 6466 | 6727 | 5224 | 4049 | 295 | 274 |
| | 5 | 356 | 532 | 529 | 475 | 3 | 6 |
| 50x | 3 | 6120 | 7129 | 5735 | 3818 | 305 | 278 |
| | 5 | 868 | 468 | 540 | 477 | 7 | 3 |
| 25x | 3 | 7880 | 4404 | 5606 | 3646 | 301 | 273 |
| | 5 | 0 | 429 | 491 | 434 | 4 | 7 |

Second, as shown in Table 5 below, for the same level of compaction, the number of compactor outputs has a marginal impact on 4-error masking.

TABLE 5

4-Error Masking, 100x Compaction, 3/M

| | Outputs | | | | | |
|---|---|---|---|---|---|---|
| M | 1 | 2 | 4 | 8 | 16 | 32 |
| 16 | 24148 | 24286 | 18164 | — | — | — |
| 20 | 6466 | 6727 | 5457 | 4049 | — | — |
| 24 | 3777 | 2098 | 2024 | 1667 | 1464 | — |
| 28 | 1268 | 830 | 890 | 746 | 598 | — |
| 32 | 510 | 549 | 377 | 361 | 295 | 274 |
| 36 | 295 | 321 | 227 | 117 | 142 | 141 |
| 40 | 164 | 232 | 97 | 88 | 68 | 78 |
| 44 | 71 | 76 | 77 | 51 | 54 | 41 |
| 48 | 57 | 60 | 38 | 32 | 18 | 24 |

Third, polynomials with a greater number of terms (i.e., a larger value for fan-out k) perform better than those with a smaller number of terms. For example, Table 4 shows better performance for 5/M polynomials when compared to 3/M polynomials. Fourth, as seen in Table 4, 4-error masking drops quickly with the increasing number of compactor flip-flops. Fifth, as seen in Table 6 below, 4-error masking drops quickly with the increasing time span of errors. More specifically, in previous experiments described above, errors were injected in the same cycle from scan-chain outputs, but Table 6 shows experiments where errors were injected over some number of clock cycles, defined as an error time span.

TABLE 6

4-Error Masking vs. Error Time Span, 100x Compaction, 3/16, 3/24

| Error time span | Register size/outputs | | | | |
|---|---|---|---|---|---|
| | 16/1 | 16/2 | 16/4 | 24/8 | 24/16 |
| 0 | 24148 | 24286 | 18164 | 1667 | 1464 |
| 4 | 5660 | 1880 | 410 | 26 | 17 |
| 8 | 1692 | 295 | 57 | 7 | 6 |
| 12 | 561 | 82 | 18 | 5 | 1 |
| 16 | 213 | 21 | 9 | 0 | 1 |
| 20 | 76 | 11 | 3 | 0 | 0 |
| 24 | 44 | 11 | 1 | 0 | 0 |
| 28 | 32 | 8 | 2 | 0 | 0 |
| 32 | 21 | 4 | 1 | 0 | 0 |

Similar experiments performed with errors of multiplicity 6, 8, 10, 12, 14, and 16 indicate that such higher order masking occurs substantially less often than 4-error masking.

Experiments were also conducted to compare 4-error masking in embodiments of the disclosed compactor with 4-error masking in spatial compactors having the same number of outputs. For one such experiment, an X-compact scheme with 8 outputs and 56 scan chains was selected and compared with three exemplary configurations of 8-output compactors designed using valid, k/M polynomials according to the disclosed architecture. In one-hundred-million cases, 4-error masking occurred 802,146 times in the X-compact scheme. By contrast, for the exemplary compactors having 16; 24; and 32 memory elements, 4-error masking was observed 15,696; 1717; and 295 times, respectively. Moreover, when the number of outputs was increased to 16 and the number of scan chains was raised to 1600, then the use of the X-compact scheme led to 3079 cases of aliasing. By contrast, the exemplary compactors having 24; 32; and 40 memory elements exhibited the error masking 21; 0; and 0 times, respectively. That is, for the exemplary compactors having 32 and 40 memory elements, no aliasing was observed at all.

Table 4 shows that no 4-error masking was observed for a single-output embodiment of the disclosed compactor having a 20-bit register driven by 25 scan chains. In general, this phenomenon is expected to occur when the number of scan chains becomes small relative to the total number of polynomials that can be utilized in a given compactor embodiment. In such cases, there is a good chance that polynomials that are selected randomly to configure the compactor will never allow 4-error masking.

Error Masking Properties of Exemplary Embodiments of the Disclosed Compactor in the Presence of X States In this section, the masking properties of embodiments of the disclosed compactor designed with valid, k/M polynomials (discussed above) are analyzed in the presence of unknown, or X, states. Unless designed for a BIST environment, real circuits produce unknown states in their test responses. Because of the limited number of memory elements and lack of any feedback, certain embodiments of the disclosed compactor are capable of handling X states. For these embodiments, the states of the memory elements in the compactor and the values produced at its outputs depend only on the scan-chain outputs in the clock cycles of the relevant observation window. For a compactor with an M-memory-element register and n-output compactor, the observation-window size (sometimes referred to as its "depth") is given by d=⌈M/n⌉. Thus, for the embodiments of the compactor having no feedback, any X state injected into the compactor is clocked out in at most d cycles. Consequently, one feature of the exemplary feedback-free compactor embodiments using k/M polynomials is that a single error from one scan cell can be detected on the compactor outputs in the presence of a single X state produced by another scan cell.

If there are no X values in the test responses, an error injected from a scan-chain output has k alternative ways to be observed on the compactor outputs, assuming that k/M polynomials are employed. Because of the basic properties of these polynomials, which were discussed above, a single X state injected into the compactor either in the same scan-out cycle, or in a cycle within the relevant observation window for the injected error, will not be able to mask entirely the error syndrome. However, if multiple X states are injected, there exists a possibility that the error propagation paths to the compactor outputs will be blocked. As a result, the error may not be observed at all. Assuming that a certain number of scan cells produce X states, a quantitative measure of the X-states ability to mask error syndromes is termed the "observability" of the scan cells. This measure can be defined as the fraction of scan cells producing errors that can reach the compactor outputs. This quantity depends both on the frequency of occurrence of the X states and on the compaction ratio.

Figure 21:
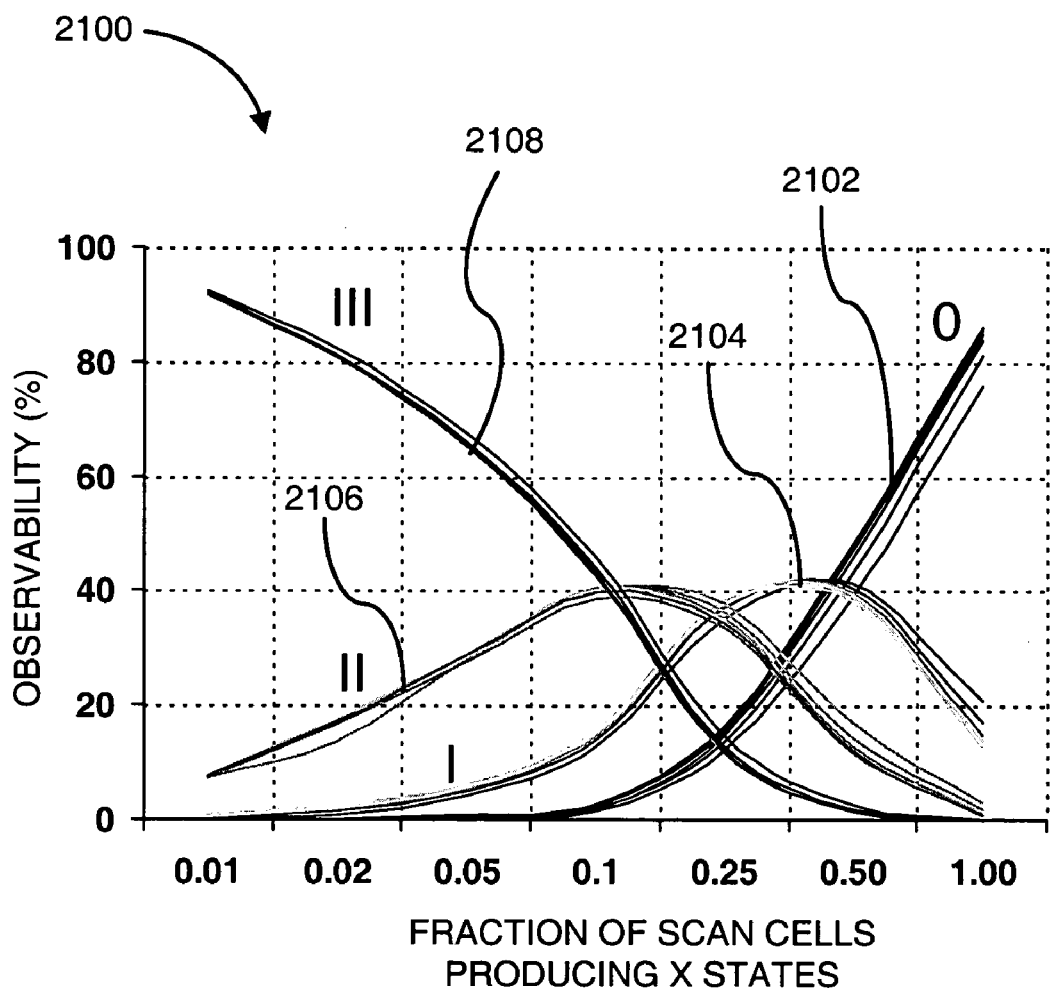
FIG. 21 is a graph showing the observability of scan cells as a function of the fraction of scan cells producing unknown states for various exemplary compactors.

FIG. 21 shows a graph 2100 illustrating the impact of X states on the observability of scan cells for six exemplary feedback-free compactors having 1, 2, 4, 8, 16, and 32 outputs. Each of the exemplary compactors has a 32-bit register, employs valid 3/32 polynomials, and provide 100x compaction. Further, the scan chain length of the CUT is selected as 100 scan cells per scan chain, and the percentage of scan cells producing X states varies from 0.01% to 1%. FIG. 21 shows four groups of curves: (a) the percentage of scan cells not observed 2102 (marked as "0"); (b) the percentage of scan cells observed once 2104 (marked as "I"); (c) the percentage of scan cells observed twice 2106 (marked as "II"); and (d) the percentage of scan cells observed three times 2108 (marked as "III").

As can be seen in FIG. 21, a very strong similarity exists between the curves within each group, indicating that the X-masking properties do not depend on the number of compactor outputs. As can also be seen in FIG. 21, there are several distinct regions in the chart. For example, as the number of cells producing X states increases from 0.01% to 0.1%, the number of scan cells that cannot be observed (curve 2102) increases from 0.01% to 2%. At the same time, there is a reduction in the curve 2108 of the percentage of scan cells that are observed three times from 92% to about 42-45%, and an increase in the curve 2106 of scan cells that are observed twice (up to 40%) and in the curve 2104 of scan cells that are observed once (up to around 15%). In the range between 0.1% and 0.25% of cells producing X states, the amount of cells observable twice (curve 2106) dominates. In the range between 0.25% and 0.5% most scan cell are observed only once (curve 2104). As the number of scan cells affected by X states keeps increasing, more than 50% of scan cells are not observed anymore.

Figure 22:
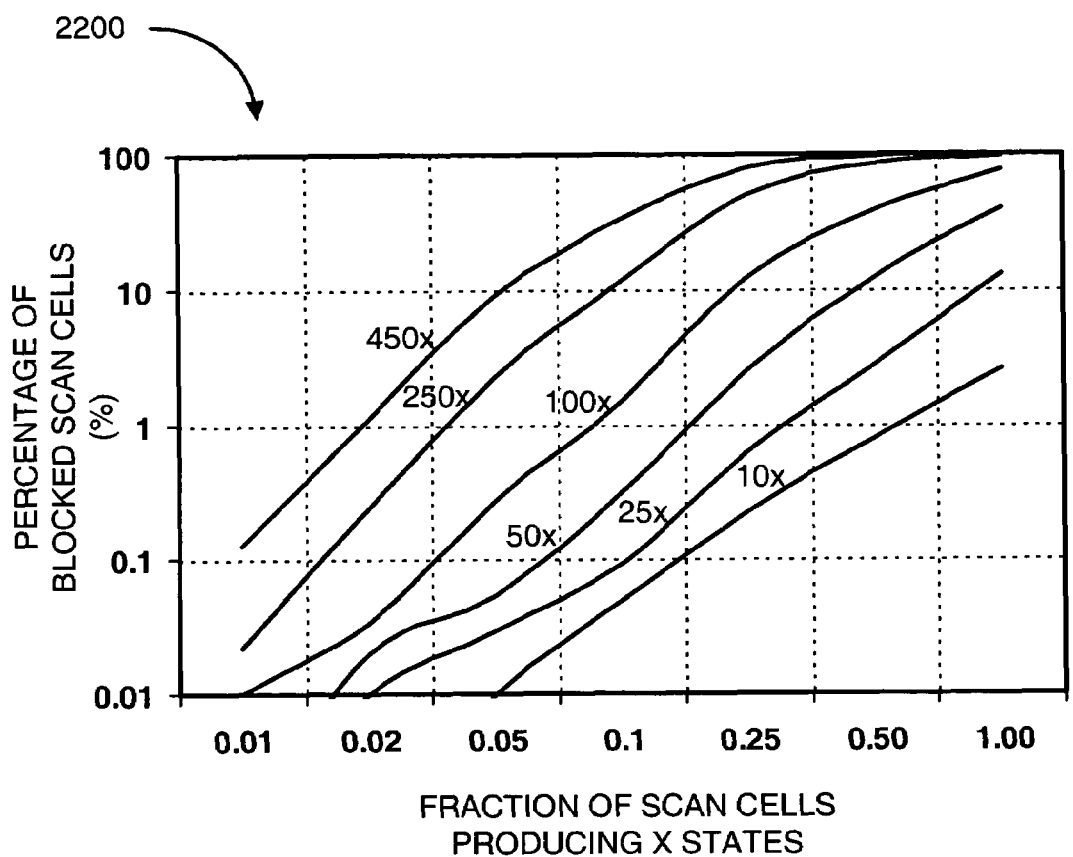
FIG. 22 is a graph showing blocked scan cells due to unknown states at different levels of compaction for various exemplary compactors.

The compaction ratio determines the number of scan chains observable on each compactor output. The compaction ratio also determines in part how X states impact observability of the scan cells. FIG. 22 is a graph 2200 illustrating the percentage of blocked scan cells for an exemplary single-output compactor having a 32-bit register, employing valid 3/32 polynomials, and providing compaction ratios ranging from 10× (the lowest curve in FIG. 22) through 25×, 50×, 100×, 250×, and 450× (the highest curve in FIG. 22). As in FIG. 21, the number of scan cells producing X states varies between 0.01% and 1%. The obtained results indicate that if the compaction ratio increases, then the number of cells affected by X states should decrease in the same proportion to maintain the scan cell observability at approximately the same level.

Similar experiments were also used to compare the observability of scan cells in the X-compact scheme with the observability of scan cells in exemplary embodiments of the disclosed compactor. In particular, an X-compactor having a fan-out of seven (indicated in Table 7 as "$X_7$") was compared with embodiments of the disclosed compactor using valid 7/32 polynomials (indicated in Table 7 as "$C_7$") and valid 3/32 polynomials (indicated in Table 7 as "$C_3$"). Each of the compactors had 16 outputs and were used to compact test responses from 1600 scan chains.

TABLE 7

Unobservable Scan Cells (%) for an Exemplary X-Compactor and Two Exemplary Embodiments of the Disclosed Compactor Percentage of Scan Cells Producing X states

|   | 0.01 | 0.02 | 0.05 | 0.1 | 0.25 | 0.50 | 1.00 |
|---|------|------|------|------|------|------|------|
| $X_7$ | 0.061 | 0.407 | 1.829 | 8.093 | 42.27 | 84.27 | 99.41 |
| $C_7$ | 0.012 | 0.036 | 0.355 | 2.941 | 32.10 | 81.28 | 99.20 |
| $C_3$ | 0.022 | 0.075 | 0.501 | 2.332 | 15.84 | 47.56 | 85.66 |

As can be seen in Table 7, so long as the percentage of scan cells producing X states is smaller than 0.5%, the number of scan cells that can be effectively observed is substantially greater for the embodiments of the disclosed compactor (in this example, compactors using a 32-bit register and valid 7/32 and 3/32 polynomials). Moreover, as can be seen in the last row of the table, the 3/32 compactor embodiment offers better performance than the 7/32 compactor embodiment once the fraction of scan cells with X states becomes larger than 0.1%.

Diagnostic Capabilities of Exemplary Embodiments of the Disclosed Compactor

In this section, the diagnostic capabilities of exemplary embodiments of the disclosed compactor designed with valid, k/M polynomials are analyzed. One feature of the compactors designed with valid, k/M polynomials is that any single error can be uniquely identified on the compactor outputs, provided that no X state propagates to the same outputs during the relevant observation cycle. For example, for the embodiment illustrated in FIG. 9, if an error propagates through the first scan-chain output and no X states propagate to the memory elements 1, 4, and 5, then the error can be uniquely identified as coming from scan chain 1. This is not always true, however, for multiple errors that interact in the register of the compactor. For example, a double error on inputs 2 and 6 followed in the next clock cycle by a double error on inputs 13 and 14 will produce no error syndrome (i.e., a masked error syndrome). Further, an error syndrome observed on output 910 followed by another error syndrome on output 910 in the next clock cycle may be caused either by double errors on inputs 1 and 13, or double errors on inputs 3 and 5. Thus, there exists ambiguity as to the source of the errors, and the specific scan chains that produced the errors cannot be uniquely identified.

To quantify the ability of embodiments of the disclosed compactor to diagnose failing scan cells, experiments were designed to measure diagnostic resolution for different values of error multiplicity, different register sizes, and different polynomial values. The resolution was measured by computing the percentage of errors that could be uniquely identified (i.e., the percentage of errors producing a syndrome that could not be generated by any other error). Results for 4-error patterns that were observed in embodiments of the disclosed compactor having various sizes are presented in Table 8. These results were obtained for scan chains of various sizes ranging from 16 to 48 scan cells, for polynomials where k=3 and k=5, respectively, and for an error time span equal to 0.

TABLE 8

Diagnostic Resolution of 4-Output Compactors for 4-Error Patterns

| | | The number of scan chains | | | | |
|---|---|---|---|---|---|---|
| M | k | 16 | 24 | 32 | 40 | 48 |
| 12 | 3 | 44.01 | 3.04 | 0.07 | 0.00 | 0.00 |
|    | 5 | 52.03 | 1.18 | 0.00 | 0.00 | 0.00 |
| 16 | 3 | 100.0 | 71.54 | 25.75 | 7.51 | 2.06 |
|    | 5 | 100.0 | 79.09 | 35.18 | 7.18 | 0.60 |
| 20 | 3 | 100.0 | 95.95 | 79.97 | 62.57 | 39.32 |
|    | 5 | 100.0 | 100.0 | 95.10 | 84.78 | 67.92 |
| 24 | 3 | 100.0 | 100.0 | 99.22 | 94.75 | 80.53 |
|    | 5 | 100.0 | 100.0 | 100.0 | 98.93 | 97.51 |
| 28 | 3 | 100.0 | 100.0 | 100.0 | 98.28 | 95.48 |
|    | 5 | 100.0 | 100.0 | 100.0 | 100.0 | 99.86 |
| 32 | 3 | 100.0 | 100.0 | 100.0 | 99.27 | 98.81 |
|    | 5 | 100.0 | 100.0 | 100.0 | 100.0 | 100.0 |
| 36 | 3 | 100.0 | 100.0 | 100.0 | 100.0 | 99.86 |
|    | 5 | 100.0 | 100.0 | 100.0 | 100.0 | 100.0 |
| 40 | 3 | 100.0 | 100.0 | 100.0 | 100.0 | 100.0 |
|    | 5 | 100.0 | 100.0 | 100.0 | 100.0 | 100.0 |

These results lead to several observations. First, increasing the size of the compactor register improves diagnostic resolution. Second, polynomials with a higher number of terms (e.g., five) perform better than polynomials with a smaller number of terms (e.g., 3), except for very small compactors that compact a relatively large number of scan chains. Third, diagnostic resolution decreases with the increasing number of scan chains.

Figure 23:
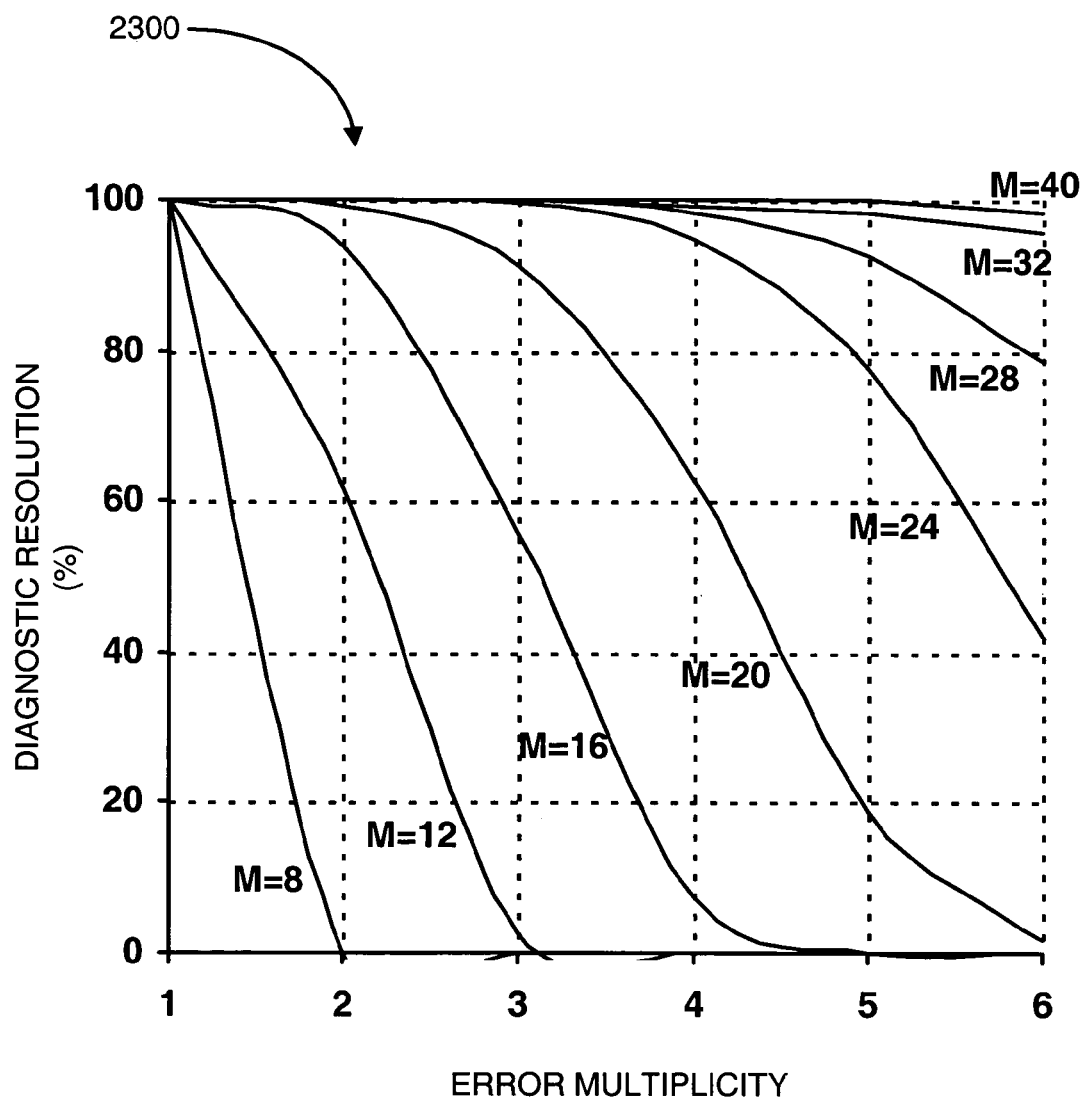
FIG. 23 is a graph showing diagnostic resolution as a function of error multiplicity for various register sizes of exemplary compactors.

Another group of experiments was conducted to examine the dependency of diagnostic resolution on the multiplicity of errors. The results of these experiments are presented in graph 2300 of FIG. 23. In these experiments, it was assumed that the embodiments of the disclosed compactor had 4 outputs, were driven by 40 scan chains, employed valid polynomials having three terms (i.e., a fan-out of three), and had an error time span equal to 0. In FIG. 23, each curve represents a compactor embodiment having a register size of M ranging from 8 to 40. As can be seen in FIG. 23, the diagnostic resolution is higher for errors of smaller multiplicity. The results also confirm the earlier observation that increased register size can improve the diagnostic resolution.

Figure 24:
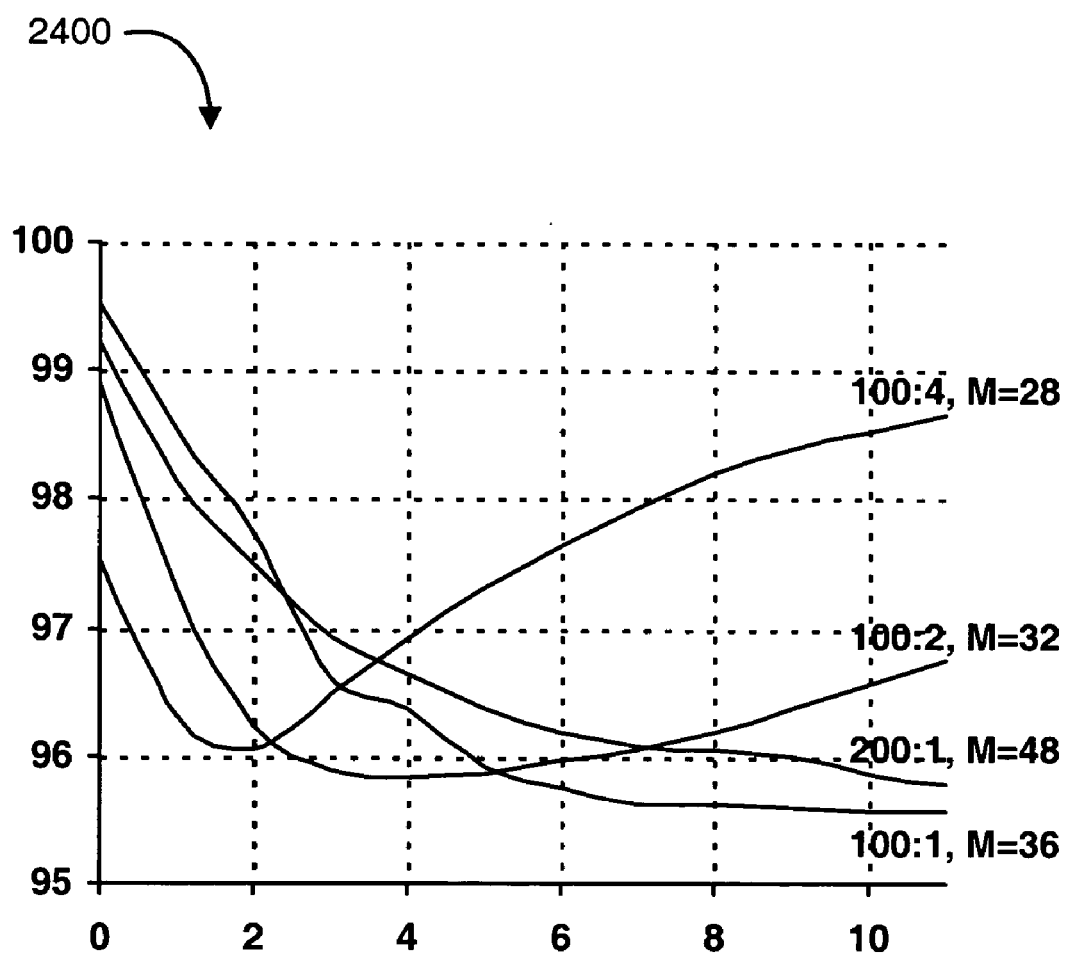
FIG. 24 is a graph showing diagnosis resolution as a function of time span for various exemplary compactors.

Another group of experiments was aimed at evaluating the possible impact the compaction ratio has on the diagnostic resolution. The results presented in graph 2400 of FIG. 24 were obtained for 2-error patterns, several embodiments of the disclosed compactor with a fan-out of three, and an error time span ranging from 0 to 11. In FIG. 24, each curve corresponds to a particular compaction ratio, which is indicated as the number of scan chains to the number of outputs (e.g., 100:4) and a register size M (e.g., M=28). Several observations can be made about the results displayed in graph 2400. First, diagnostic resolution decreases as compaction ratios increase. This effect, however, can be compensated for by increasing the size of the register. For instance, as seen in FIG. 24, the compactor embodiment having a 48-bit register and a compaction ratio of 200:1 has better diagnostic resolution than the compactor embodiment having a 36-bit register and a compaction ratio of 100:1. Third, diagnostic resolution initially decreases, but then increases with the increasing error time span. Fourth, even in cases of ambiguity, failing scan cells can be determined with fair precision. For instance, FIG. 23 indicates that for a 100× compaction ratio and an error time span of 10, up to 95.57% of error patterns produce unique syndromes using a 36-bit compactor. As for the remaining errors, the same syndrome is shared by two errors in 1.98% of cases. The same syndrome is generated three times by 0.14% of all error patterns. Only 0.009% of errors will have syndromes such that they will be the common ones for four-error patterns.

Experimental Results for Exemplary Embodiments of the Disclosed Compactor

The performance of several embodiments of the disclosed compactor was further verified on three industrial designs. The characteristics of the tested designs (including, for example, the number of gates, scan chains, and scan cells) are given in Table 9, which summarizes the corresponding experimental results. A column labeled as "X" provides the percentage of unknown states occurring in the test responses. These numbers were obtained by simulating complete test sets and evaluating the responses. A commercial automatic test pattern generation ("ATPG") tool was used to generate the test sets used in the experiments. The primary objective of the experimental analysis was to compare the performance of two embodiments of the disclosed compactor with a compactor designed according to the X-compact scheme. In the experiments, three different compactors were employed for each industrial design. The first compactor was based on the X-compact technique. The next two compactors were embodiments of the disclosed compactor (labeled "C1" and "C2," respectively, in Table 9).

For each compactor, the number of outputs as well as the resulting compaction ratio are given in the designated columns of Table 9. Further, compactor C1 was selected to have the same number of compactor outputs as the corresponding X-compact compactor. Compactor C2 was selected to offer a much higher compaction ratio in order to illustrate the flexibility that is possible using the disclosed compactor architecture. The column labeled "k" lists the number of polynomial terms used to establish the compactors. The column labeled "M" lists the number of memory elements used to create the registers in the compactors. (As a purely spatial scheme, the X-compact compactor does not use any memory elements). It should be noted that for the embodiments of the disclosed compactor, the number of memory elements was selected so that the total number of usable polynomials was significantly larger than the number of scan chains in the circuit designs. Thus, the probability of 4-error masking was reduced while the diagnostic resolution remained relatively high. The final three columns of Table 9 show the percentage of scan cells with known values that become unobservable due to the presence of unknown states.

When using a compactor C1 in conjunction with design D1, the resulting compaction ratio was about 10×. Given this compaction ratio and 0.79% of scan cells producing unknown states, the 10× curve from FIG. 22 allows one to anticipate that approximately 4% of scan cells will not be observed. Furthermore, given the same number of outputs (and thus the same compaction ratio), the disclosed compactor architecture can provide better observability of scan cells in the presence of unknown states than the X-compact scheme. This quality of the disclosed compactor architecture was more pronounced for design D2.

Industrial designs typically produce unknown states in clusters (i.e., a majority of unknown values are produced by a small fraction of scan chains). As shown in Table 10, the cumulative percentage of unknown states, expressed as a function of the number of scan chains they come from, levels off quickly. For the examined designs, ten scan chains were sufficient to capture the significant majority of unknown values.

TABLE 9

Experimental Results for Three Industrial Circuit Designs

| Design | Gates | DFFs | Scans | X | Compaction Scheme | # Out | Ratio | k | M | % Block Original | Scan Masking | Partial |
|---|---|---|---|---|---|---|---|---|---|---|---|---|
| D1 | 1.6M | 45K | 96 | 0.79% | X-Compact | 9 | 10.7 | 5 | 0 | 5.32 | — | — |
|  |  |  |  |  | C1 | 9 | 10.7 | 3 | 36 | 3.79 | 2.29 (1) | 0.76 (4) |
|  |  |  |  |  | C2 | 4 | 24 | 3 | 36 | 16.96 | 4.32 (2) | 4.88 (4) |
| D2 | 2.5M | 57K | 474 | 0.39% | X-Compact | 12 | 39.5 | 7 | 0 | 21.91 | — | — |
|  |  |  |  |  | C1 | 12 | 39.5 | 3 | 36 | 4.96 | 1.06 (5) | 0.66 (10) |
|  |  |  |  |  | C2 | 4 | 118.5 | 3 | 32 | 37.28 | 1.76 (9) | 7.08 (10) |
| D3 | 2.7M | 138K | 457 | 0.09% | X-Compact | 11 | 41.5 | 5 | 0 | 2.07 | — | — |
|  |  |  |  |  | C1 | 11 | 41.5 | 3 | 33 | 0.97 | 0.97 (0) | 0.61 (9) |
|  |  |  |  |  | C2 | 4 | 114.3 | 3 | 32 | 8.51 | 5.12 (6) | 3.32 (10) |

TABLE 10

Distribution of Unknown Values

| | Number of Scan Chains | | | | | |
|---|---|---|---|---|---|---|
| | 1 | 2 | 3 | 4 | 5 | 10 |
| D1 | 43.7 | 78.5 | 83.4 | 85.0 | 86.6 | 93.9 |
| D2 | 21.9 | 36.3 | 48.8 | 59.6 | 70.0 | 95.5 |
| D3 | 10.9 | 18.9 | 25.4 | 31.7 | 37.7 | 60.6 |

As more fully discussed below with respect to FIG. 15, one alternative embodiment of the disclosed compactor that can be used to block unknown values involves gating those scan chains that are prone to capturing unknown values. Since the number of scan chains that yields the majority of unknown states is small, this approach, while preventing the unknown states from being injected into the compactor, does not significantly compromise test quality. The observability of scan cells while assuming the masking of scan chains is given in the last column of Table 9 (data in brackets indicates the average number of scan chains that were masked for each pattern). As can be seen, the ability to control certain scan chains improves the resulting observability. In particular, the compactor embodiment C2 performed much better than before. For example, the original compactor embodiment C2 for D1 had 16.96% unobserved known responses, but the alternative compactor embodiment C2 had an unobservability rate of 4.32% if up to 5 scan chains were masked for each pattern. This result is even better than that of the X-compact scheme for D1, even when the compaction ratio of the X-compact scheme was much lower. For D2 and D3, the alternative compactor embodiments achieved over 100× compaction with good observability. It is worth noting that even for D2, whose responses have a few unknown values, scan-chain masking can reduce the number of unobserved scan cells to a very low level.

In the embedded test environment, the address registers are loaded by the on-chip decompressor. As an example, consider compactor embodiment C2 for D3. Since this design has 457 scan chains, 9 bits are needed to address each chain. There is also a flag associated with each register, and therefore the test data required for each pattern amounts to 10×6=60 bits. As for design D3, the average number of specified bits for each pattern is 360, and thus the resulting compaction ratio is approximately 138K/360≈383×. Taking into account the data required to control the compaction process, the actual compression ratio drops to the acceptable level of 138K/(360+60)≈327×. The same analysis can be conducted for designs D1 and D2. The average number of specified bits per pattern for D1 and D2 is 1500 and 940, respectively, and hence the compaction ratio for D1 remains virtually the same, while the compaction ratio for D2 changes from 60 to 55.

Exemplary Modifications and Alternative Arrangements of the Disclosed Compactor

Figure 12:
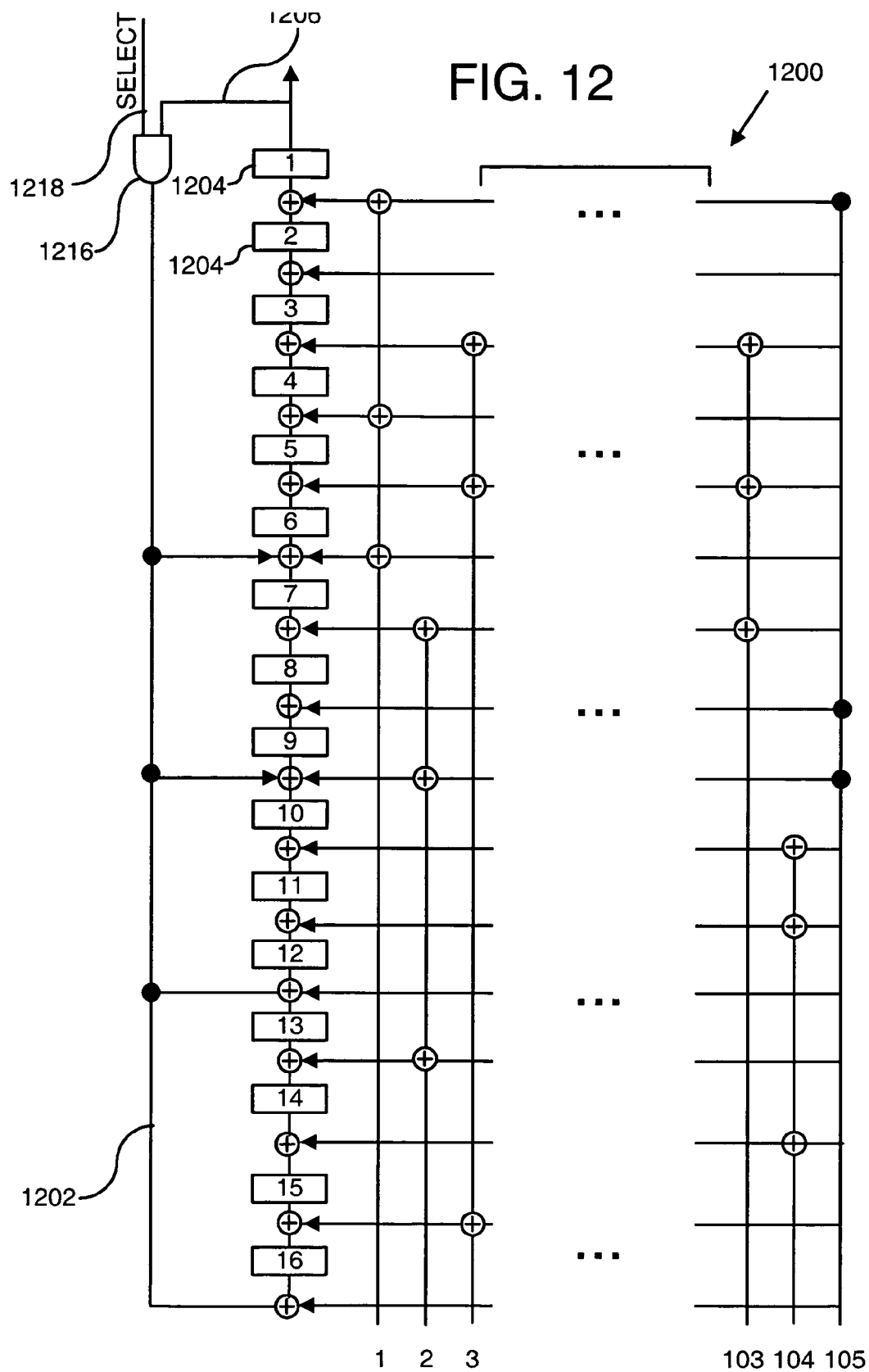
FIG. 12 shows a compactor embodiment that includes a feedback loop.

The disclosed embodiments of the compactor can be modified in a variety of different manners without departing from the principles on which the disclosed technology rely. For example, the error propagation and diagnostic properties of certain embodiments of the disclosed compactor make the compactor architecture a good basis on which to build a MISR. FIG. 12 shows an exemplary embodiment 1200 of the disclosed compactor modified into a new type of MISR. In particular, the compactor 1200 comprises a feedback loop 1202 that is selectively coupled to memory elements 1204 of the register (marked "1" through "16" in the exemplary embodiment shown in FIG. 12). Feedback corresponding to a predetermined polynomial (in the illustrated embodiment, $h(x)=x^{16}+x^{12}+x^9+x^6+1$) is enabled by control logic 1216, which in the illustrated embodiment comprises an AND gate coupled to a control path 1218 and to the output 1206 of the register. When the control path 1218 is activated, the feedback loop 1202 is enabled, causing the compactor 1200 to operate in a MISR mode. When the control line is inactivated, the compactor 1200 runs in a compaction mode. In the MISR mode, the compactor 1200 performs a signature computation function. The hybrid compactor/MISR 1200 provides several benefits. For example, compaction cancellation that occurs when even numbers of errors are injected during the same cycle is eliminated for two errors and drastically reduced for errors of higher multiplicity.

The output of the compactor 1200 can be observed in the MISR mode and provide enhanced diagnostic capabilities not available with conventional MISRs. The diagnosis process using the hybrid compactor/MISR can involve a single test session in which all patterns are applied and all responses observed on the single MISR output are logged, thus creating an error polynomial. This error polynomial contains the effects of errors injected from the scan chains and the superposed effects of the feedback polynomial. The effects of the feedback polynomial can be easily removed by multiplying the output error polynomial by the feedback polynomial. For example, in the illustrated embodiment, the feedback polynomial is:

$$E'(t)=E(t+16)+E(t+12)+E(t+9)+E(t+6)+E(t) \qquad (3)$$

Operation in the compaction mode can provide some additional advantages in diagnosis during manufacturing testing. For example, in this mode, a feedback loop is desirably open and the tester has to log a much smaller number of failing cycles. The errors recorded by the tester correspond directly to E'(t).

Figure 13:
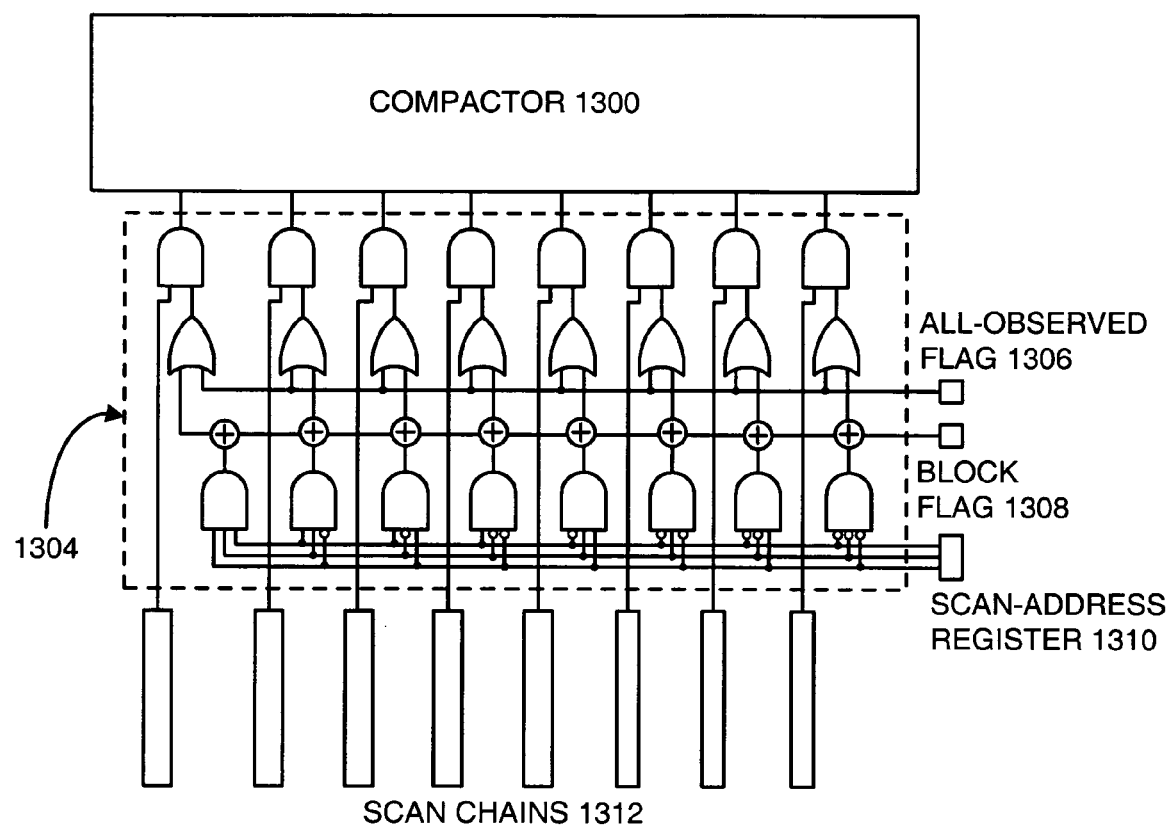
FIG. 13 shows a compactor embodiment having one form of an exemplary selection circuit for selectively blocking a portion of the scan-chain outputs.

Another embodiment of the disclosed compactor is shown in FIG. 13. This embodiment desirably allows either the complete blocking of a selected scan chain or the complete blocking of all but the selected scan chain. This embodiment can be further modified, such as explained below, to block a set of plural selected scan chains if desired. A switching network 1304 is coupled between the scan chains 1312 and the illustrated compactor 1300. Even though the illustrated embodiment has eight scan chains, any number of scan chains can be connected to the compactor 1300. The switching network 1304 comprises logic gates that are responsive to the different inputs: input 1306 (the "all-observed flag" in the exemplary embodiment), input 1308 (the "block flag" in the exemplary embodiment), and input 1310 (the "scan-address register" in the exemplary embodiment). In the illustrated embodiment, when the all-observed flag 1306 is enabled, all of the test values from the scan chains 1312 are sent to the compactor 1300, regardless of the values in the scan-address register 1310 and the block flag 1308. If the all-observed flag 1306 flag is disabled, two modes are possible: block all but one scan chain, or block one scan chain only. In one embodiment, the scan-address register 1310, which contains sufficient bits to uniquely identify each scan chain 1312, holds the address of one scan chain. If the block flag 1308 is enabled, then only the one scan chain selected by the scan-address register 1310 is blocked and its value is not passed to the compactor 1300. If, however, the block flag 1308 is disabled, then only the test value(s) stored in the scan chain whose address is stored in the scan-address register 1310 is allowed to pass to the compactor 1300.

Figure 14:
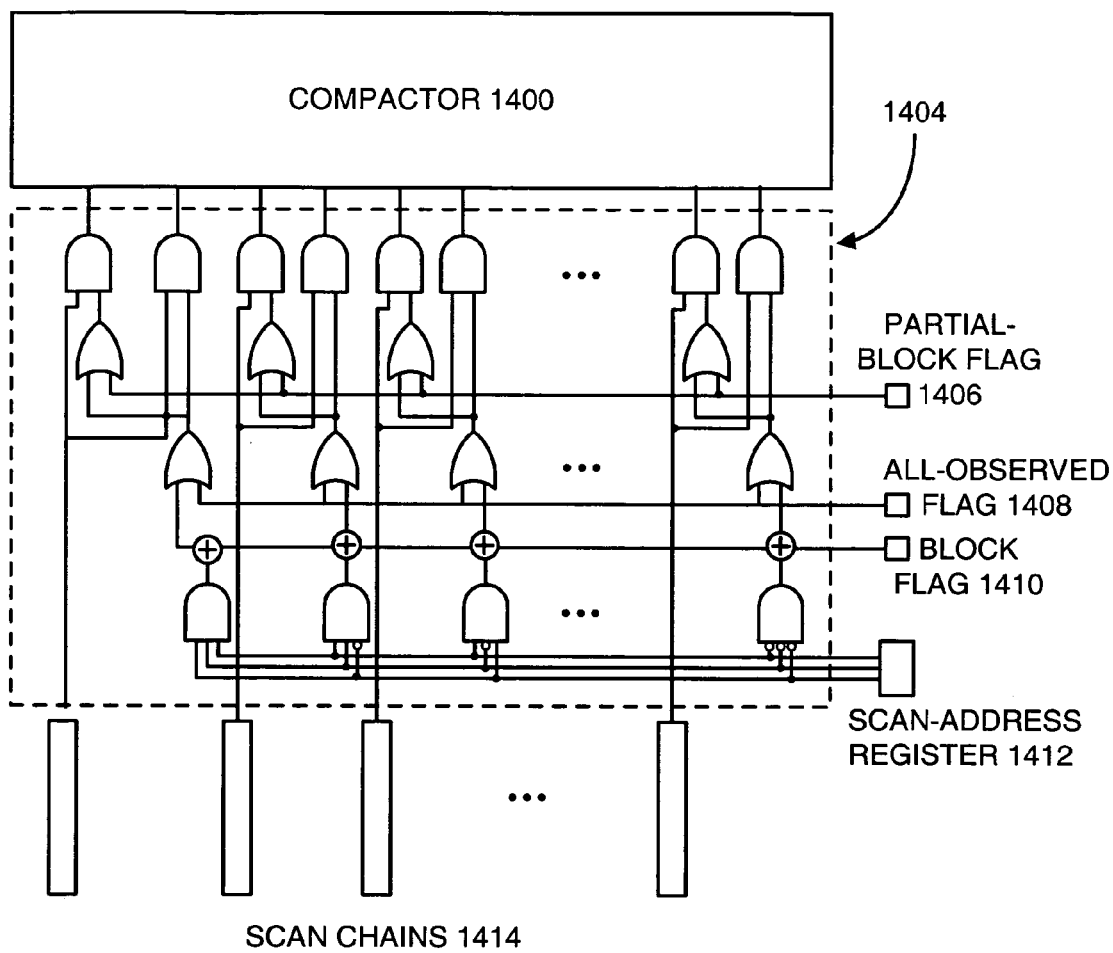
FIG. 14 shows another a compactor embodiment having an alternative form of a selection circuit for selectively blocking a portion of the scan-chain outputs.

FIG. 14 shows another embodiment 1400 of the disclosed compactor that allows partial blocking of selected scan chains. In some cases, it is beneficial to block the scan-chain outputs partially rather than completely. For example, the number of X states injected into the compactor can be reduced while maintaining some observability of scan cells having known values in the partially blocked scan chain(s). Table 9 shows that in cases where the percentage of scan cells originally not observed is relatively low (such as for compactor embodiment C1 in designs D1 and D2, and compactor embodiments C1 and C2 in design D3), the partial-blocking scheme such as shown in FIG. 14 gives a lower percentage of blocked scan cells than that of a compactor embodiment with complete blocking of selected scan chains. Similar to the scheme pictured in FIG. 13, control logic 1404, working in conjunction with a partial-block flag 1406, an all-observed flag 1408, a block flag 1410, and a scan-address register 1412, variably controls which scan-chain outputs 1414 are blocked, partially blocked, or passed through to the compactor 1400.

As noted earlier, the performance of certain embodiments of the disclosed compactor can be optionally enhanced by gating those scan chains that are prone to capturing unknown values. Since the number of scan chains that yields the majority of unknown states is small, this approach, while preventing the unknown states from being injected into the compactor, does not significantly compromise test quality.

Figure 15:
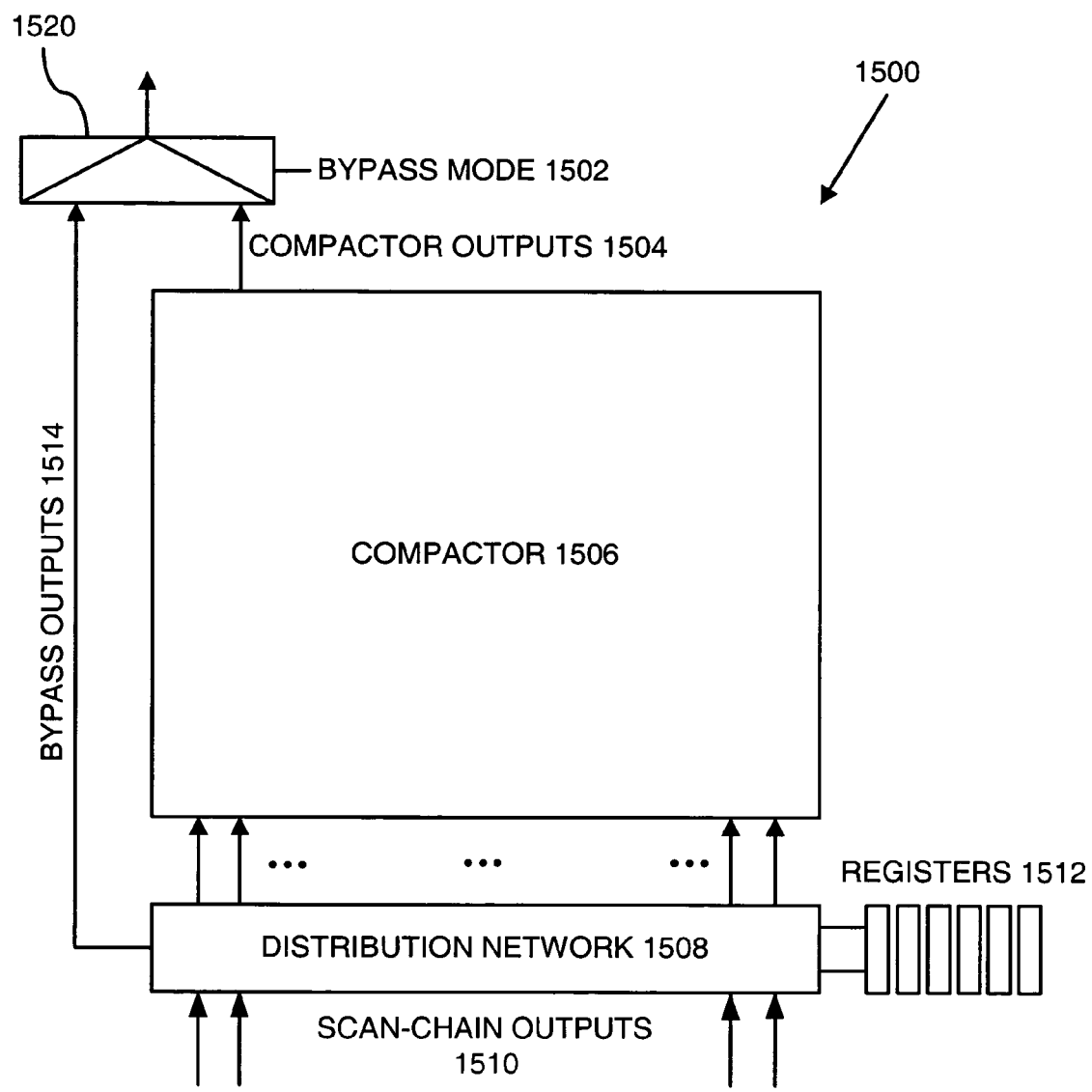
FIG. 15 shows a compactor embodiment that includes an exemplary bypass mode.

Another exemplary embodiment 1500 in which a compactor 1506 is gated is illustrated in FIG. 15. A multiplexer 1520 controlled by a bypass-mode enable signal 1502 is added such that all scan-chain outputs 1510 can be observed when the signal 1502 is enabled. This embodiment can also comprise R scan-address registers 1512, where, in certain embodiments, R is a small integer determined by the number of scan chains. In some experiments, the value R=5 has been found to work desirably well when there are no more than 100 scan chains in the design. One extra register can then be added, for example, for each additional 100 scan chains. A distribution network 1508 can then be used to mask the scan chains whose addresses are stored in the registers 1512 in a compaction mode, and to select the scan-chain outputs to be output through the bypass outputs 1514 in a bypass mode. A signal bit can be associated with each register 1512 to indicate whether the address in the corresponding register is valid for the current pattern. In operation, for example, up to R addresses in this embodiment can be scanned into the registers for each test pattern and can be used to mask the respective scan chains. As a result, a smaller fraction of unknown values are shifted into the compactor, thus improving the overall observability of the scan cells.

Figure 16:
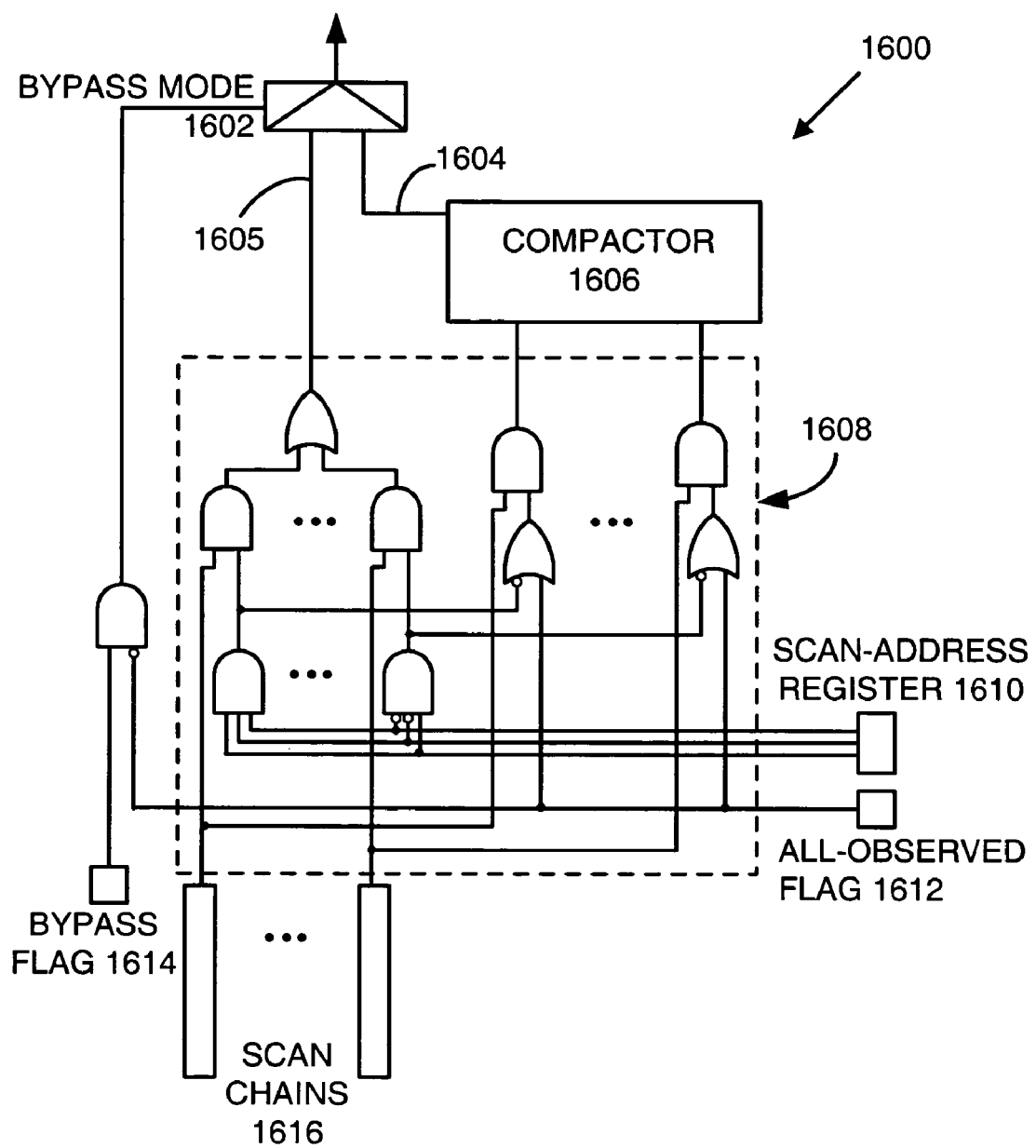
FIG. 16 shows another compactor embodiment that includes an alternative form of a bypass mode.

FIG. 16 shows yet another embodiment 1600 of the disclosed compactor. In this embodiment, the bypass mode is determined on an individual basis for one scan-chain output. The compactor 1606 is coupled with a selector circuit 1608, which can be, for example, similar to the one described with respect to FIG. 13. In the illustrated embodiment, for example, once a bypass flag 1614 enables a bypass-mode signal 1602, an all-observed flag 1612 can be disabled and a scan-address register 1610 can be used to select which scan chains are output through the bypass outputs 1605. Such a scheme can help minimize any negative impact of X states and can simplify diagnostics.

Figure 17:
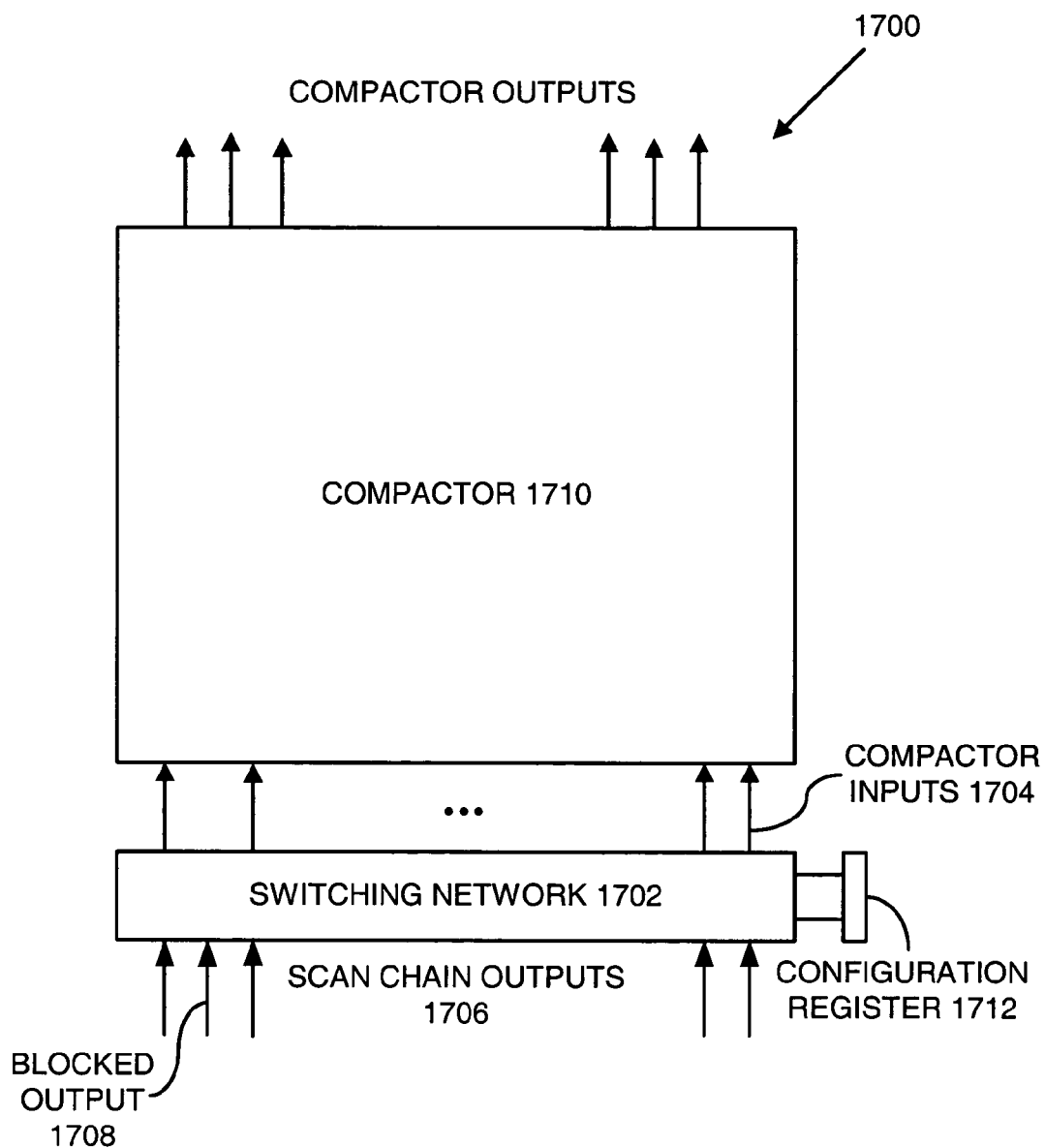
FIG. 17 shows a compactor embodiment coupled to one form of a selector network controlled by configuration register.

Another embodiment of the disclosed compactor involves programming the compactor with information from an automatic test pattern generator ("ATPG") tool originally used to determine the test patterns. FIG. 17 shows an exemplary embodiment 1700 of a compactor using an ATPG-driven approach. In the illustrated embodiment, a switching network 1702 allows different configurations of the scan-chain outputs 1706 to be sent as the compaction inputs 1704. The addresses of the selected scan chain or chains can be stored in registers 1712. For example, in FIG. 17, scan-chain output 1708 has been blocked so that its value does not enter a compactor embodiment 1710. In this embodiment, each possible configuration may block some percentage of scan cells. However, the ATPG tool can be used to help identify configurations that observe scan cells that carry fault information. For example, if there are multiple configurations available, then there should be one configuration for almost every scan cell that allows it to be observed. In this regard, Table 11 shows experimental results for three different designs and sixteen different compaction configurations. For design D3 (from Table 9 above), there were 457 scan chains observed on 2 outputs with a compaction ratio of 228×. On average, 23.74% of the scan cells were not observed for each configuration, but only 0.09% of the scan cells were not observed after all sixteen configurations were utilized.

TABLE 11

Unobservable scan cells (%) from the designs of Table 9

|    | D1    | D2    | D3    |
|----|-------|-------|-------|
| 0  | 44.20 | 49.70 | 23.74 |
| 1  | 41.82 | 21.17 | 10.81 |
| 2  | 29.62 | 10.24 | 6.06  |
| 3  | 29.01 | 4.16  | 3.50  |
| 4  | 28.80 | 1.85  | 2.26  |
| 5  | 28.49 | 1.13  | 1.54  |
| 6  | 25.79 | 0.61  | 1.11  |
| 7  | 25.73 | 0.30  | 0.86  |
| 8  | 25.65 | 0.19  | 0.63  |
| 9  | 13.48 | 0.11  | 0.41  |
| 10 | 13.39 | 0.08  | 0.29  |
| 11 | 12.29 | 0.06  | 0.24  |
| 12 | 12.25 | 0.04  | 0.19  |
| 13 | 10.13 | 0.04  | 0.13  |
| 14 | 8.93  | 0.04  | 0.11  |
| 15 | 8.91  | 0.03  | 0.09  |

The switching network 1702 shown in FIG. 17 may alternatively be configured to select or switch the scan outputs according to some predetermined pattern. For example, the switching network 1702 may comprise multiplexers configured to alternately select certain chain outputs according to a fixed pattern. The switching network 1702 may also comprise modular switches (e.g., 2×2 modular switches) that are used to selectively swap the interconnection between the scan-chain outputs and the input to the compactor 1710. Additionally, the register 1712 used to control the switching network 1702 may alternatively comprise an onboard test controller or comprise a direct coupling to an external tester, which is then used to control the selection signals for the switching network 1702.

Figure 18:
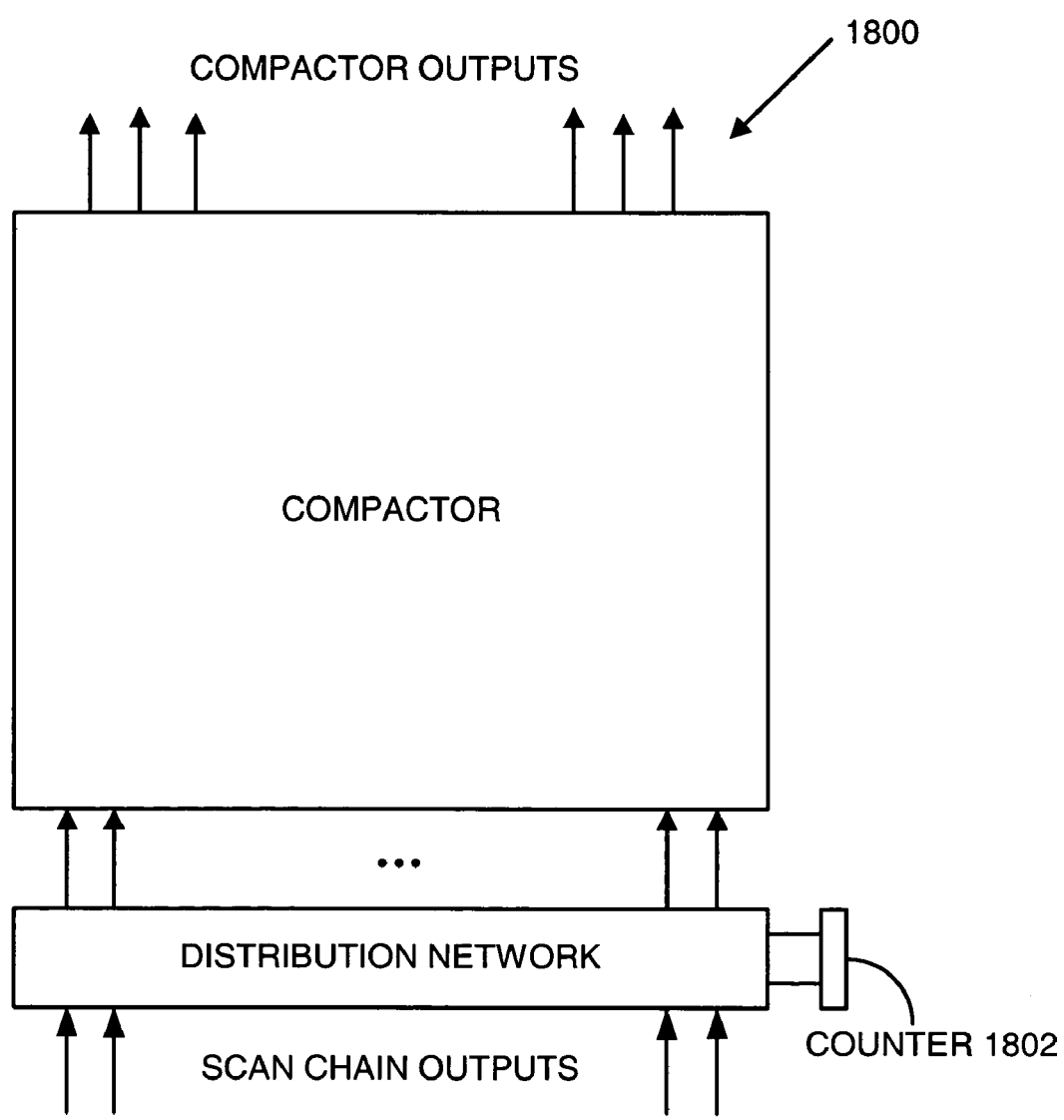
FIG. 18 shows a compactor embodiment coupled to another form of a selector network controlled by a counter.

FIG. 18 shows another embodiment 1800 of the scheme shown in FIG. 17. In this embodiment, the scan-chain configuration is modified as the scan shifting takes place. Initially, a counter 1802 can be loaded with the addresses of the scan chain or chains to be selected, similar to the configuration register 1712 in FIG. 17.

Figure 19A:
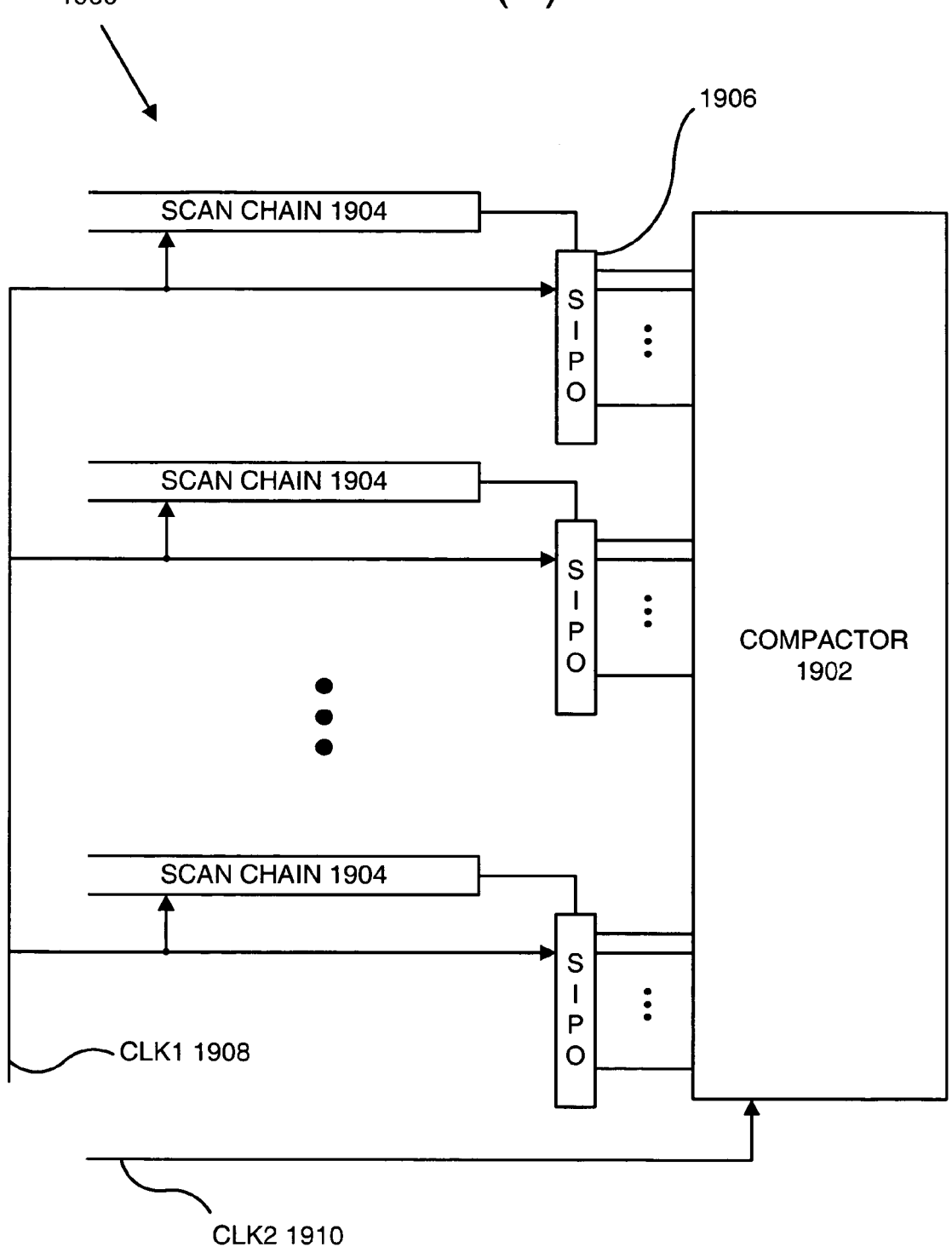
FIG. 19($a$) shows a compactor embodiment having inputs coupled to exemplary serial-input-parallel-output registers.
Figure 19B:
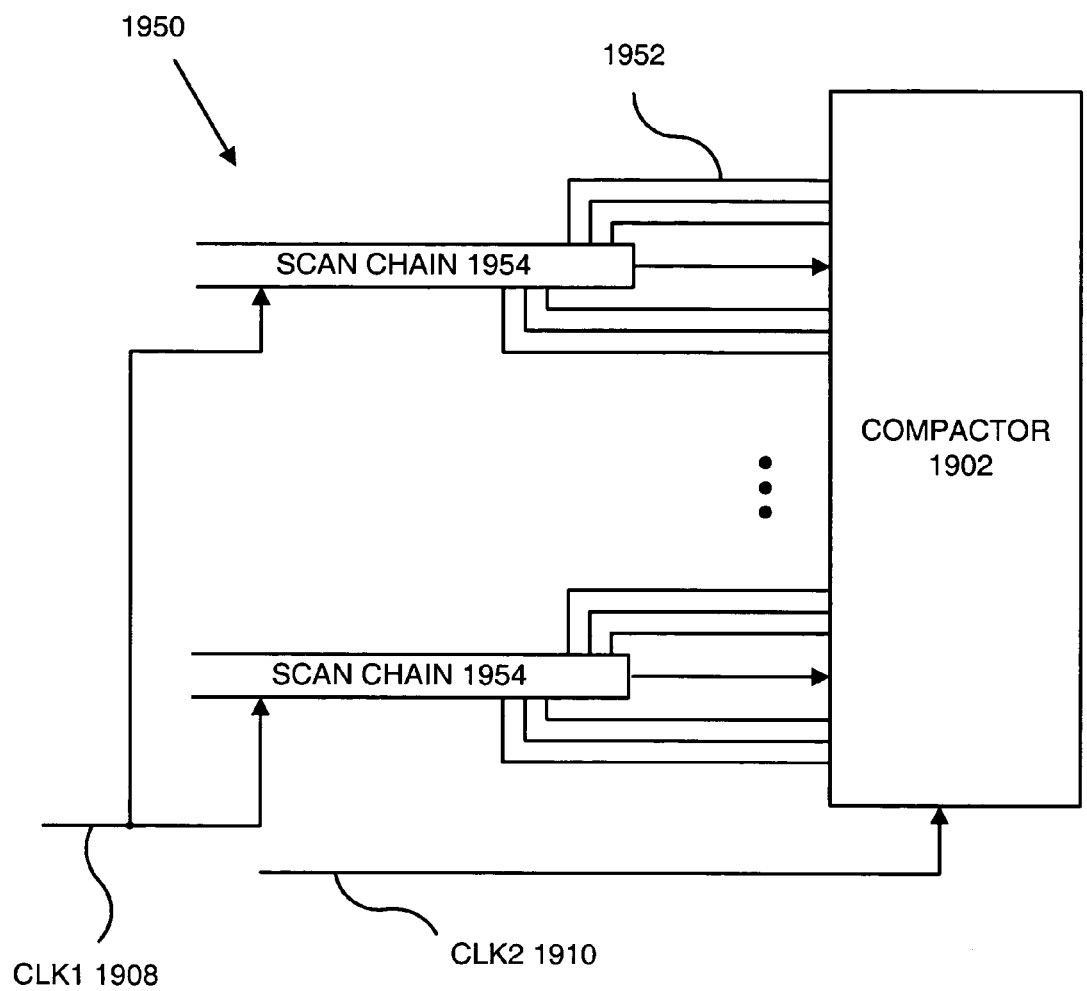

In some embodiments, internal scan chains can shift at a much higher frequency than the tester controlling the test. In such cases, it can be advantageous to operate the compactor at the speed of the tester. In an embodiment 1900 shown in FIG. 19(a), for instance, scan chains 1904 are shifted at a higher frequency by a first clock 1908 into one or more serial-input-parallel-output ("SIPO") registers 1906. After the SIPO registers 1906 are loaded, the values are loaded into compactor embodiment 1902, which is clocked by a second clock 1910. FIG. 19(b) shows another exemplary embodiment 1950, wherein scan chains 1954 hold multiple scan cells, at least some which have individual outputs 1952. The scan chains 1954 can therefore shift out multiple scan values into a compactor 1902 during the same clock cycle.

Any of these embodiments can be used to help diagnose the CUT and localize faults. For example, the test values in a single scan chain can be analyzed individually by masking all other scan chains.

Figure 20A:
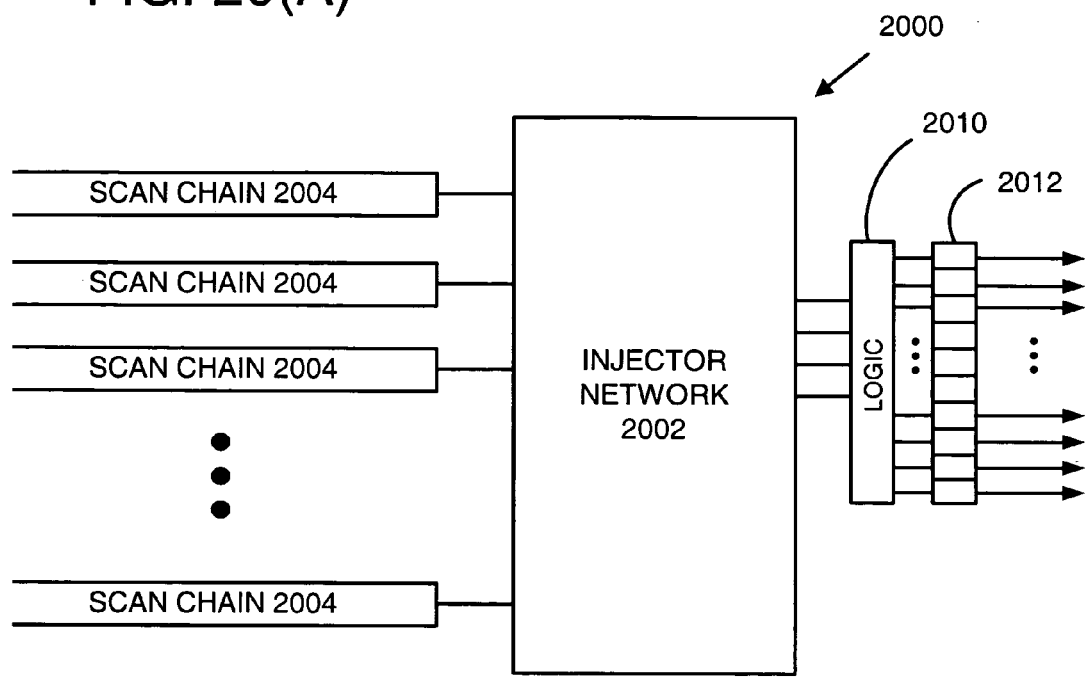
FIG. 20($a$) shows an embodiment of an injector network having outputs that are coupled to a set memory elements via output logic.

The alternative configurations discussed above can also be adapted for use on the outputs of the compactor or of the injector network of the compactor. For example, any of the switching networks or distribution networks described above can be coupled to the compactor outputs or to the outputs of the injector network. One exemplary alternative configuration 2000 is shown in FIG. 20(A). In FIG. 20(A), the outputs of the injector network 2002 are coupled to logic 2010, which can comprise any of the switching or distribution networks described above or may alternatively comprise fixed logic for distributing the outputs from the injector network (e.g., a barrel shifter). In the illustrated configuration, logic 2010 is coupled to a bank of memory elements 2012 that need not be serially connected to one another. The set of memory elements 2012 can be output serially (e.g., via a multiplexer) or in parallel to produce values, which may then be logically combined to produce output values. The configuration 2000 can be used to obtain many of the desirable characteristics of the compactor architecture described above without using serially connected memory elements. The illustrated configuration should not be construed as limiting in any way, however, as there exist a number of alternative configurations for implementing the compactor without serially connected memory elements, all of which are considered to be within the scope of the present disclosure.

Figure 20B:
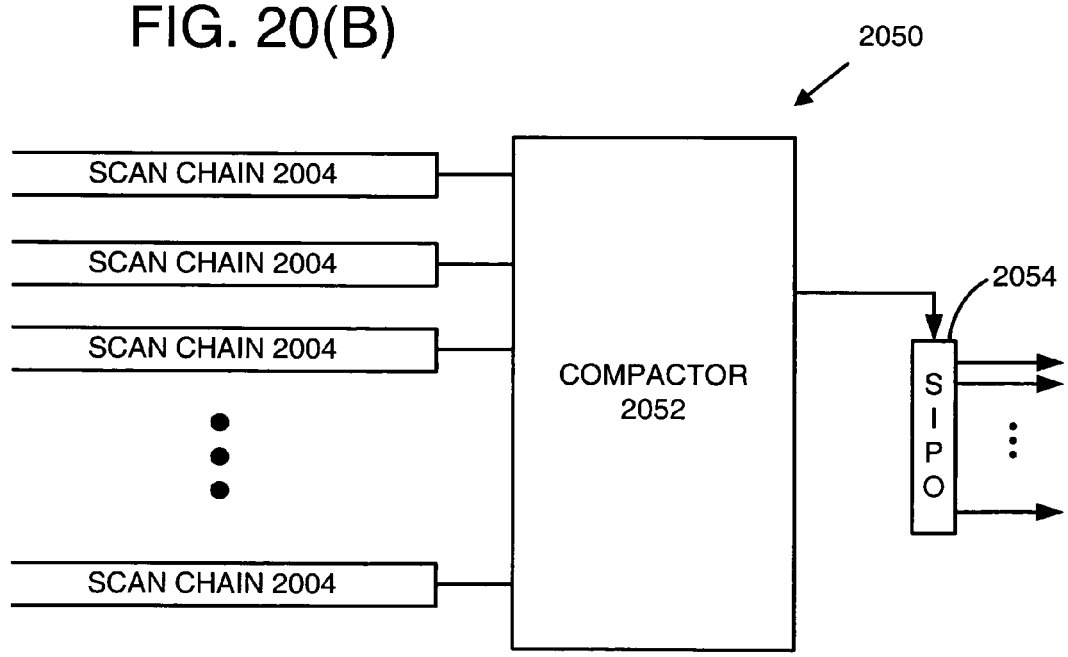

In some embodiments, the output values from the compactor are loaded into additional banks of memory elements before they are output from the circuit for fault diagnostics. For example, configuration 2050 shown in FIG. 20(B) shows a compactor embodiment 2052 coupled to one or more serial-input-parallel-output ("SIPO") registers 2054. In one particular implementation, registers 2054 are loaded at the same clock frequency that drives the compactor 2052, but output (in parallel) at a slower frequency.

Figure 20C:
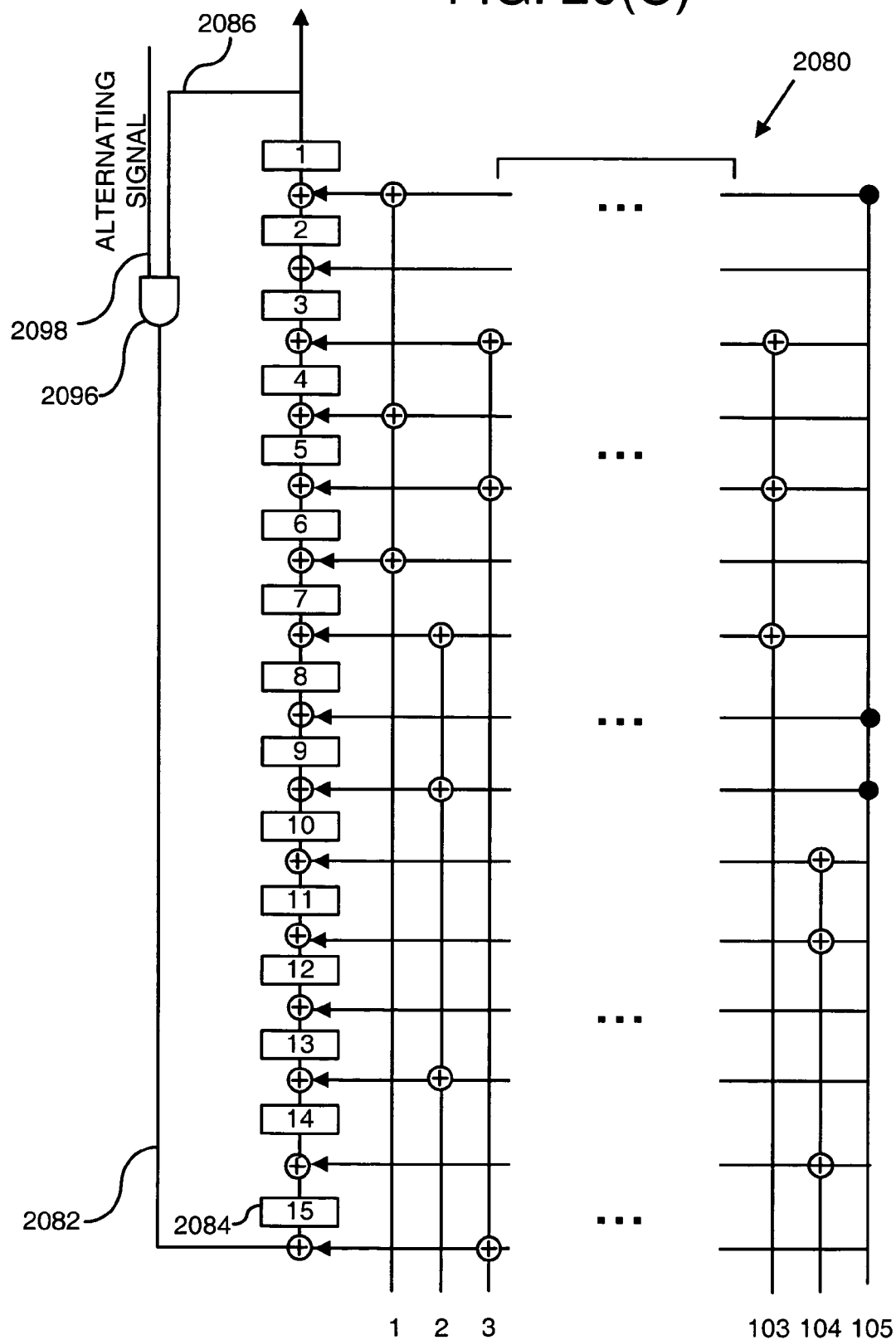

In some embodiments, the memory elements of the compactor can be coupled with logic that includes a feedback loop, but still exhibits several of the desirable characteristics of the disclosed technology. For example, a compactor embodiment 2080 shown in FIG. 20(C) comprises a feedback loop 2082, which couples the compactor output 2086 with the input of memory element 2084. The feedback loop is controlled via gate 2096 (here, an AND gate) and control signal 2098. In the illustrated embodiment, the control signal 2098 comprises an alternating signal (e.g., 0, 1, 0, 1, . . . ). Because the compactor embodiment 2080 includes an odd-number of memory elements, any value loaded into the memory elements will eventually be clocked out over some fixed observation period. The illustrated configuration for including a feedback loop in the compactor should not be construed as limiting in any way, as there exist a number of alternative configuration for including a feedback loop, all of which are considered to be within the scope of the present disclosure.

Exemplary Fault Diagnosis Embodiments

In this section, various embodiments of a method for diagnosing faults using the disclosed compactor architecture are described. The disclosed embodiments should not be construed as limiting in any way, but may be modified in arrangement and detail without departing from the principles described. In general, the exemplary embodiments concern fault diagnosis techniques that may be used, for example, with scan-based designs using embodiments of the compactor described above which utilize valid, k/M polynomials. Embodiments of the disclosed method can be used to provide accurate and time-efficient identification of failing scan cells based on the output values provided by the compactor.

As noted, the compactor architectures described above (for example, the compactor architecture illustrated in FIG. 9) can support an arbitrary compaction rate for any number of outputs, including architectures with single outputs. The compaction rate and error detection characteristics of these architectures are typically determined by the total number M of memory elements in the compactor, the size m of each register in the compactor, and the injector polynomials indicating how the scan chains are connected to the memory elements of the compactor. For purposes of this discussion, assume that a compactor having the architecture exemplified in FIG. 9 is employed and uses valid injector polynomials that can be described using the form: $x^a+y^b+z^c$. According to this form, for example, the sixth scan chain in FIG. 9 is associated with polynomial $P_6=y^1+x^2+x^1$, while the fifth chain is associated with $P_5=y^3+y^1+x^3$. Although the exemplary embodiments of the fault diagnosis method described below proceed with reference to this exemplary compactor, the principles disclosed can be adapted for application to compactors having any number of memory elements and size of fan-out.

The behavior of this exemplary compactor, which comprises a linear circuit, can be analyzed using the error test responses it receives and the error signatures it produces. For purposes of this disclosure, the error test response is defined as $E=R_{ff}+R_f$, where $R_{ff}$ and $R_f$ are fault-free and faulty test responses, respectively, and "+" denotes a bit-wise XOR operation. Similarly, the error signature is defined as $S=S_{ff}+S_f$, where $S_{ff}$ and $S_f$ are fault-free and faulty signatures, respectively. Only error test responses E and error signatures S are considered below unless otherwise stated. The j-th scan cell located in the i-th scan chain may produce a so-called "error print" having the following form: $x^{a+j}+y^{b+j}+z^{c+j}$, where $P_i=x^a+y^b+z^c$ is the injector polynomial associated with scan chain i.

Ordinarily, the same error signature can be caused by different error prints. Consider, for example, the scenario in which a signature reveals a single faulty test response. Given the exemplary compactor architecture described above, a single scan cell could not have produced such a result. Furthermore, there is no pair of scan cells that could have produced the result. However, once three different scan cells are involved, their prints can cancel each other so that the resulting signature has exactly one faulty test response. For example, if the prints have the following form:

$$E_1 = x^a + y^b + z^c \quad (4)$$
$$E_2 = x^e + y^b + z^d$$
$$E_3 = x^e + z^c + z^d,$$

then their sum equals $x^a$. The scan cells with the property shown above are referred to herein as a "triplet" of "type I."

A single faulty test response can also be produced by a triplet of "type II." For type II triplets, the error prints contain three overlapping taps that reveal a faulty test response when combined. An exemplary triplet of type II is:

$$E_1 = x^a + y^b + z^c \quad (5)$$
$$E_2 = x^a + y^b + z^d$$
$$E_3 = x^a + z^c + z^d.$$

Triplets of type I and II are the only configurations of three different scan cells that can yield a single faulty test response in an error signature. Because of their simplicity, triplets allow for the fast and systematic selection of a consistent set of scan cells that capture errors.

Given a set of injector polynomials, one can determine error prints and lists of triplets for selected bits of the corresponding signature. The lists of triplets can be determined by choosing those scan cells whose error prints match the error print patterns described above in formulas (4) and (5). In one embodiment, for example, a base list of triplets for a middle bit of each compactor register is determined (or for two such bits if the register has an even number of memory elements). Additional lists, if needed, can be obtained from the base lists by adjusting their entries, and subsequently by deleting those items that correspond to non-existent scan cells. For instance, consider a triplet of the form {(1,2), (4,2), (2,3)}, where the first component of each pair represents the scan-chain number, and the second component represents the scan-cell number (or equivalently, its time frame). Let this triplet be associated with bit $x^3$. This triplet can be used to determine a triplet for bit $x^4$ by increasing the second component in each pair, thus yielding {(1,3), (4,3), (2,4)}.

The computational complexity of this process is independent of the scan chain size because generated triplets only occur within a certain range, which can be defined by the following proposition: given the size m of the compactor registers, the time-frame range of scan cells that constitute a given list of triplets is less than or equal to 3m−3. The proof of this proposition can be shown by examining one of the compactor registers and triplets of type 1. Let $x^a$ be a signature bit for which the triplets are being found. That is, let $x^a$ be the bit that will be set for the triplet. (Note that for purposes of this discussion, a bit is set, or is indicative of an error, when it has a value of "1." This value should not be construed as limiting in any way, however, as the desired functionality and advantages of the disclosed embodiments can be accomplished using architectures that operate with different values.) From formula (4), the corresponding error prints may have the following form:

$$x^{a-m+1} + x^{a-m+2} + x^a \quad (6)$$
$$x^{a-2m+3} + x^b + x^{a-m+2}$$
$$x^{a-2m+3} + x^b + x^{a-m+1}$$

Note that all of the error prints assume the largest possible span within the register (i.e., m−1). On the other hand, the same position $x^a$ can be set to "1" by the following prints:

$$x^a + x^{a+m-2} + x^{a+m-1} \quad (7)$$
$$x^{a+m-2} + x^c + x^k$$
$$x^{a+m-1} + x^c + x^k$$

As can be seen, the number of time frames covered by the above two triplets is given by (a+m−1)−(a−2m+3)+1=3m−3, which corresponds with the proposition.

Figure 28:
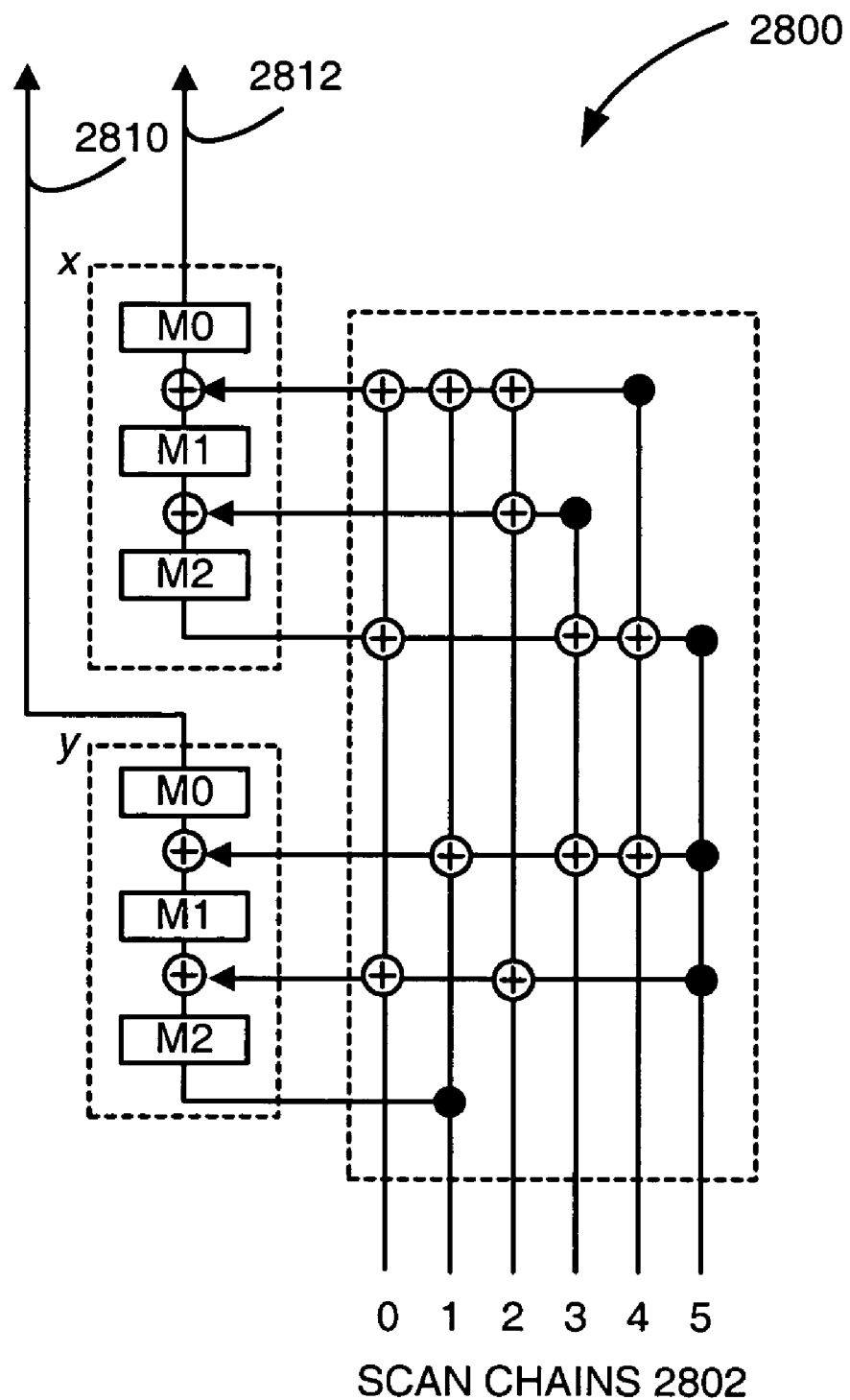
FIG. 28 shows a compactor embodiment used to illustrate features and aspects of the disclosed fault diagnosis procedure.

To further illustrate the concept of triplets, consider an exemplary compactor 2800 shown in FIG. 28, which is driven by six scan chains 2802. Assume that each scan chain 2802 consists of five flip-flops. Because the compactor 2800 has two outputs (first output 2810 and second output 2812), the resulting signature is comprised of two 7-bit sequences (3+5−1=7). The complete list of triplets associated with signature bits $x^3$, $x^5$, and $y^0$ is given in the following table:

TABLE 12

Triplets Associated with Selected Signature Bits

| Signature Bit | Triplets |
| --- | --- |
| $x^3$ | {(3,0), (5,0), (4,1)} |
| | {(0,1), (4,1), (5,1)} |
| | {(1,2), (4,2), (2,3)} |
| | {(2,2), (4,2), (5,2)} |
| | {(1,3), (3,3), (2,4)} |
| | {(2,3), (3,3), (5,3)} |
| | {(2,3), (0,4), (5,4)} |
| $x^5$ | {(3,2), (5,2), (4,3)} |
| | {(0,3), (4,3), (5,3)} |
| | {(2,4), (4,4), (5,4)} |
| $y^0$ | {(0,0), (2,0), (3,0)} |
| | {(3,0), (3,1), (4,1)} |

These triplets, as well as those associated with the remaining bits of the signature, can be obtained by using formulas (4) and (5).

For the sake of illustration, consider the first triplet {(3,0), (5,0), (4,1)}. From FIG. 28, it follows that the sum of the corresponding prints is:

$$(x^1+x^2+y^0)+(x^2+y^0+y^1)+(x^{0+1}+x^{2+1}+y^{0+1})=x^3 \quad (8)$$

Equation (8) shows that this triplet will set the signature bit $x^3$ to "1."

Given an error signature, one can arrive at a preliminary solution (e.g., a set of failing scan cells) by choosing one corresponding triplet for each "1" that appears in the signature. If the solution features scan cells that appear an even number of times, then, in one embodiment, they are deleted from the set. The remaining set of scan cells constitutes a valid collection of scan cells whose error signals yield the original signature. However, in many cases, the solution obtained may not be the simplest solution (i.e., the solution comprising the smallest number of scan cells). According to one exemplary embodiment, the solution obtained can be further simplified.

Simplifying a Solution Set Using Linear Equations

Suppose that one is given a set of n triplets which were chosen to form a preliminary list of failing scan cells. There is a unique system of linear equations for up to 3n variables representing the scan cells occurring in the triplets. According to one exemplary embodiment, each linear equation in the system corresponds to one of the bits indicated by the deployed error prints, and the equation's left-hand side is a sum of these variables (scan cells) whose error prints include that bit. The right-hand side of the equation is equal to the actual value of the corresponding bit in the error signature. In this exemplary form, variables having a value of "1" correspond to scan cells that capture an error, and variables with a value of "0" correspond to scan cells that are error-free.

Consider, for example, an exemplary type II triplet $\{c_1, c_2, c_3\}$ having the following error prints:

$$E_1 = x^a + x^b + x^c \qquad (9)$$
$$E_2 = x^a + x^b + x^d$$
$$E_3 = x^a + x^c + x^d$$

These three formulas yield the following equations:

$$c_1 + c_2 + c_3 = 1 \text{ since all three cells set bit } x^a \qquad (10)$$
$$c_1 + c_2 = 0 \text{ cells } c_1 \text{ and } c_2 \text{ reset bit } x^b$$
$$c_1 + c_3 = 0 \text{ cells } c_1 \text{ and } c_3 \text{ reset bit } x^c$$
$$c_2 + c_3 = 0 \text{ cells } c_2 \text{ and } c_3 \text{ reset bit } x^d$$

For a larger number of triplets, the resulting set of linear equations has a nontrivial solution such that all variables $c_i$ equal "1." This property follows directly from the definition of a triplet. However, one can obtain simpler solutions by applying, for example, Gauss-Jordan elimination. This exemplary method helps reveal more subtle relationships between candidate scan cells, as it reduces the total number of variables in the initial set of equations.

For example, let a signature produced by the exemplary compactor feature three consecutive "1"s on bits $x^1$, $x^2$, and $x^3$, respectively. Three triplets $\{c_1, c_2, c_3\}$, $\{c_4, c_5, c_6\}$, $\{c_7, c_8, c_9\}$ selected in this case may have the following exemplary error prints:

$$E_1 = x^1 + x^2 + x^3 \quad E_4 = x^2 + x^3 + x^4 \quad E_7 = x^3 + x^4 + x^5 \qquad (11)$$
$$E_2 = x^1 + x^2 + x^4 \quad E_5 = x^2 + x^3 + x^5 \quad E_8 = x^3 + x^4 + x^6$$
$$E_3 = x^1 + x^3 + x^4 \quad E_6 = x^2 + x^4 + x^5 \quad E_9 = x^3 + x^5 + x^6$$

Note that successive triplets consist of scan cells from consecutive time frames, as indicated by their error prints. Consequently, a linear set is comprised of six equations (representing bits $x^1$ through $x^6$ of the signature) in nine variables (scan cells from $c_1$ to $c_9$):

$$c_1 + c_2 + c_3 = 1 \qquad (12)$$
$$c_1 + c_2 + c_4 + c_5 + c_6 = 1$$
$$c_1 + c_3 + c_4 + c_5 + c_7 + c_8 + c_9 = 1$$
$$c_2 + c_3 + c_4 + c_6 + c_7 + c_8 = 0$$
$$c_5 + c_6 + c_7 + c_9 = 0$$
$$c_8 + c_9 = 0$$

which reduce to:

$$c_1 = 1 \qquad (13)$$
$$c_3 + c_7 = 0$$
$$c_2 + c_7 = 0$$
$$c_4 + c_9 = 0$$
$$c_5 + c_6 + c_7 + c_9 = 0$$
$$c_8 + c_9 = 0$$

As can be seen, the signature with "1"s on bits $x^1$, $x^2$, and $x^3$ can also be produced by errors arriving exclusively from cell $c_1$, while the remaining cells are error-free.

Now, assume that similar information is used to determine failing scan cells for another signature with only two "1"s on bits $x^1$ and $x^2$. Using triplets $\{c_1, c_2, c_3\}$ and $\{c_4, c_5, c_6\}$ yields the following equations:

$$c_1 + c_2 + c_3 = 1 \qquad (14)$$
$$c_1 + c_2 + c_4 + c_5 + c_6 = 1$$
$$c_1 + c_3 + c_4 + c_5 = 0$$
$$c_2 + c_3 + c_4 + c_6 = 0$$
$$c_5 + c_6 = 0$$

which reduce to:

$$c_1 + c_6 = 0 \qquad (15)$$
$$c_3 = 1$$
$$c_2 + c_6 = 0$$
$$c_4 = 1$$
$$c_5 + c_6 = 0$$

Cells $c_3$ and $c_4$ are identified as those that capture the erroneous signals. Indeed, adding the error prints $E_3$ and $E_4$ gives $(x^1+x^3+x^4)+(x^2+x^3+x^4)=x^1+x^2$.

Compactor Design Considerations

As shown in the previous sections, failing scan cells can be identified according to one exemplary method by selecting a list of triplets, forming a set of linear equations, and simplifying the equations (e.g., via Gauss-Jordan elimination). However, given an error signature, it is possible to arrive with different sets of triplets which, in turn, may result in different (though valid) solutions. Hence, it is ordinarily desirable for a diagnostic algorithm to find, as quickly as possible, a solution that matches the actual locations of faulty scan cells. This objective can be achieved by additionally considering the likelihood that particular scan cells can capture the actual errors, and subsequently by validating the obtained result.

In order to determine the most likely locations of failing scan cells, the triplet selection process can be guided by additional information derived from the structure of the compactor in a particular design. Details of this technique are presented in the next section. However, even if one manages to narrow the number of solutions to a reasonable number, some criterion should desirably be used to select the actual scan sites catching the errors. Typically, all candidate solutions are equivalent as far as the recorded signature is concerned. In various cases, the phenomenon of having indistinguishable solutions can be overcome by employing an additional signature. In order to arrive at a correct solution, the use of the second signature is not mandatory. It may, however, offer significant performance gains, and therefore will be used in the following as an exemplary technique.

According to one exemplary embodiment, a second signature can be produced from the same test response using a different set of injector polynomials (though, in some cases, the former polynomials may suffice, as discussed below). Given two signatures $S_1$ and $S_2$, the solutions obtained for $S_1$ can be subsequently simulated using the second set of injector polynomials to see whether it is able to produce $S_2$. If it does not, another solution is desirably determined. Monte Carlo experiments have been used to assess the probability of getting two or more different sets of scan cells that generate a given pair of signatures $S_1$ and $S_2$ originally obtained due to an error pattern of multiplicity k and two sets of injector polynomials. Results of these experiments for exemplary embodiments of 16-, 24-, and 32-bit compactors having 1, 2, and 4 outputs and being driven by fifty scan chains are shown below in Table 13.

TABLE 13

Errors Yielding Two Predetermined Signatures

| | | Error pattern multiplicity k | | | |
|---|---|---|---|---|---|
| M | O | 1 | 3 | 5 | 7 |
| 16 | 1 | 1.18 | 1.00 | 1.00 | 1.00 |
| | 2 | 1.20 | 1.00 | 1.00 | 1.00 |
| | 4 | 1.04 | 1.00 | 1.00 | 1.00 |
| 24 | 1 | 1.05 | 1.00 | 1.00 | 1.00 |
| | 2 | 1.02 | 1.00 | 1.00 | 1.00 |
| | 4 | 1.00 | 1.00 | 1.00 | 1.00 |
| 32 | 1 | 1.00 | 1.00 | 1.00 | 1.00 |
| | 2 | 1.00 | 1.00 | 1.00 | 1.00 |
| | 4 | 1.00 | 1.00 | 1.00 | 1.00 |

To obtain the results shown in Table 13, up to 500 different error patterns of multiplicity k were randomly generated, followed by the computation of the corresponding signatures $S_1$ and $S_2$. Next, 250,000 different solutions for each $S_1$ were determined. The entry in the table is the average number of solutions (out of 250,000) that could also produce signature $S_2$ in each case. As shown by Table 13, the average number was seldom greater than one, despite the large number of solutions that make up each $S_1$.

Figure 29:
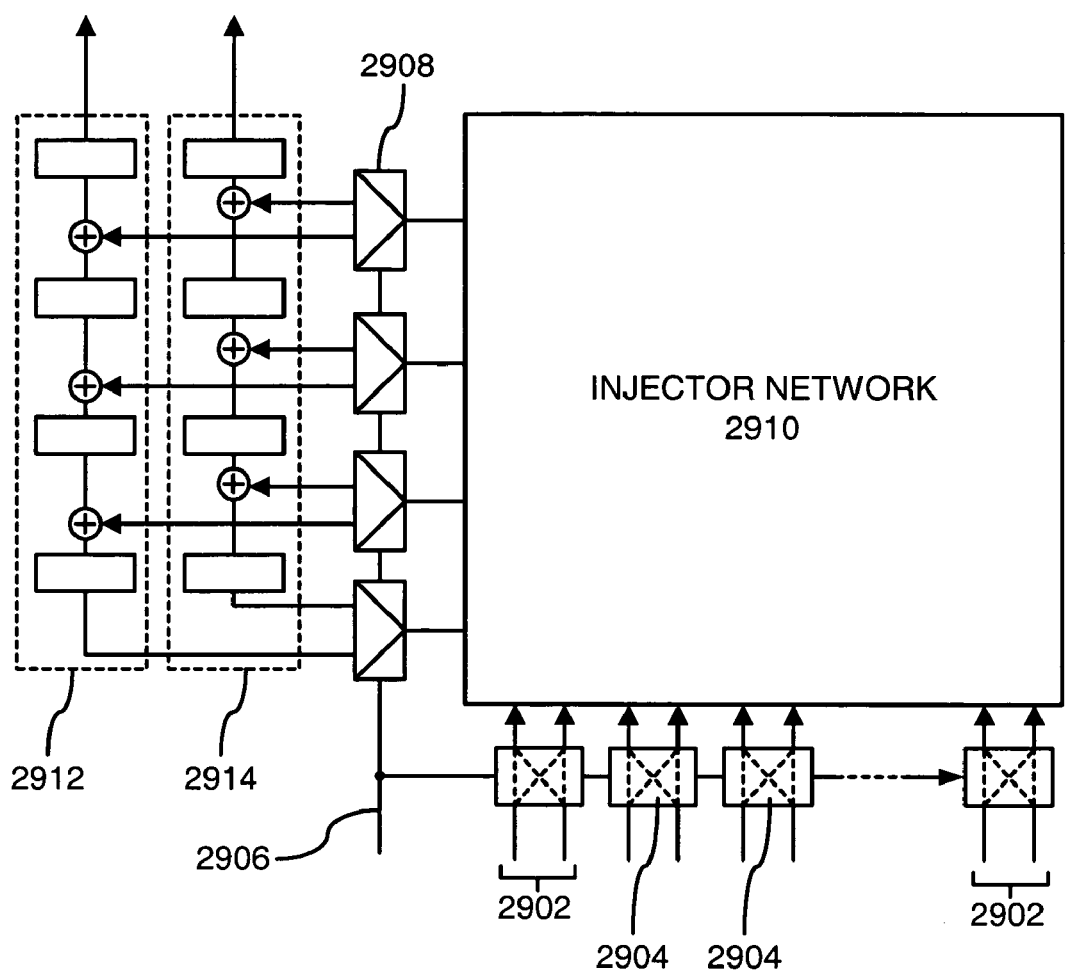
FIG. 29 shows a compactor embodiment illustrating an exemplary switching scheme as may be used during fault diagnosis.

It is possible to use another compactor having the same basic design, but with different injector polynomials, to collect two signatures during the same test experiment. Both compactors, working in parallel, could then produce two independent signatures, thus allowing for a quick verification of generated solutions. The same result can also be achieved with a single injector network, provided that the injector network's inputs are driven in a slightly modified manner and that a selection circuit (e.g., 1×2 demultiplexers) serve to connect the injector network's outputs to selected destination registers storing both signatures. An exemplary embodiment of such a configuration is shown in FIG. 29. In FIG. 29, the pairs of adjacent scan chains 2902 are connected to the polynomials of the injector network 2910 through 2×2 modular switches 2904. Each switch 2904 can be set in either a straightforward connection mode or a swap interconnection mode. A control line 2906 indicates how the scan chains are to feed the injector network at a particular time. The control line 2906 can also select the destination registers for the injector network outputs through demultiplexers 2908. By swapping outputs of the adjacent scan chains, two different and independent signatures can be produced. Furthermore, the illustrated scheme is layout and routing friendly, as it does not require any complex wiring. Utilizing the exemplary configuration illustrated in FIG. 29, the compactor has the ability to record two signatures in parallel.

According to one exemplary method of operating the illustrated compactor, once a scan-capture cycle is completed, each scan-shift cycle (e.g., each shift of captured test values through the scan chain) is divided into two consecutive sub-cycles. During a first sub-cycle, the modular switches 2904 and the demultiplexers 2908 are configured to operate in the straightforward connection mode. In the straightforward connection mode, a first set of signature bits is loaded into a first set of memory elements 2912 via a first set of injector polynomials. During the second subcycle, the modular switches 2904 and the demultiplexers 2908 are switched to operate in the swap interconnection mode. In the swap interconnection mode, a second set of signatures bits is produced from the same scan chain value via a second set of injector polynomials. In this mode, the second set of signature bits is loaded into a second set of memory elements 2914. Thus, both signature registers receive unique error patterns resulting from the same test response, each error pattern being formed by the two different mappings between the scan chains and the injector polynomials.

Exemplary Weight Functions

In order to generate only the most likely solutions, the triplet selection process in one exemplary embodiment is guided by weight functions associated with every triplet. According to this embodiment, a weight of a given triplet is proportional to the probability that its member scan cells belong to the actual error pattern. In general, the weight of a triplet $\{c_i, c_j, c_k\}$ can be given by the following formula:

$$W\{c_i, c_j, c_k\} = (B_i B_j B_k)(S_i S_j S_k)(1 + C_i + C_j + C_k) \quad (16)$$

In Equation (16), $(B_i B_j B_k)$ accounts for the number of "1"s that the triplet cells set in signatures, while the remaining two factors $((S_i S_j S_k)$ and $(1 + C_i + C_j + C_k))$ account for the presence of the same cells in other error patterns obtained for test vectors applied earlier.

The computation of coefficients $B_i$ can be performed by individual counters associated with each scan cell. For purposes of this discussion, this value is termed the weight of the scan cell. It is defined as the total number of "1"s in both signatures $S_1$ and $S_2$ that can be set by an error arriving from cell $c_i$. This information can be easily retrieved from the error prints of the cell. The value of $B_i$ can then determined by summing the weights over all scan cells having the same time frame as that of cell $c_i$.

As an example, consider again the exemplary compactor 2800 shown in FIG. 28. The exemplary compactor 2800 is driven by six scan chains, which are assumed to each have five flip-flops. Assume that the exemplary compactor further includes a plurality of 2×2 modular switches coupled to the scan-chain output pairs 0 & 1, 2 & 3, and 4 & 5 so that they can be swapped in the swap interconnection mode (or swap mode). Finally, let a failing scan cell have a location (4,1). From FIG. 28, it can be seen that the error prints for this particular cell are given by $x^1+x^3+y^1$ (the straightforward mode) and $x^3+y^1+y^2$ (the swap mode). Thus, the resulting signatures $S_1$ and $S_2$ are as follows (bits $x^0$ and $y^0$ appear on the left-hand side):

$$S_1=0101000, 0100000 \quad S_2=0001000, 0110000 \quad (17)$$

The corresponding weights for successive scan cells will have, in this case, the following values:

$$
\begin{aligned}
102101 + 110110 &= 212211 \; [9] \\
221232 + 122132 &= 343364 \; [23] \\
001100 + 102111 &= 103211 \; [8] \\
111010 + 110101 &= 221111 \; [8] \\
000000 + 000000 &= 000000 \; [0]
\end{aligned}
\quad (18)
$$

The first two columns correspond to signatures $S_1$ and $S_2$, respectively, while the third column represents the actual weights. The last column (in brackets) gives the resulting coefficients $B_i$. It is noted that the scan cells with the same time frame have the same value of $B_i$. Moreover, the weight of the failing scan cell is the largest value from equations (18) and has a value of "6."

Though not restricted to such use, the use of cumulative statistics $B_i$ rather than individual cell weights can be desirable because it has been observed that individual cell weights may misguide the triplet selection process. For example, consider again the compactor illustrated in FIG. 28 having the modular switches at the scan-chain output pairs. Assume now that the error pattern is comprised of three scan cells: (2,1), (3,2), and (4,1). These failing memory elements will produce the following signatures:

$$S_1=0010100, 0100000 \quad S_2=0001000, 0011000 \quad (19)$$

Consequently, the computation of the weights yields the following values:

$$
\begin{aligned}
201112 + 100000 &= 301112 \; [8] \\
01\underline{1}2\underline{1}1 + 12\underline{1}1\underline{2}1 &= 13\underline{2}3\underline{3}2 \; [14] \\
21\underline{1}\underline{1}21 + 11\underline{2}\underline{2}21 &= 32\underline{3}\underline{3}42 \; [17] \\
001100 + 211112 &= 212212 \; [10] \\
111010 + 000000 &= 111010 \; [4]
\end{aligned}
\quad (20)
$$

As can be seen, the weights associated with cells that capture errors are not necessarily the largest ones (signature bits corresponding to the failing cells are underlined). If used directly to indicate the most likely sites of errors, these numbers would lead to a computationally less efficient diagnostic process. Such a method will not distinguish particular scan cells as far as the same time frame is concerned. Nevertheless, priority will still be given to those cells that belong to time frames with the largest weights. In this example, for instance, the largest cumulative weights correctly identify subsets of scan cells that include the actual failing cells.

The triplet selection process can be further improved by allowing coefficients $B_i$ to carry information obtained during the signature preprocessing phase. This exemplary technique is aimed at detecting several generic scenarios in which scan cells, when injecting errors into a signature, interact with each other in the compactor register in particular ways. Therefore, if a scan cell is recognized as a likely part of the actual failing cell set, its individual weight can be increased accordingly. Analysis has shown that errors occur in signatures mostly due to at least the following origins: (a) a single scan cell produces an error print of the form $x^a+y^b+z^c$ (its individual counter is then equal to 3); (b) two scan cells yield four "1"s as their error prints assume the following forms:

$$
\begin{aligned}
E_1 &= x^a + y^b + z^c \\
E_2 &= x^a + y^d + z^e
\end{aligned}
\quad (21)
$$

(c) two scan cells output two "1"s after mutual masking of the remaining elements of their error prints:

$$
\begin{aligned}
E_1 &= x^a + y^b + z^c \\
E_2 &= x^a + y^b + z^d
\end{aligned}
\quad (22)
$$

(d) three scan cells produce five "1"s, as they interact as shown below:

$$
\begin{aligned}
E_1 &= x^a + y^b + z^c \\
E_2 &= x^a + y^d + z^e \\
E_3 &= x^f + y^b + z^g
\end{aligned}
\quad (23)
$$

(e) three scan cells yield three "1"s provided their error prints are aligned as follows:

$$
\begin{aligned}
E_1 &= x^a + y^b + z^c \\
E_2 &= x^a + y^d + z^e \\
E_3 &= x^f + y^b + z^g
\end{aligned}
\quad (24)
$$

(f) three scan cells can also leave a single "1" in a signature, as shown by Formulas (4) and (5) above; and (g) four scan cells, among various cases, can produce six "1"s by masking the entire error print of one of them; for example, by using the following pattern:

$$
\begin{aligned}
E_1 &= x^a + y^b + z^c \\
E_2 &= x^a + y^d + z^e \\
E_3 &= x^f + y^b + z^g \\
E_4 &= x^h + y^i + z^c.
\end{aligned}
\quad (25)
$$

Several scan cells can also form chain structures that correspond to burst errors (i.e., errors injected from a number of adjacent scan cells hosted by one or two scan chains).

Fault diagnosis results obtained for the previous test patterns are also considered in the weight computation. For many stimuli, faults propagate to the same scan cells or, at least, to the same scan chains. One can take advantage of this observation by preferring those triplets that contain cells located in scan chains hosting cells already declared as failing ones. The coefficients $S_i$ can be set to account for these events in the following manner: if a scan chain containing cell $c_i$ has appeared in the previous solutions more than a pre-specified number of times Q (where Q is greater than 1), then let $S_i=B_i$, otherwise let $S_i=1$. In one exemplary embodiment, the value of the threshold Q is set to be a certain fraction of all appearances of scan chains identified so far as receiving erroneous signals. For example, all of the experiments reported in this paper assume that Q=0.02A, where A is a sum of occurrences in the earlier solutions over all scan chains.

Equation (16) also takes account of individual scan cells by using the coefficient $C_i$. In principle, this component indicates the number of times a given cell was found to be a part of a solution for test patterns applied earlier. However, in order to prevent these factors from infinite growth, they may be further divided by the total number of test patterns deployed so far.

In certain embodiments, the weight information with respect to coefficients $S_i$ and $C_i$ is incrementally updated after successive solutions are obtained, resulting in a efficient diagnostic procedure. Indeed, this approach resembles a process of learning from experience, where the diagnostic algorithm modifies its processing on the basis of newly acquired data. Additional features and aspects of this technique are detailed in the next section.

An Exemplary Fault-Diagnosis Algorithm

This section combines several of the principles and features described above into a more complete fault-diagnosis algorithm. The described method is only one exemplary method for performing fault diagnosis utilizing the principles disclosed herein and should not be construed as limiting. Instead, the present disclosure encompasses all methods that utilize one or more of the principles, features, and aspects discussed above.

In the exemplary embodiment, the process of finding the failing scan cells proceeds iteratively. Starting from the simplest cases, the exemplary embodiment gradually attempts to solve more complex problems based on information gained in the previous steps.

Figure 30:
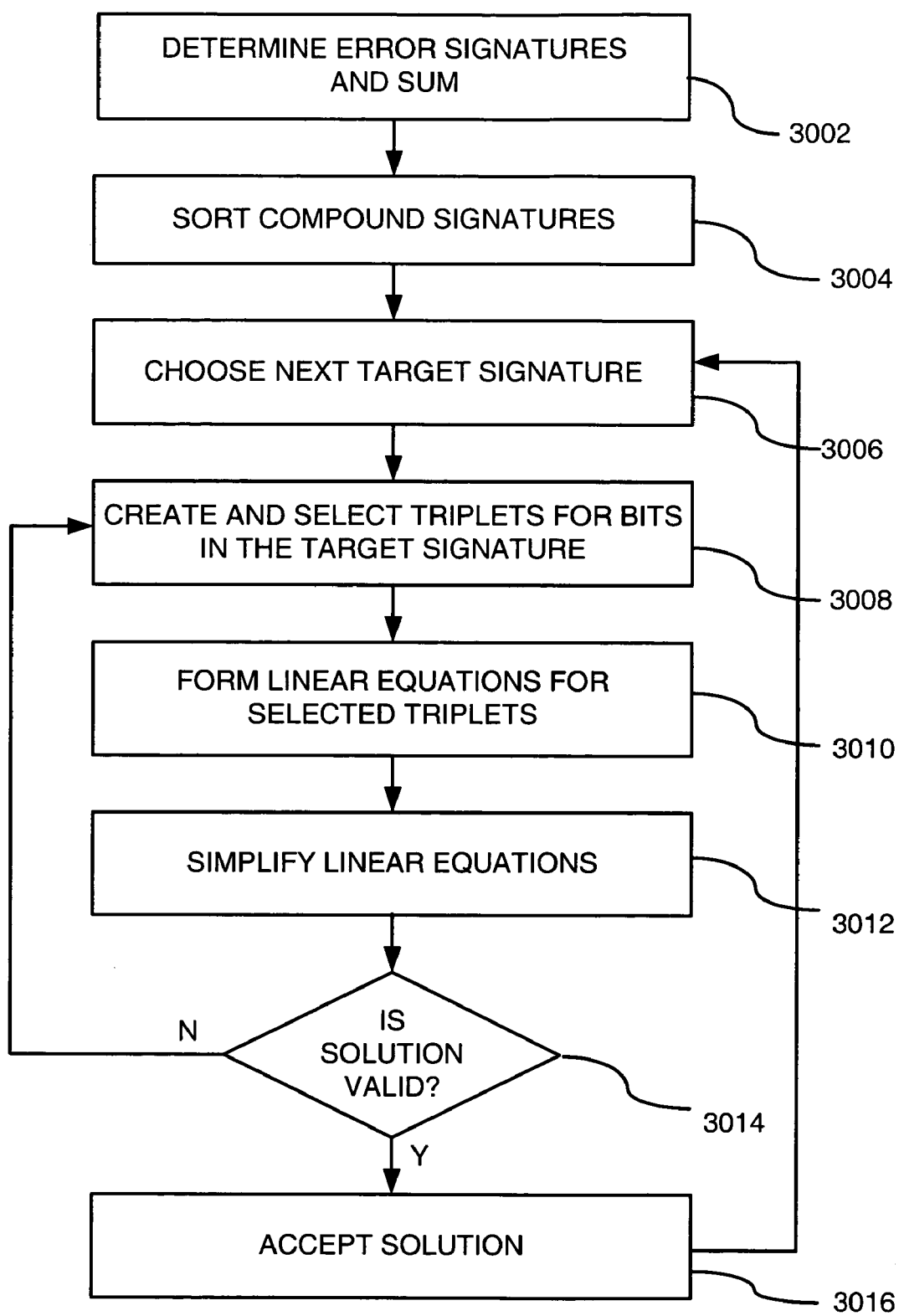
FIG. 30 is a flow chart of an exemplary method for diagnosing faults using embodiments of the disclosed compactors.

FIG. 30 is a flowchart 3000 of the exemplary embodiment for diagnosing faults. The exemplary method shown in FIG. 30 may be used, for example, in connection with the compactor architectures exemplified in FIG. 9 and FIG. 28, as well as other embodiments described herein. At process block 3002, error signatures and their sum are determined for at least one test pattern. In one particular implementation, for example, signatures $S_1$ and $S_2$ are determined for each test pattern $t_i$ and their bit-wise logic sum $LS_i$ computed. At process block 3004, the signatures are sorted. In one particular implementation, the signatures $LS_i$ are sorted in ascending order with respect to the number of "1"s they feature. These two processes (process block 3002 and process block 3004) are ordinarily performed once all signatures for a given test set are collected.

As noted, one particular implementation involves determining a composite signature $LS_i$ as a bit-wise logic sum of $S_1$ and $S_2$ for each pair of signatures $S_1$ and $S_2$. The number of "1"s occurring in $LS_i$ provides a rough estimation of error-pattern complexity, and thus an approximation of the degree of difficulty in trying to locate the failing scan cells. Indeed, various experiments indicate that in a large majority of cases, more complex error patterns imply more "1"s in the corresponding signatures. Given the self-learning behavior of the exemplary scheme, it is usually desirable to have all compound signatures put in ascending order according to the number of "1"s they feature. Therefore, diagnosis can be performed first for the cases in which an expected number of failing scan cells is relatively small. Subsequently, relying on earlier results, the exemplary scheme can try to identify components of error patterns having a larger number of failing cells.

At process block 3006, a target signature is chosen. In one particular embodiment, the original signatures for at least one composite signature $LS_i$ are retrieved and one of the signatures $S_i$ selected. This process may be performed in the order in which the signatures are sorted at process block 3004. In general, the composite signature $LS_i$ provides an accurate measure of when particular test results should be processed during the procedure. For the basic task of identifying the failing scan cells, however, using the original signature $S_i$, together with the signature $S_2$ as a reference during the validation phase (or vice versa), is desirable. Whether to use signature $S_1$ or signature $S_2$ to carry out the computations typically depends on the number of "1"s present in each signature. As discussed above, various errors injected into compactor registers may cancel each other, thus leaving a diagnostic procedure with a relatively small number of erroneous signals (compared to the multiplicity of the error pattern). Because the diagnostic reasoning is basically dependent on the "1"s present in the signature, error masking can increase the probability that a randomly selected set of triplets will not contain all scan cells that capture errors. Hence, in one embodiment, the signature having a larger number of "1"s is selected.

At process block 3008, appropriate triplets are selected for the target signature. In one particular implementation, a set of corresponding triplets are found for each "1" in the target signature $S_i$ (e.g., for successive "1"s in the selected signature $S_i$). One exemplary procedure for finding the corresponding triplets involves creating a set (or list) of candidate triplets and selecting one triplet from the set. The set of candidate triplets may comprise, for example, only the most relevant triplets (as determined, for example, by the weight functions described above). In one particular implementation, the remaining triplets in the set are saved and referenced during the creation of the other triplet sets so that any newly created sets contain only triplets that have at most one scan cell occurring in the other lists.

In one particular implementation, a triplet is randomly sampled from the set of candidate triplets created. The probability of choosing a particular triplet can be set to be proportional to its weight. For example, all weights associated with consecutive triplets can be regarded as entries of a frequency histogram, and thus can be easily transformed into a cumulative-relative-frequency histogram. Such a histogram can be obtained by adding together all weights maintained for a given position in order to yield a cumulative histogram that can then be normalized. In one implementation, the normalizing constant is the sum of all triplet weights involved. Having obtained the weight data in the form of cumulative statistics, the selection of a triplet can be carried out. For example, the inverse-transform method, such as that described by G. S. Fishman, "Discrete-Event Simulation," Springer-Verlag, New York (2001), may be used.

At process block 3010, a set of linear equations is formed based on the selected triplets and their related signature. At process block 3012, the set of linear equation is simplified. For example, in one exemplary implementation, Gauss-Jordan elimination is used. By using Gauss-Jordan elimination, this implementation tries to improve the initial solution (i.e., the list comprising all scan cells from the selected triplets) as long as successive columns can be reduced to the identity form. This approach converges so long as the initial solution consists of all scan cells that constitute the actual error test response. Even so, there is still a possibility that a desired solution will not be obtained. For example, if the number of involved scan cells is greater than the number of equations, then the presence of equivalent solutions may preclude identification of the actual set of failing cells. In order to minimize the likelihood of such an event, certain columns of the equations can be initially interchanged so as to put elements representing scan cells with the largest weights first in the diagonal position from which they will be selected. Using this technique, one can assure that a preference is given to those variables (scan cells) that will most likely be a part of the final solution based on their occurrence in the former solutions.

At process block 3014, a determination is made as to whether the resulting solution produces both signatures. If both signatures are produced, then, at process block 3016, the solution is accepted, the corresponding weight information is updated, and the process is repeated for the next signature $LS_i$. If the current solution fails to produce the second signature, then the exemplary method returns to process block 3008, which is generally equivalent to beginning the triplet selection process anew. In certain situations, it might be desirable to generate a few valid solutions and pick the final solution using an additional selection criterion. For example, the criterion may be to choose the solution having the smallest number of scan chains or the smallest number of scan cells. The time efficiency of the exemplary method depends largely on how quickly the appropriate set of triplets is found. In the experimental results section below, the average number of iterations needed to complete the successful identification of failing scan cells is given for several experiments.

The exemplary method can be modified in a number of ways without departing from the disclosed principles. For example, the method can be modified so that the average successful diagnosis time is bounded as the number of "1"s in a signature increases. This modification is possible because erroneous signals often appear as clusters in signatures. Consequently, any of the embodiments of the exemplary method can be performed individually for each cluster rather than for the whole signature. In order to identify such clusters quickly, scan cell counters can be used. If all counters associated with a given time frame (or consecutive time frames) are equal to zero, then the corresponding error-free positions in the signature can be regarded as indicative of how to divide the diagnostic process.

Experimental Results

A number of experiments were performed using an exemplary implementation of the method described above. In particular, the exemplary implementation comprised the following acts: (1) for each test pattern $t_i$, signatures $S_1$ and $S_2$ were determined and their bit-wise logic sum (OR) $LS_i$ computed; (2) the compound signatures $LS_i$ were sorted in ascending order with respect to the number of "1"s they featured; (3) following the sorted order, original signatures $S_1$ and $S_2$ were retrieved for each signature $LS_i$ and a target signature $S_j$ having the greatest number of "1"s selected; (4) for each "1" occurring in the target signature $S_j$, a set of corresponding triplets of scan cells was created and one triplet in the set randomly selected (the remaining triplets in the set were saved to avoid the handling of the same triplets again); (6) sets of linear equations were formed based on the selected triplets and the related signatures; (7) the sets of linear equations were simplified using Gauss-Jordan elimination; (8) if the resulting solution produced both signatures, then the solution was accepted, otherwise the triplet creation and selection processes were repeated.

One objective of the experiments was to examine the ability of the exemplary scheme to recreate original sites of failing scan cells for successive test patterns based on collected test responses. The experiments were conducted on several large ISCAS'89 benchmark circuits and industrial designs. The characteristics of the circuits tested, including the number of gates, scan cells, and scan chains, are given in Tables 14 and 15, respectively. A commercial ATPG tool was used to generate test sets used in the experiments.

TABLE 14

Diagnostic Coverage for ISAS'89 Circuits

| | CUT | | | Compactor | | BDC [%] | | | CDC [%] | | | Iterations |
|---|---|---|---|---|---|---|---|---|---|---|---|---|
| Name | Gates | Scan | Faults | M | Out | 100 | 1,000 | 10,000 | 100 | 1,000 | 10,000 | 10,000 |
| s5378 | 3629 | 179 | 3878 | 8 | 1 | 95.87 | 97.65 | 98.27 | 90.32 | 93.92 | 95.60 | 697.6 |
| | | 9 × 20 | | 8 | 2 | 96.75 | 97.55 | 97.78 | 93.01 | 94.76 | 95.54 | 418.3 |
| | | | | 16 | 1 | 84.85 | 86.07 | 86.44 | 77.65 | 79.77 | 80.35 | 296.4 |
| s9234 | 6577 | 211 | 6700 | 8 | 1 | 97.03 | 98.31 | 98.70 | 88.85 | 92.51 | 94.38 | 1315.6 |
| | | 10 × 22 | | 8 | 2 | 98.33 | 98.90 | 99.16 | 93.16 | 95.34 | 96.37 | 537.68 |
| | | | | 16 | 1 | 87.03 | 88.03 | 88.42 | 76.94 | 78.91 | 79.90 | 741.6 |
| s13207 | 10920 | 638 | 10806 | 10 | 2 | 96.52 | 98.05 | 98.79 | 93.58 | 96.36 | 97.76 | 797.5 |
| | | 20 × 32 | | 16 | 1 | 96.50 | 97.21 | 97.46 | 92.46 | 94.10 | 95.08 | 1107.9 |
| | | | | 16 | 2 | 96.93 | 97.67 | 98.07 | 93.61 | 95.47 | 96.56 | 928.16 |
| s15850 | 10840 | 534 | 11934 | 10 | 2 | 95.46 | 96.98 | 97.60 | 87.82 | 91.23 | 92.94 | 1143.6 |
| | | 20 × 27 | | 16 | 1 | 92.99 | 95.10 | 96.10 | 84.22 | 87.97 | 89.81 | 1256.3 |
| | | | | 16 | 2 | 93.52 | 94.96 | 95.95 | 85.38 | 88.57 | 90.20 | 996.0 |
| s35932 | 16065 | 2048 | 35545 | 18 | 2 | 99.72 | 99.72 | 99.72 | 99.72 | 99.72 | 99.72 | 28.88 |
| | | 32 × 64 | | 24 | 2 | 96.75 | 96.87 | 96.87 | 95.59 | 95.72 | 95.72 | 31.57 |
| | | | | 24 | 1 | 99.70 | 99.71 | 99.71 | 99.71 | 99.71 | 99.71 | 23.07 |
| s38417 | 29394 | 1636 | 34406 | 18 | 2 | 95.58 | 97.59 | 98.44 | 89.33 | 93.50 | 95.52 | 519.4 |
| | | 32 × 52 | | 24 | 2 | 92.94 | 96.09 | 97.23 | 85.27 | 90.73 | 93.16 | 645.4 |
| | | | | 24 | 1 | 95.04 | 96.82 | 97.88 | 88.05 | 91.95 | 93.92 | 569.9 |
| s38584 | 25865 | 1426 | 36073 | 18 | 2 | 97.27 | 98.79 | 99.43 | 93.86 | 96.61 | 97.91 | 792.2 |
| | | 32 × 45 | | 24 | 2 | 95.41 | 97.18 | 97.78 | 91.58 | 94.42 | 95.73 | 796.6 |
| | | | | 24 | 1 | 95.75 | 97.19 | 98.52 | 91.66 | 94.28 | 96.08 | 993.9 |

Two basic figures of merit were employed: diagnostic coverage and computational complexity of the diagnostic scheme. Given a test set T, diagnostic coverage is defined as the percentage of faults that are diagnosable. A fault is said to be diagnosable if all scan cells affected by the fault can be correctly identified using a diagnostic algorithm. Note that the test set can detect every fault several times, and subsets of affected scan cells may differ each time. For purposes of this discussion, let $T(f_i) \subset T$ be a subset of test patterns that detect fault $f_i$ and yield different error patterns. Also, let $C(f_i, t_j)$ be the set of scan cells affected by fault $f_i$ when test pattern $t_j \in T(f_i)$ is applied, and let $D(f_i, t_j)$ be the set of failing scan cells as determined by the exemplary diagnostic procedure. The diagnostic coverage can be then measured in the following two different ways: (1) basic diagnostic coverage; and (2) compound diagnostic coverage.

For basic diagnostic coverage (BDC), a fault is declared successfully diagnosed if there is at least one test pattern for which the corresponding faulty scan cells are correctly identified in their entirety. Hence, the BDC is given by the following formula:

$$BDC = F^{-1} \sum_{i=1}^{F} d_i \qquad (26)$$

where F is the total number of faults, $d_i$ is equal to "1" provided there exists $t_j$ such that $C(f_i, t_j) = D(f_i, t_j)$, and $d_i$ is equal to "0" otherwise.

For compound diagnostic coverage, given test patterns from $T(f_i)$ which detect fault $f_i$, diagnostic capacity is determined as a fraction of error patterns (i.e., the sets of failing scan cells that can be correctly identified). In this case, the compound diagnostic coverage (CDC) can be expressed as follows:

$$CDC = F^{-1} \sum_{i=1}^{F} \omega_i^{-1} \sum_{j=1}^{\omega_i} d_{i,j} \qquad (27)$$

where $\omega_i$ is the number of different error patterns caused by $f_i$ when test patterns from $T(f_i)$ are applied, $d_{ij}$ is equal to "1" if $C(f_i, t_j) = D(f_i, t_j)$, and $d_{ij}$ is equal to "0" otherwise. Recall that the second summation in Formula (27) is governed by index j, which indicates test patterns that yield different error patterns.

The second figure of merit, computational complexity of the diagnostic scheme, is reported as the number of triplet sets generated before the sites of scan cells affected by a fault are properly identified. The number of iterations required to perform the exemplary procedure is mainly influenced by the size of the triplet lists. This factor, in turn, typically depends on the architectural particulars of the compactor in the following manner: (1) the number of iterations increases with the increasing number of scan chains (more injector polynomials result in more chances to set a given signature bit); (2) the number of iterations decreases with the increasing size M of a compactor; and (3) given the size of the compactor, the number of iterations further decreases with the increasing number of outputs (or sub-registers). Therefore, it is desirable to select an architecture for the compactor that does not compromise the diagnostic time efficiency or the quality of diagnosis by using sets of triplets that are either too short or too long.

In all experiments reported in Table 14 for the ISCAS'89 benchmark circuits, three different exemplary embodiments of compactors were employed. For each compactor, the number of memory elements M and the number of compactor outputs are given in the designated columns of the table. The number of memory elements was selected so that the total number of usable polynomials was significantly larger than the number of scan chains. In general, such a design reduces the probability of error masking and keeps the diagnostic resolution high. For each of the ISCAS'89 circuits, the following information is also provided in the table: the number of gates and scan cells, the number of faults that propagate to the scan chains, the basic diagnostic coverage, and the compound diagnostic coverage. In order to illustrate how basic diagnostic coverage and compound diagnostic coverage depend on the processing time, Table 14 also shows the resultant diagnostic coverage obtained when the number of iterations needed to correctly identify affected scan cells is set to a given threshold. The thresholds are shown in the three respective columns beneath the basic diagnostic coverage (BDC) and compound diagnostic coverage (CDC) headings. As seen in Table 14, very high BDC was achieved for all examined circuits. Moreover, only slightly lesser CDC was observed in all cases, despite a variety of error patterns produced by those faults that were detected many times. The average number of iterations (over all faults) that were performed before the proper solution was found is provided in the last column of the table and assumes an iteration threshold value of 10,000. As shown in this column, the best diagnostic results were achieved in each case in less than 1,200 iterations.

Additional experiments were conducted on five industrial designs. Some representative results are presented in Table 15. For the designs shown in Table 15, 48-bit 4-output compactors were employed, except for design D1 where a 32-bit 2-output compactor was used. Moreover, during these experiments, all sources of unknown states were masked. As can be seen, very high basic diagnostic coverage was achieved in all cases. Moreover, the compound diagnostic coverage was never less than 83%.

TABLE 15

Diagnostic Coverage for Industrial Designs

| CUT | | BDC [%] | | CDC [%] | |
|---|---|---|---|---|---|
| Name | Gates | Scan | 1K | 10K | 1K | 10K |
| D1 | 506K | 50 × 373 | 100.0 | 100.0 | 93.02 | 95.13 |
| D2 | 271K | 160 × 259 | 94.13 | 95.24 | 87.60 | 90.46 |
| D3 | 1095K | 160 × 470 | 100.0 | 100.0 | 99.87 | 99.91 |
| D4 | 302K | 160 × 116 | 90.80 | 93.40 | 83.45 | 88.25 |
| D5 | 496K | 160 × 283 | 95.17 | 96.30 | 88.72 | 91.20 |

In general, the disclosed diagnostic schemes, in connection with the disclosed compactor architecture, exhibit properties that match extremely well with the requirements of embedded deterministic test. Embodiments of the scheme support a very high quality of test by providing the ability to identify failing scan cells directly from the compacted test responses of the faulty circuits. Therefore, in contrast to conventional testing and diagnostic techniques, the disclosed approach is capable of collecting all the relevant diagnostic data during a single application of test patterns. This feature can be utilized to greatly simplify the tester requirements and the manufacturing test flow.

Figure 31:
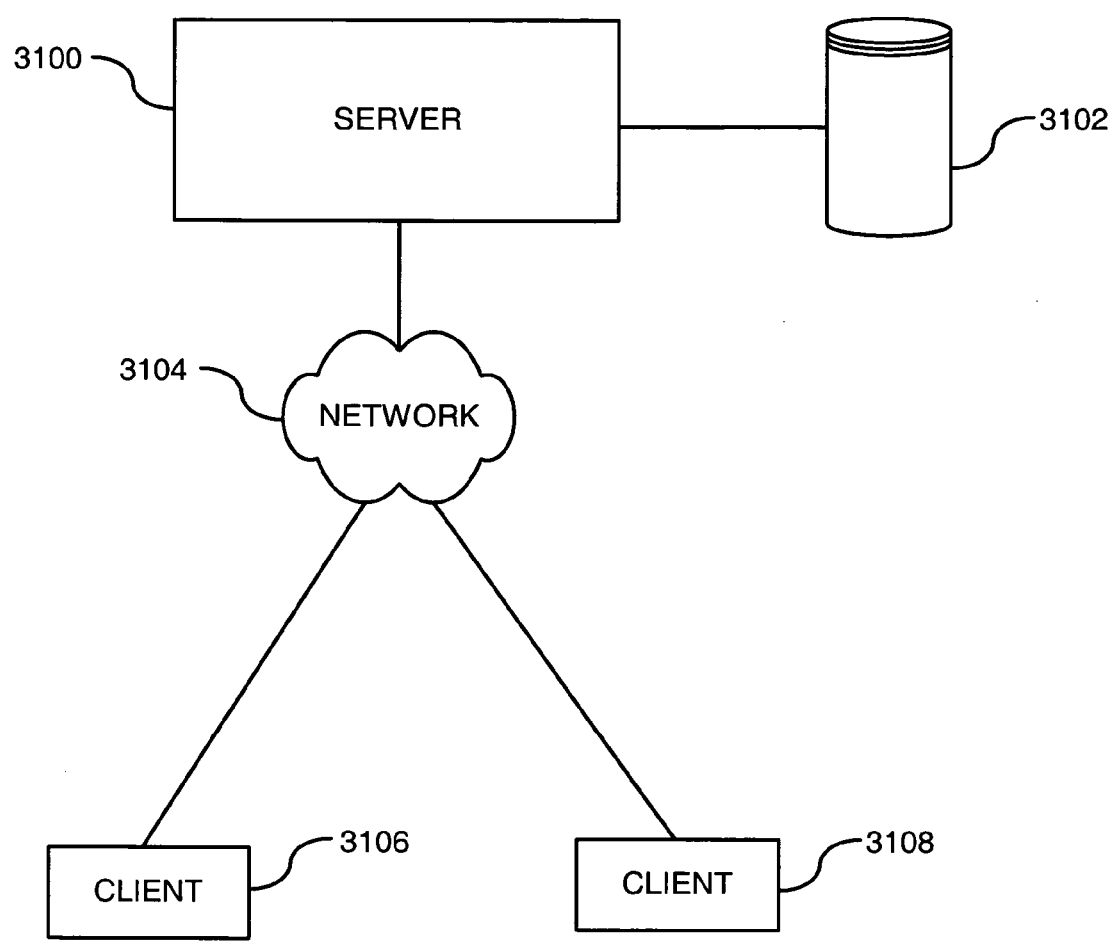
FIG. 31 is a system diagram of a client/server network as may be used in designing and/or implementing a compactor according to the disclosed technology or for performing embodiments of the disclosed diagnostic procedure.

Any of the aspects of the technology described above may be performed or designed using a distributed computer network. FIG. 31 shows one such exemplary network. A server computer 3100 can have an associated storage device 3102 (internal or external to the server computer). For example, the server computer 3100 can be configured to design compactor components according to any of the embodiments described above (e.g., as part of an EDA software tool, such as a design, verification, or simulation tool) or to perform a fault diagnostic technique according to any of the disclosed embodiments (e.g., as part of an EDA software tool, such as an embedded deterministic testing (EDT) or ATPG tool). The server computer 3100 may be coupled to a network, shown generally at 3104, which can comprise, for example, a wide-area network, a local-area network, a client-server network, the Internet, or other such network. One or more client computers, such as those shown at 3106, 3108, may be coupled to the network 3104 using a network protocol.

FIG. 32 shows that a database containing design information (e.g., a netlist or an HDL database) may be updated to include design information for a compactor architecture according to any of the embodiments disclosed herein using a remote server computer, such as the server computer 3100 shown in FIG. 31. In process block 3250, for example, the client computer sends design data relating to a circuit having scan chains that capture test responses that are to be compressed using any of the disclosed compression methods and/or using any of the disclosed compactor architectures. For instance, the client computer may send a netlist or other EDA design database. In process block 3252, the data is received and loaded by the server computer. In process block 3254, the circuit defined by the database is updated to include a compactor architecture according to any of the disclosed embodiments. A new database representing the updated design can then be created. This new design data can be stored as an updated version of the design database or as one or more separate databases. In process block 3256, the server computer sends the updated database or other databases to the client computer, which receives the database in process block 3258. It should be apparent to those skilled in the art that the example shown in FIG. 32 is not the only way to update a design database to include the relevant design data. For instance, the design data may be stored in a computer-readable media that is not on a network and that is sent separately to the server. Or, the server computer may perform only a portion of the design procedures.

Any of the fault diagnosis procedures described herein may also be performed over a network as described above with respect to FIG. 32. For example, a computer-readable medium storing design information for a circuit having a compactor according to the disclosed technology may be sent to a remote server computer, such as the server computer 3100 shown in FIG. 31. The remote server computer can then perform one of the disclosed embodiments of the fault diagnosis procedures for the stored circuit design and compactor architecture. The results of the fault diagnosis procedure (e.g., a list of the failing scan cells in a design) can then be stored in a separate or updated database. A computer-readable medium storing the results can then be sent back to the client computer.

Having illustrated and described the principles of the illustrated embodiments, it will be apparent to those skilled in the art that the embodiments can be modified in arrangement and detail without departing from such principles. For example, one or more registers (e.g., shadow registers) can be used to receive and store (in parallel or serially) values from the outputs of the compactor. Any of the components described above can be made using a variety of different logic gates to achieve the desired functionality. In addition to the selection circuits described above, the disclosed compactor can be used with a variety of other selection and control circuits known in the art.

In view of the many possible embodiments, it will be recognized that the illustrated embodiments include only examples and should not be taken as a limitation on the scope of the invention. Rather, the invention is defined by the following claims. We therefore claim as the invention all such embodiments that come within the scope of these claims.

What is claimed is:

1. A method for compressing a test response in an integrated circuit, comprising:
   inputting a test value from one of multiple scan cells in a scan chain during an unloading period of the scan chain;
   producing at least two intermediate values at least partially determined by the test value via logic;
   loading at least a portion of the intermediate values into plural memory elements;
   producing a set of at least two output values at least partially determined by the intermediate values, the set of at least two output values comprising all output values at least partially determined by the intermediate values; and
   outputting the set of at least two output values over an observation period, the at least two output values being indicative of whether the test value is an expected test value and the observation period comprising at least two clock cycles and ending before the unloading period ends.

2. The method of claim 1, further comprising determining whether the test value is the expected test value by analyzing the set of output values.

3. The method of claim 1, further comprising locating a source of an error in the integrated circuit based on the set of output values.

4. The method of claim 1, wherein an unknown test value is input into the logic during a time associated with the observation period, and wherein the set of output values is at least partially unaffected by the unknown test value.

5. The method of claim 1, wherein the set of at least two output values comprises at least two output values that are output simultaneously from different respective memory elements.

6. The method of claim 1, wherein at least two of the memory elements are connected via feedback-free logic.

7. The method of claim 1, wherein the plural memory elements at least partially comprise one or more registers.

8. The method of claim 1, in which the act of producing the at least two output values comprises the act of serially shifting at least some of the intermediate values through the memory elements.

9. The method of claim 1, wherein the observation period is less than one half of the unloading period.

10. The method of claim 1, wherein the observation period is less then one hundredth of the unloading period.

11. A method for testing an integrated circuit, comprising repeating the acts of claim 1 for a plurality of the test values.

12. A method for testing an integrated circuit, wherein the acts of claim 1 are performed simultaneously for multiple different test values, and wherein the logic is configured to eliminate one, two, or odd-numbered error masking.

13. An integrated circuit comprising a compactor configured to perform the method of claim 1.

14. A computer-readable medium storing computer-executable instructions for causing a computer system to design a compactor configured to perform a method, the method comprising:
inputting a test value from one of multiple scan cells in a scan chain during an unloading period of the scan chain;
producing at least two intermediate values at least partially determined by the test value via logic;
loading at least a portion of the intermediate values into plural memory elements;
producing a set of at least two output values at least partially determined by the intermediate values, the set of at least two output values comprising all output values at least partially determined by the intermediate values; and
outputting the set of at least two output values over an observation period, the at least two output values being indicative of whether the test value is an expected test value and the observation period comprising at least two clock cycles and ending before the unloading period ends.

15. The computer-readable medium of claim 14, wherein the compactor is configured such that when an unknown test value is input into the logic during a time associated with the observation period, the set of output values is at least partially unaffected by the unknown test value.

16. The computer-readable medium of claim 14, wherein the set of at least two output values comprises at least two output values that are output simultaneously from different respective memory elements.

17. The computer-readable medium of claim 14, wherein at least two of the memory elements are connected via feedback-free logic.

18. The computer-readable medium of claim 14, wherein the plural memory elements at least partially comprise one or more registers.

19. The computer-readable medium of claim 14, in which the act of producing the at least two output values comprises the act of serially shifting at least some of the intermediate values through the memory elements.

20. The computer-readable medium of claim 14, wherein the observation period is less than one half of the unloading period.

21. The computer-readable medium of claim 14, wherein the observation period is less then one hundredth of the unloading period.

22. A computer-readable medium storing a design database that includes design information for a compactor configured to perform a method, the method comprising:
inputting a test value from one of multiple scan cells in a scan chain during an unloading period of the scan chain;
producing at least two intermediate values at least partially determined by the test value via logic;
loading at least a portion of the intermediate values into plural memory elements;
producing a set of at least two output values at least partially determined by the intermediate values, the set of at least two output values comprising all output values at least partially determined by the intermediate values; and
outputting the set of at least two output values over an observation period, the at least two output values being indicative of whether the test value is an expected test value and the observation period comprising at least two clock cycles and ending before the unloading period ends.

23. The computer-readable medium of claim 22, wherein the compactor is configured such that when an unknown test value is input into the logic during a time associated with the observation period, and wherein the set of output values is at least partially unaffected by the unknown test value.

24. The computer-readable medium of claim 22, wherein the set of at least two output values comprises at least two output values that are output simultaneously from different respective memory elements.

25. The computer-readable medium of claim 22, wherein at least two of the memory elements are connected via feedback-free logic.

26. The computer-readable medium of claim 22, wherein the plural memory elements at least partially comprise one or more registers.

27. The computer-readable medium of claim 22, wherein the simulated act of producing the at least two output values comprises the simulated act of serially shifting at least some of the intermediate values through the memory elements.

28. The computer-readable medium of claim 22, wherein the observation period is less than one half of the unloading period.

29. The computer-readable medium of claim 22, wherein the observation period is less then one hundredth of the unloading period.

30. An apparatus for compressing a test response in an integrated circuit, comprising:
means for inputting a test value from one of multiple scan cells in a scan chain during an unloading period of the scan chain;
means for producing at least two intermediate values at least partially determined by the test value via logic;
means for loading at least a portion of the intermediate values into plural memory elements;
means for producing a set of at least two output values at least partially determined by the intermediate values, the set of at least two output values comprising all output values at least partially determined by the intermediate values; and
means for outputting the set of at least two output values over an observation period, the at least two output values being indicative of whether the test value is an expected test value and the observation period comprising at least two clock cycles and ending before the unloading period ends.

31. The apparatus of claim 30, further comprising means for determining whether the test value is the expected test value by analyzing the set of output values.

32. The apparatus of claim 30, further comprising means for locating a source of an error in the integrated circuit based on the set of output values.

33. The apparatus of claim 30, wherein when an unknown test value is input into the logic during a time associated with the observation period, the set of output values is at least partially unaffected by the unknown test value.

34. The apparatus of claim 30, wherein the set of at least two output values comprises at least two output values that are output simultaneously from different respective memory elements.

35. The apparatus of claim 30, wherein at least two of the memory elements are connected via feedback-free logic.

36. The apparatus of claim 30, wherein the plural memory elements at least partially comprise one or more registers.

37. The apparatus of claim 30 in which the means for producing the at least two output values comprises a means for serially shifting at least some of the intermediate values through the memory elements.

38. The apparatus of claim 30, wherein the observation period is less than one half of the unloading period.

39. The apparatus of claim 30, wherein the observation period is less then one hundredth of the unloading period.

40. The apparatus of claim 30, wherein the logic is configured to eliminate one, two, or odd-numbered error masking.

41. An integrated circuit comprising the apparatus of claim 30.

42. A computer-readable medium storing computer-executable instructions for causing a computer system to design the apparatus of claim 30.

43. A computer-readable medium storing a design database that includes design information for the apparatus of claim 30.

* * * * *